United States Patent
Ko et al.

(10) Patent No.: US 8,897,390 B2
(45) Date of Patent: *Nov. 25, 2014

(54) APPARATUS FOR TRANSMITTING AND RECEIVING A SIGNAL AND METHOD OF TRANSMITTING AND RECEIVING A SIGNAL

(71) Applicant: LG Electronics Inc., Seoul (KR)

(72) Inventors: Woo Suk Ko, Seoul (KR); Sang Chul Moon, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/941,185

(22) Filed: Jul. 12, 2013

(65) Prior Publication Data
US 2014/0016720 A1    Jan. 16, 2014

Related U.S. Application Data

(63) Continuation of application No. 12/922,683, filed as application No. PCT/KR2009/002542 on May 13, 2009, now Pat. No. 8,503,551.

(60) Provisional application No. 61/152,265, filed on Feb. 13, 2009.

(51) Int. Cl.
| H04L 27/00 | (2006.01) |
| H04L 1/00 | (2006.01) |
| H04L 27/26 | (2006.01) |
| H04L 25/02 | (2006.01) |
| H04H 20/00 | (2008.01) |
| H04L 1/08 | (2006.01) |

(52) U.S. Cl.
CPC ............. *H04H 20/00* (2013.01); *H04L 1/0071* (2013.01); *H04L 27/2613* (2013.01); *H04L 27/2626* (2013.01); *H04L 1/0072* (2013.01); *H04L 27/2614* (2013.01); *H04L 1/0045* (2013.01); *H04L 1/0065* (2013.01); *H04L 25/0204* (2013.01); *H04L 27/2618* (2013.01); *H04L 1/0068* (2013.01); *H04L 25/0232* (2013.01); *H04L 1/08* (2013.01); *H04L 25/0226* (2013.01); *H04L 1/0057* (2013.01); *H04L 27/2647* (2013.01); *H04L 1/0041* (2013.01)
USPC ........... 375/295; 375/219; 375/220; 375/316; 375/340

(58) Field of Classification Search
CPC ... H04L 1/0041; H04L 1/0045; H04L 1/0065; H04L 1/0071; H04L 1/0072; H04L 25/0204; H04L 25/0232; H04L 27/2613; H04H 20/00
USPC .......................... 375/219, 220, 295, 316, 340
See application file for complete search history.

(56) References Cited

U.S. PATENT DOCUMENTS

| 8,248,910 B2 | 8/2012 | Jokela et al. |
| 2008/0104474 A1 | 5/2008 | Gao et al. |

FOREIGN PATENT DOCUMENTS

| CN | 101032084 | 9/2007 |
| EP | 1566905 | 8/2005 |

OTHER PUBLICATIONS

European Telecommunications Standards Institute (ETSI), "Digital Video Broadcasting (DVB), Frame Structure Channel Coding and Modulation for a Second Generation Digital Terrestrial Television Broadcasting System (DVB-T2)," Draft ETSI EN 302 755 V1.1.1, XP-002554250, Oct. 2008, 164 pages.

(Continued)

*Primary Examiner* — Leon Flores
(74) *Attorney, Agent, or Firm* — Lee, Hong, Degerman, Kang & Waimey

(57) ABSTRACT

The present invention relates to a method of transmitting and a method of receiving signals and corresponding apparatus. One aspect of the present invention relates to an efficient L1 signaling method for an efficient transmitter and an efficient receiver using the efficient L1 signaling method for an efficient cable broadcasting.

16 Claims, 67 Drawing Sheets

(56) References Cited

OTHER PUBLICATIONS

Digital Video Broadcasting (DVB), "Digital Video Broadcasting (DVB), Frame Structure Channel Coding and Modulation for a Second Generation Digital Transmission System for Cable Systems (DVB-C2)," DVB Document A138, XP-002549974. Apr. 2009, 109 pages.

Jaeger, "Current Status of DVB C2—What The New Technology May Bring," 7th Conference on Broadband Technologies, Sep. 2009, 20 pages.

Lei et al., "A Backward-Compatible Solution for Next Generation DVB-C System," IEEE International Conference on Communications (ICC), May 2008, 5 pages.

Fig. 3

| TS/GS (2 bits) | SIS/MIS (1 bit) | CCM/ACM (1 bit) | ISSYI (1 bit) | NPD (1bit) | EXT (2bits) |
|---|---|---|---|---|---|
| 00 = GFPS<br>11 = TS<br>01 = GCS<br>10 = GSE | 1 = single<br>0 = multiple | 1 = CCM<br>0 = ACM | 1 = active<br>0 = not-active | 1= active<br>0 = not-active | Reserved for future use |

| Field | Size (Bytes) | Description |
|---|---|---|
| MATYPE | 2 | As described above |
| UPL | 2 | User Packet Length in bits, in the range [0,65535] |
| DFL | 2 | Data Field Length in bits, in the range [ 0,53760] |
| SYNC | 1 | A copy of the User Packet Sync-byte |
| SYNCD | 2 | The distance in bits from the beginning of the DATA FIELD to the first complete UP of the data field. SYNCD=$0_D$ means that the first UP is aligned to the beginning of the Data Field. SYNCD = $65535_D$ means that no UP starts in the DATA FIELD. |
| CRC-8 MODE | 1 | The XOR of the CRC-8 (1-byte) field with the MODE field (1-byte). CRC-8 is the error detection code applied to the first 9 bytes of the BBHEADER.<br>MODE (8 bits) shall be:<br>• $0_D$ Normal Mode<br>• $1_D$ High Efficiency Mode<br>• Other values : reserved for future use. |

Fig. 6

| Capacity (bit/s/Hz) | | | Case 1 Modulation | Case 2 Modulation |
|---|---|---|---|---|
| 6 | 1/2 | 3.0 | NU-MQAM | NU-QAM |
| | 2/3 | 4.0 | NU-MQAM | NU-QAM |
| | 3/4 | 4.5 | NU-MQAM | NU-MQAM |
| | 4/5 | 4.8 | MQAM | MQAM |
| | 5/6 | 5.0 | MQAM | MQAM |
| | 8/9 | 5.3 | MQAM | MQAM |
| | 9/10 | 5.4 | MQAM | MQAM |
| 8 | 1/2 | 4.0 | NU-MQAM | NU-QAM |
| | 2/3 | 5.3 | NU-MQAM | NU-QAM |
| | 3/4 | 6.0 | NU-MQAM | NU-MQAM |
| | 4/5 | 6.4 | NU-MQAM | NU-MQAM |
| | 5/6 | 6.7 | MQAM | MQAM |
| | 8/9 | 7.1 | MQAM | MQAM |
| | 9/10 | 7.2 | MQAM | MQAM |
| 10 | 1/2 | 5.0 | NU-MQAM | NU-QAM |
| | 2/3 | 6.7 | NU-MQAM | NU-QAM |
| | 3/4 | 7.5 | NU-MQAM | NU-MQAM |
| | 4/5 | 8.0 | NU-MQAM | NU-MQAM |
| | 5/6 | 8.3 | NU-MQAM | NU-MQAM |
| | 8/9 | 8.9 | MQAM | MQAM |
| | 9/10 | 9.0 | MQAM | MQAM |
| 12 | 1/2 | 6.0 | NU-MQAM | NU-QAM |
| | 2/3 | 8.0 | NU-MQAM | NU-QAM |
| | 3/4 | 9.0 | NU-MQAM | NU-MQAM |
| | 4/5 | 9.6 | NU-MQAM | NU-MQAM |
| | 5/6 | 10.0 | NU-MQAM | NU-MQAM |
| | 8/9 | 10.7 | MQAM | MQAM |
| | 9/10 | 10.8 | MQAM | MQAM |

Fig. 7

|  | Capacity (bit/s/Hz) | | Case 1 Modulation | Case 2 Modulation | Case 2 Modulation |
|---|---|---|---|---|---|
| 2 | 1/2 | 3.0 | QAM | QAM | QAM |
|  | 2/3 | 4.0 | QAM | QAM | QAM |
|  | 3/4 | 4.5 | QAM | QAM | QAM |
|  | 4/5 | 4.8 | QAM | QAM | QAM |
|  | 5/6 | 5.0 | QAM | QAM | QAM |
|  | 8/9 | 5.3 | QAM | QAM | QAM |
|  | 9/10 | 5.4 | QAM | QAM | QAM |
| 4 | 1/2 | 3.0 | QAM | QAM | QAM |
|  | 2/3 | 4.0 | QAM | QAM | QAM |
|  | 3/4 | 4.5 | QAM | QAM | QAM |
|  | 4/5 | 4.8 | QAM | QAM | QAM |
|  | 5/6 | 5.0 | QAM | QAM | QAM |
|  | 8/9 | 5.3 | QAM | QAM | QAM |
|  | 9/10 | 5.4 | QAM | QAM | QAM |
| 6 | 1/2 | 3.0 | QAM | QAM | QAM |
|  | 2/3 | 4.0 | QAM | QAM | QAM |
|  | 3/4 | 4.5 | QAM | QAM | QAM |
|  | 4/5 | 4.8 | QAM | QAM | QAM |
|  | 5/6 | 5.0 | QAM | QAM | QAM |
|  | 8/9 | 5.3 | QAM | QAM | QAM |
|  | 9/10 | 5.4 | QAM | QAM | QAM |
| 8 | 1/2 | 4.0 | QAM | QAM | QAM |
|  | 2/3 | 5.3 | QAM | QAM | QAM |
|  | 3/4 | 6.0 | QAM | QAM | QAM |
|  | 4/5 | 6.4 | QAM | QAM | QAM |
|  | 5/6 | 6.7 | QAM | QAM | QAM |
|  | 8/9 | 7.1 | QAM | QAM | QAM |
|  | 9/10 | 7.2 | QAM | QAM | QAM |
| 10 | 1/2 | 5.0 | NU-MQAM | NU-QAM | MQAM |
|  | 2/3 | 6.7 | NU-MQAM | NU-QAM | MQAM |
|  | 3/4 | 7.5 | NU-MQAM | NU-MQAM | MQAM |
|  | 4/5 | 8.0 | NU-MQAM | NU-MQAM | MQAM |
|  | 5/6 | 8.3 | NU-MQAM | NU-MQAM | MQAM |
|  | 8/9 | 8.9 | MQAM | MQAM | MQAM |
|  | 9/10 | 9.0 | MQAM | MQAM | MQAM |
| 12 | 1/2 | 6.0 | NU-MQAM | NU-QAM | MQAM |
|  | 2/3 | 8.0 | NU-MQAM | NU-QAM | MQAM |
|  | 3/4 | 9.0 | NU-MQAM | NU-MQAM | MQAM |
|  | 4/5 | 9.6 | NU-MQAM | NU-MQAM | MQAM |
|  | 5/6 | 10.0 | NU-MQAM | NU-MQAM | MQAM |
|  | 8/9 | 10.7 | MQAM | MQAM | MQAM |
|  | 9/10 | 10.8 | MQAM | MQAM | MQAM |

| Delay (μs) | 0.2 | 0.4 | 0.8 | 1.2 | 2.5 | 15 |
|---|---|---|---|---|---|---|
| Att. (dB) | -11 | -14 | -17 | -23 | -32 | -40 |

Negligible Delay path

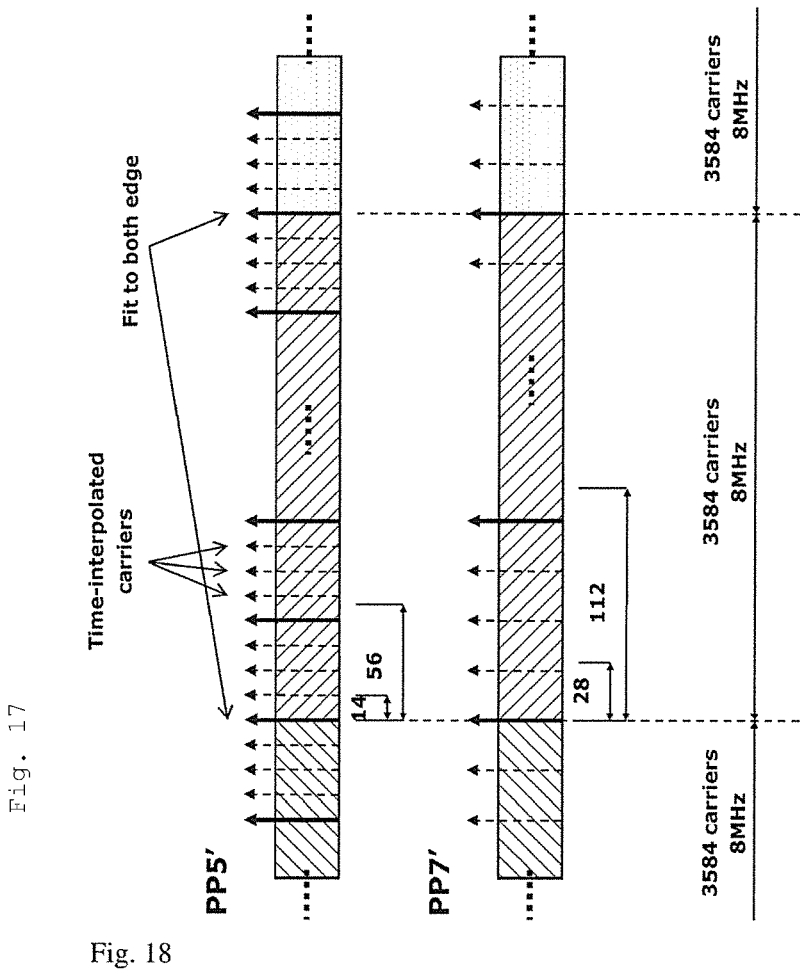
Fig. 17
Fig. 18
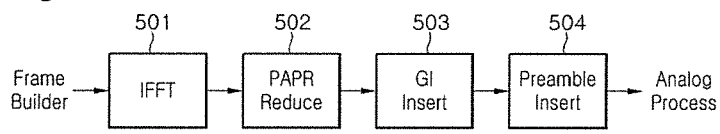
Fig. 19
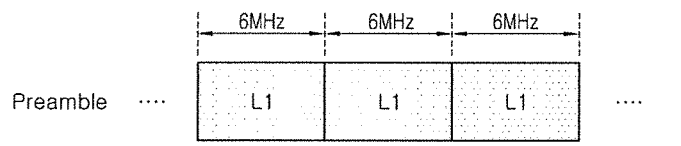
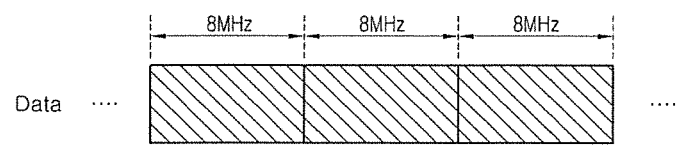

Fig. 36

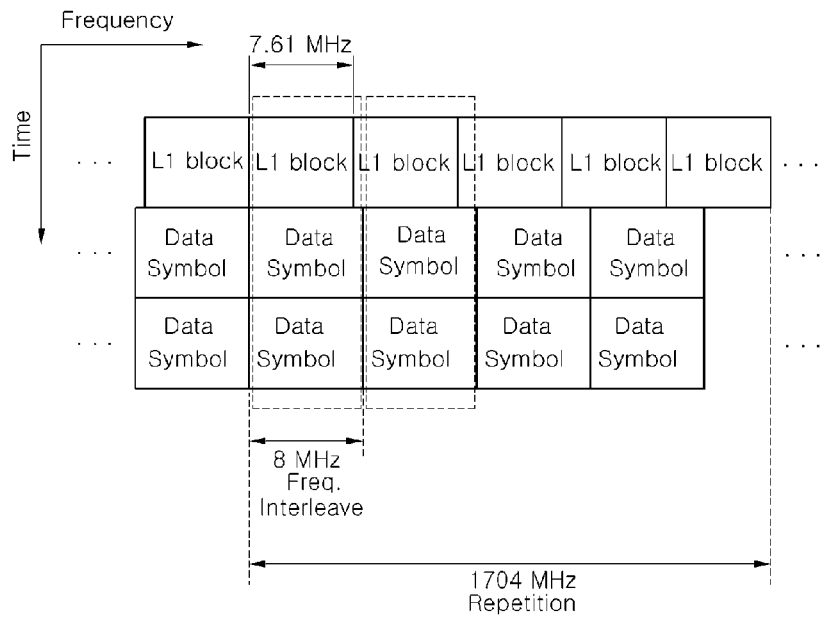

Fig. 37

| Field | Bits | |
|---|---|---|
| L1_span | 12 | number of carriers spanned by L1 block within one OFDM symbol (Max=7.61 MHz) |
| num_chbon | 3 | number of bonded channels |
| num_dslice | 8 | number of data slices |
| num_plp | 8 | number of PLPs |
| num_notch | 5 | number of notch bands |
| for dslice { | | |
| chbon_index | 3 | bonded channel index |
| dslice_start | 9 | start of data slice within one channel (8 MHz) |
| dslice_width | 9 | width of data slice |
| } | | |
| for plp { | | |
| dslice_id | 8 | data sliced ID |
| plp_id | 8 | PLP ID |
| plp_type | 1 | PLP type (common/data) |
| plp_payload_type | 5 | PLP payload type (TS,GS,···) |
| } | | |
| for notch { | | |
| chbon_index | 3 | bonded channel index |
| notch_start | 9 | start of notch band within one channel (8 MHz) |
| notch_width | 9 | width of notch band |
| } | | |
| gi | 1 | guard interval mode |
| sframe_id | 16 | superframe ID |
| frame_id | 16 | fraem ID |
| reserved | 0 | rfu |
| crc32 | 32 | CRC32 |
| Total | 11760 | |

The number of L1 information bits varies according to various configurations/conditions

| L1 info (bits) | 11760 |
| --- | --- |
| L1 block (bits) | 23520 |
| 16 – QAM symbols | 5880 |
| Total carriers | 3408 |
| Preamble SP distance | 6 |
| Data carriers | 2840 |
| Short LDPC | 1.45 |
| OFDM symbols | 2.07 |

Maximum size

Fig. 41

| Field | Bits | |
|---|---|---|
| L1_column | 9 | number of carriers spanned by L1 block within one OFDM symbol (Max=7.61 MHz) |
| L1_row | 3 | number of OFDM symbols spanned by L1 block |
| num_chbon | 3 | number of bonded channels |
| num_plp | 8 | number of data slices |
| num_dslice | 8 | number of PLPs |
| num_notch | 5 | number of notch bands |
| for dslice { | | |
| chbon_index | 3 | bonded channel index |
| dslice_start | 9 | start of data slice within one channel (8 MHz) |
| dslice_width | 9 | width of data slice |
| } | | |
| for plp { | | |
| dslice_id | 8 | data sliced ID |
| plp_id | 8 | PLP ID |
| plp_type | 1 | PLP type (common/data) |
| plp_payload_type | 5 | PLP payload type (TS, GS, ...) |
| } | | |
| for notch { | | |
| chbon_index | 3 | bonded channel index |
| notch_start | 9 | start of notch band within one channel (8 MHz) |
| notch_width | 9 | width of notch band |
| } | | |
| g | 1 | guard interval mode |
| sframe_id | 16 | superframe ID |
| frame_id | 16 | fraem ID |
| reserved | 16 | rfu |
| crc32 | 32 | CRC32 |
| Total | 1776 | |

The number of L1 information bits varies according to various configurations/conditions

Fig. 42

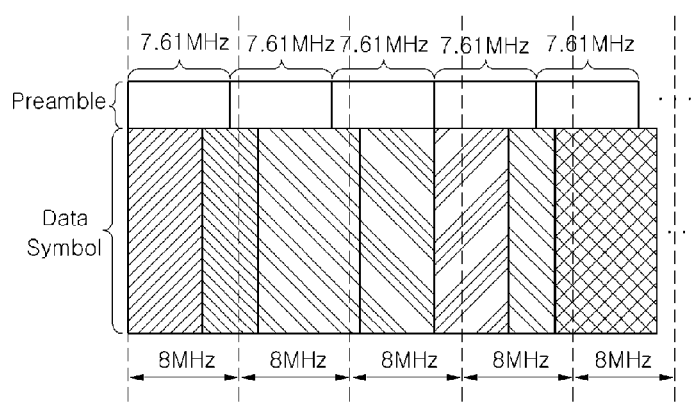

Fig. 43
| LDPC Block Size | Modulation (bps/Hz) | QAM Symbols | ModCod Overhead |
|---|---|---|---|
| 64800 | 4 | 16200 | 0.28% |
| | 6 | 10800 | 0.42% |
| | 8 | 8100 | 0.56% |
| | 10 | 6480 | 0.69% |
| | 12 | 5400 | 0.83% |
| 16200 | 4 | 4050 | 1.11% |
| | 6 | 2700 | 1.67% |
| | 8 | 2025 | 2.22% |
| | 10 | 1620 | 2.78% |
| | 12 | 1350 | 3.33% |
Fig. 44
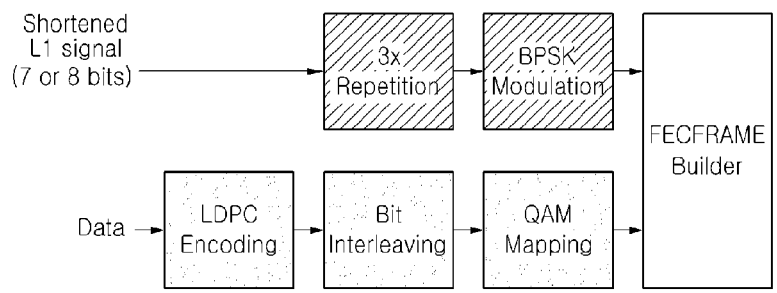
Fig. 45
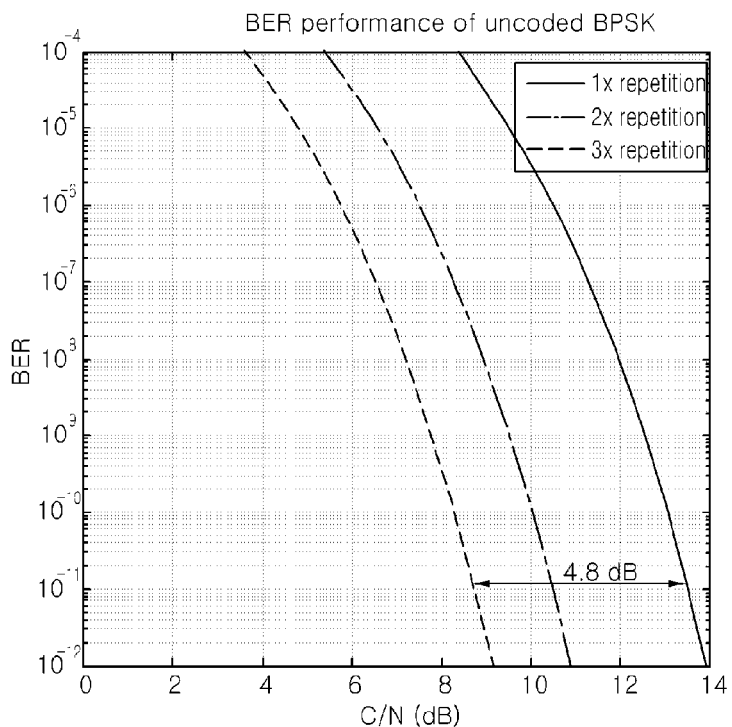

Fig. 47

| Field | Bits | |
|---|---|---|
| L1_size | 14 | L1 block size (bits) |
| num_chbon | 3 | number of bonded channels |
| num_dslice | 8 | number of data slices |
| num_plp | 8 | number of PLPs |
| num_notch | 5 | number of notch bands |
| for dslice { | | |
| chbon_index | 3 | bonded channel index |
| dslice_start | 9 | start of data slice within one channel (8 MHz) |
| dslice_width | 9 | width of data slice |
| dslice_time_intrlv | 1 | time interleaving on/off |
| dslice_type | 1 | data slice type (CCM, ACM/VCM) |
| } | | |
| for plp { | | |
| dslice_id | 8 | data sliced ID |
| plp_id | 8 | PLP ID |
| plp_type | 1 | PLP type (common/data) |
| plp_payload_type | 5 | PLP payload(TSGS...) |
| if dslice_type=CCM { | | |
| plp_mod | 3 | PLP modulation type |
| plp_fec_type | 1 | PLP FEC type (long/short) |
| plp_cod | 3 | PLP coderate |
| } | | |
| } | | |
| for notch { | | |
| chbon_index | 3 | bonded channel index |
| notch_start | 9 | start of notch band within one channel (8 MHz) |
| notch_width | 9 | width of notch band |
| } | | |
| gi | 1 | guard interval mode |
| sframe_id | 16 | superframe ID |
| frame_id | 16 | fraem ID |
| reserved | 16 | rfu |
| crc32 | 32 | CRC32 |
| Total | 14082 | |

L1 block size is transmitted on first LDPC block (fixed shortest length=192 bits)

Time interleaving on/off to support short latency mode

Data slice type for L1 signaling overhead reduction

Mod/Cod fields are transmitted on preamble for CCM type only

Fig. 48

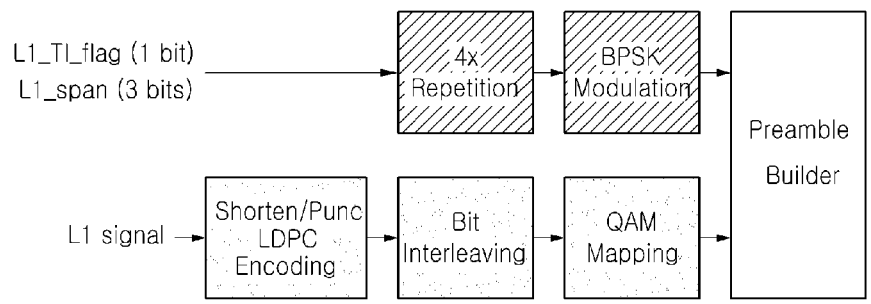

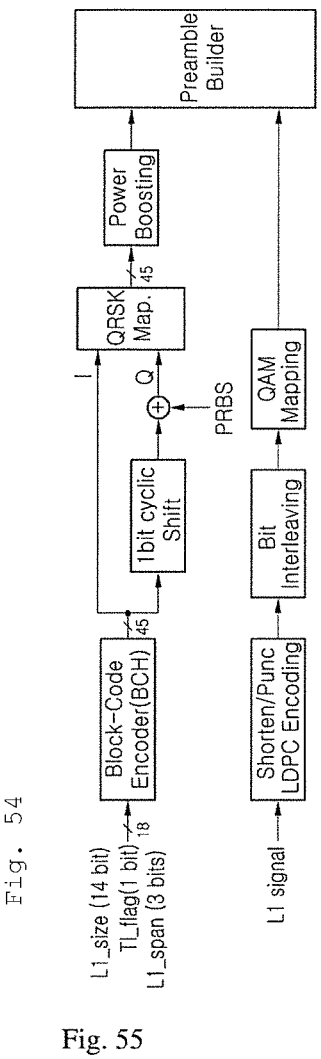
Fig. 54
Fig. 55
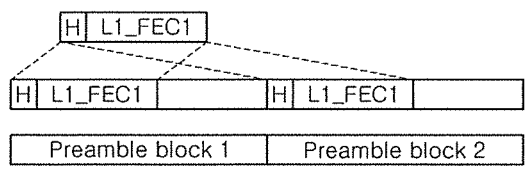

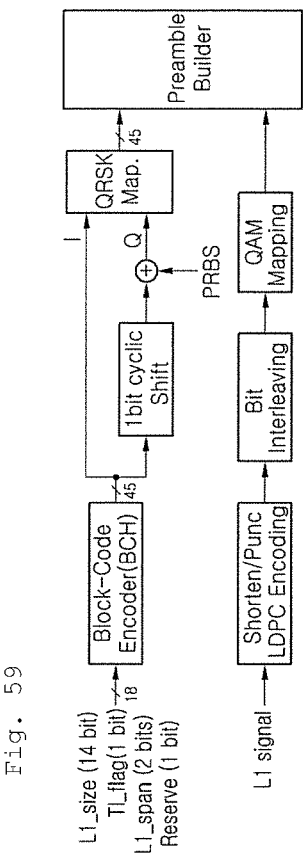
Fig. 59
Fig. 60
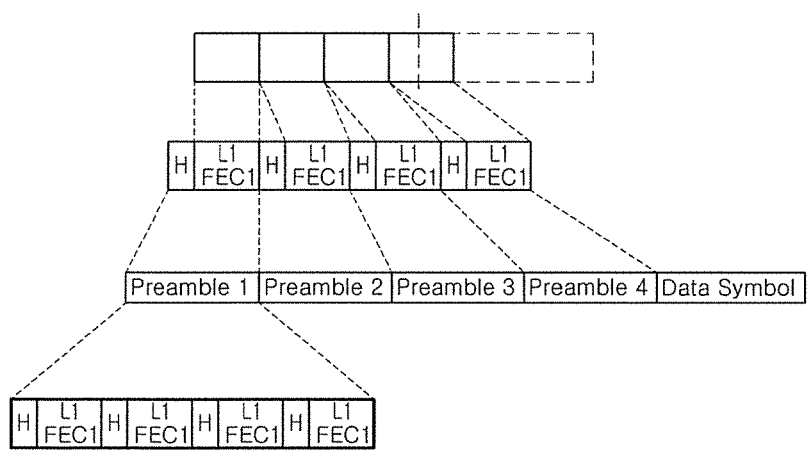
Fig. 61
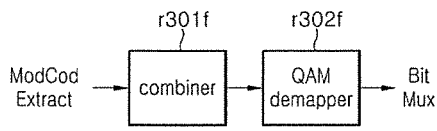

Fig. 62

| Field | Bits | |
|---|---|---|
| L1_size | 14 | L1 block size (bits) |
| num_chbon | 3 | number of bonded channels |
| num_dslice | 8 | number of data slices |
| num_plp | 8 | number of PLPs |
| num_notch | 5 | number of notch bands |
| for dslice { | | |
| chbon_index | 3 | bonded channel index |
| dslice_start | 9 | start of data slice within one channel (8 MHz) |
| dslice_width | 9 | width of data slice |
| dslice_time_intrlv | 1 | time interleaving on/off |
| dslice_type | 1 | data slice type (CCM, ACM/VCM) |
| } | | |
| for plp { | | |
| dslice_id | 8 | data sliced ID |
| plp_id | 8 | PLP ID |
| plp_type | 1 | PLP type (common/data) |
| plp_payload_type | 5 | PLP payload type (TS , GS , ⋯) |
|   if dslice_type=CCM { | | |
|   plp_mod | 3 | PLP  modulation type |
|   plp_fec_type | 1 | PLP  FEC type (long/short) |
|   plp_cod | 3 | PLP  coderate |
|   plp_start | 21 | PLP  start address |
|   } | | |
| } | | |
| for notch { | | |
| chbon_index | 3 | bonded channel index |
| notch_start | 9 | start of notch band within one channel (8 MHz) |
| notch_width | 9 | width of notch band |
| } | | |
| gi | 1 | guard interval mode |
| sframe_id | 16 | superframe ID |
| frame_id | 16 | fraem ID |
| reserved | 16 | rfu |
| crc32 | 32 | CRC32 |
| Total | 19458 | |

The number of L1 information bits varies according to various configurations/conditions

Fig. 63

| Field | Bits | |
|---|---|---|
| L1_size | 14 | L1 block size (bits) |
| num_chbon | 3 | number of bonded channels |
| num_dslice | 8 | number of data slices |
| num_plp | 8 | number of PLPs |
| num_notch | 5 | number of notch bands |
| for dslice { | | |
| chbon_index | 3 | bonded channel index |
| dslice_start | 9 | start of data slice within one channel (8 MHz) |
| dslice_width | 9 | width of data slice |
| dslice_time_intrlv | 1 | time interleaving on/off |
| dslice_type | 1 | data slice type (CCM, ACM/VCM) |
| } | | |
| for plp { | | |
| dslice_id | 8 | data sliced ID |
| plp_id | 8 | PLP ID |
| plp_type | 1 | PLP type (common/data) |
| plp_payload_type | 5 | PLP payload type (TS , GS , ...) |
| if dslice_type=CCM { | | |
| plp_mod | 3 | PLP modulation type |
| plp_fec_type | 1 | PLP FEC type (long/short) |
| plp_cod | 3 | PLP coderate |
| plp_start | 14 | PLP start address |
| } | | |
| } | | |
| for notch { | | |
| chbon_index | 3 | bonded channel index |
| notch_start | 9 | start of notch band within one channel (8 MHz) |
| notch_width | 9 | width of notch band |
| } | | |
| gi | 1 | guard interval mode |
| sframe_id | 16 | superframe ID |
| frame_id | 16 | fraem ID |
| reserved | 16 | rfu |
| crc32 | 32 | CRC32 |
| Total | 17666 | |

The number of L1 information bits varies
according to various configurations/conditions Fig. 64
| LDPC length | QAM type | QAM symbols |
|---|---|---|
| 64800 | 16 QAM | 16200 |
| 64800 | 64 QAM | 10800 |
| 64800 | 256 QAM | 8100 |
| 64800 | 1024 QAM | 6480 |
| 64800 | 4096 QAM | 5400 |
| 16200 | 16 QAM | 4050 |
| 16200 | 64 QAM | 2700 |
| 16200 | 256 QAM | 2025 |
| 16200 | 1024 QAM | 1620 |
| 16200 | 4096 QAM | 1350 |
Fig. 65
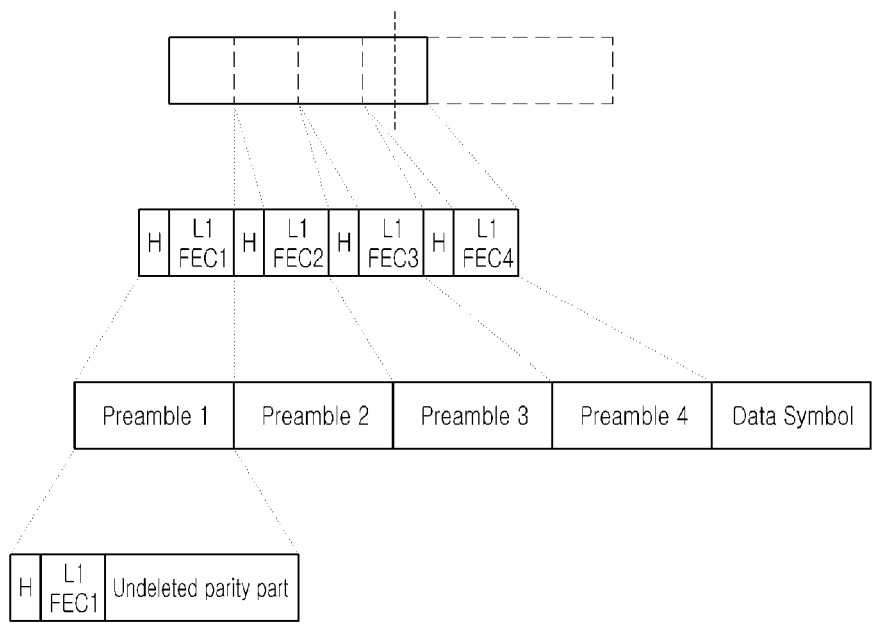
Fig. 66

Fig. 73
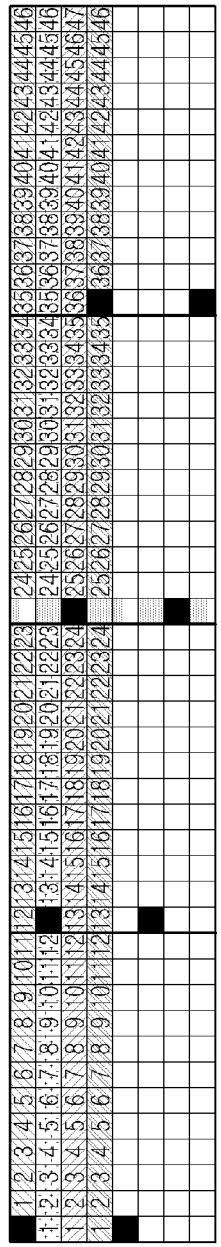
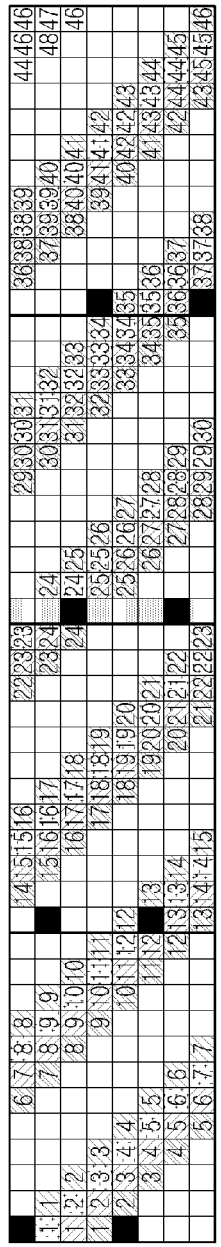
```
RA=0; CA=0;
while I<nCELL loop
    If addr = pilot position
    RA = [RA+1] mod NT;
    CA = [CA+1] mod ND;
    end if ;
WRITE;
RA = [RA+1] mod NT;
CA = [CA+1] mod ND;
    if CA = 0
    RA = RA+1;
    end if ;
end loop;
```
■ Scattered Pilot
▨ Continual Pilot
RA = Row Address
CA = Column Address
nCell = # of cells within TI block
Memory overhead = 2%
After applying          Before applying
Time interleaving       Time interleaving (a) Time interleaving (b) Time de-interleaving

Fig. 95

(a) 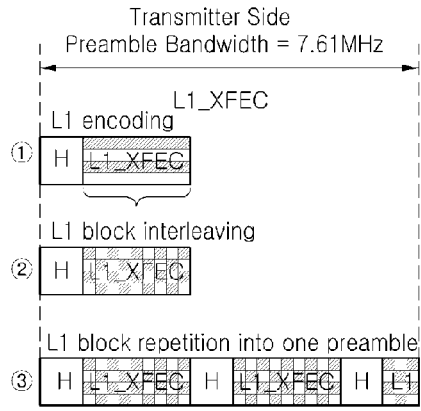

(b) 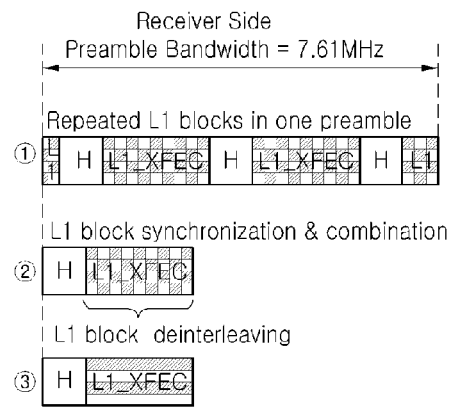

Fig. 96

| Value | TI depth |
|---|---|
| 00 | No TI |
| 01 | Best Fit |
| 10 | 4 OFDM symbols |
| 11 | 8 OFDM symbols |

} When TI_flag(1 bit) is used

TI for short L1 block
For better TI performance

Fig. 97

(a)
Header signaling & structure

| No | Key Features | Signaling Fields | Padding | L1 Header PER Performance | L1 Block TI Performance | Additional Overhead |
|---|---|---|---|---|---|---|
| 1 | TI on/off flag only | L1 (15), TI (1), no CRC | No | Normal | Bad for short L1 block | No |
| 2 | L1_size_bits / 8 | L1 (12), TI (2), CRC (2) | Max 7 bits | Best | Good | No |
| 3 | L1_size_cells | L1 (13), TI (2), CRC (1) | Max 3 bits | Good | Good | No |
| 4 | L1_size_bits per symbol | L1 (13), TI (2), CRC (1) | Max 4 bits | Good | Good | No |
| 5 | L1_size_cells per symbol | L1 (11), TI (2), CRC (2), Rfu (1) | Max 19 bits | Best | Good | No |
| 6 | Two headers (32 bits) | L1 (15), TI (2), CRC (4), Rfu (11) | No | Best | Good | 0.01% (negligible) |

(b)
Padding method

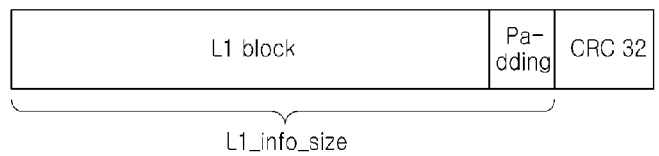

Fig. 98

| Field | Bits | Description |
|---|---|---|
| num_chbon | 3 | number of bonded channels |
| num_dslice | 8 | number of data slices |
| num_notch | 4 | number of notch bands |
| for i=0..num_dslice-1 { | | |
| dslice_id | 8 | data slice identifier |
| dslice_start | 12 | start of data slice within C2 channel (Max 64MHz) |
| dslice_width | 9 | width of data slice (Max 7.61MHz) |
| dslice_ti_depth | 2 | time interleaver depth |
| dslice_type | 1 | data slice type (type1, type2)* |
| dslice_pwr_allocation | 2 | data slice power allocation |
| num_plp | 8 | number of PLPs |
|   for i=0..num_plp-1 { | | |
|   plp_id | 8 | PLP identifier |
|   plp_type | 1 | PLP type (common/data) |
|   PSI/SI reprocessing | 1 | PSP/SI reprocessing flag |
|   plp_payload_type | 5 | PLP payload type (TS, GS, ...) |
|     if dslice_type=='0' { | | |
|     plp_modcod | 5 | PLP modulation/coding |
|     plp_start_addr | 14 | PLP start address |
|     } | | |
|   } | | |
| } | | |
| for i=0..num_notch-1{ | | |
| notch_start | 12 | start of notch band within C2 channel (Max 64MHz) |
| notch_width | 9 | width of notch band (Max 7.61MHz) |
| } | | |
| gi | 2 | guard interval mode |
| num_data_symbols | 10 | number of data OFDM symbols per C2-frame |
| num_c2_frames | 8 | number of C2-frames per superframe |
| frame_idx | 8 | C2-frame index within one superframe |
| PAPR | 1 | PAPR flag |
| reserved | 0 | reserved for future use |
| crc32 | 32 | CRC32 |

*type1 : Single PLP with CCM
*type2 : Others

Fig. 99

| dslice_ti_depth | TI depth |
|---|---|
| "00" | 1 |
| "01" | 4 |
| "10" | 8 |
| "11" | 16 |

Fig. 100

| dslice_type | type |
|---|---|
| "0" | Single PLP with CCM |
| "1" | Others |

Fig. 101

| plp_type | type |
|---|---|
| "0" | common plp |
| "1" | data plp |

Fig. 102

| plp_payload_type | payload type |
|---|---|
| "00000" | GFPS |
| "00001" | GCS |
| "00010" | GSE |
| "00011" | TS |
| others | reserved future use |

Fig. 103

| plp_modcod | Modulation | code rate | LDPC block |
|---|---|---|---|
| "00000" | 16QAM | 4/5 | long |
| "00001" | | | short |
| "00010" | | 9/10 | long |
| "00011" | | 8/9 | short |
| "00100" | 64QAM | 2/3 | long |
| "00101" | | | short |
| "00110" | | 4/5 | long |
| "00111" | | | short |
| "01000" | | 9/10 | long |
| "01001" | | 8/9 | short |
| "01010" | 256QAM | 3/4 | long |
| "01011" | | | short |
| "01100" | | 5/6 | long |
| "01101" | | | short |
| "01110" | | 9/10 | long |
| "01111" | | 8/9 | short |
| "10000" | 1024QAM | 3/4 | long |
| "10001" | | | short |
| "10010" | | 5/6 | long |
| "10011" | | | short |
| "10100" | | 9/10 | long |
| "10101" | | 8/9 | short |
| "10110" | 4096QAM | 5/6 | long |
| "10111" | | | short |
| "11000" | | 9/10 | long |
| "11001" | | 8/9 | short |
| others | reserved fuuture use | reserved fuuture use | reserved fuuture use |

Fig. 104

| gi | value |
|---|---|
| "00" | 1/128 |
| "01" | 1/64 |
| others | reserved future use |

Fig. 105

| PAPR | value |
|---|---|
| "0" | disable |
| "1" | enable |

Fig. 106

| Field | Bits | Description |
|---|---|---|
| network_id | 16 | ID of the current DVB-C2 network |
| c2_system_id | 16 | ID of the C2 system within the DVB-C2 network |
| C2_signal_start_frequency | 32 | C2 signal start frequency |
| C2_signal_stop_frequency | 32 | C2 signal stop frequency |
| num_chbon | 3 | number of bonded channels |
| num_dslice | 8 | number of data slices |
| num_notch | 4 | number of notch bands |
| for i=0..num_dslice-1 { | | |
| dslice_id | 8 | data slice identifier |
| dslice_start | 12 | start of data slice within C2 channel (max 64MHz) |
| dslice_width | 9 | width of data slice (Max 7.61MHz) |
| dslice_ti_depth | 2 | time interleaver depth |
| dslice_type | 1 | data slice type (type1, type2)* |
| dslice_pwr_allocation | 2 | data slice power allocation |
| reserved_1 | 0 | reserved for future use |
| num_plp | 8 | number of PLPs |
|   for i=0..num_plp-1 { | | |
|   plp_id | 8 | PLP identifier |
|   plp_type | 2 | PLP type (common/normal data/grouped data) |
|     if plp_type=='common' or 'grouped' { | | |
|   plp_group_id | 8 | PLP group identifier |
|   } | | |
|   plp_payload_type | 5 | PLP payload type (TS, GS, …) |
|   PSI/SI reprocessing | 1 | PSP/SI reprocessing flag |
|   reserved_2 | 0 | reserved for future use |
|     if dslice_type=='0' { | | |
|   plp_modcod | 5 | PLP modulation/coding |
|   plp_start_addr | 14 | PLP start address |
|   } | | |
|   } | | |
| } | | |
| for i=0..num_notch-1 { | | |
| notch_start | 12 | start of notch band within C2 channel (max 64MHz) |
| notch_width | 9 | width of notch band (Max 7.61MHz) |
| } | | |
| gi | 2 | guard interval mode |
| num_data_symbols | 10 | number of data OFDM symbols per C2-frame |
| num_c2_frames | 8 | number of C2-frames per superframe |
| frame_idx | 8 | C2-frame index within one superframe |
| PAPR | 1 | PAPR flag |
| reserved_3 | 0 | reserved for future use |
| crc32 | 32 | CRC32 |

*type1 : Single PLP with CCM
*type2 : Others

Fig. 107

| plp_type | type |
|---|---|
| "00" | common plp |
| "01" | normal data plp |
| "10" | grouped data plp |
| others | reserved future use |

Fig. 108

| Field | Bits | Description |
|---|---|---|
| network_id | 16 | ID of the current DVB-C2 network |
| c2_system_id | 16 | ID of the C2 system within the DVB-C2 network |
| C2_signal_start_frequency | 32 | C2 signal start frequency |
| num_chbon | 3 | number of bonded channels |
| num_dslice | 8 | number of data slices |
| num_notch | 4 | number of notch bands |
| for i=0..num_dslice-1 { | | |
| dslice_id | 8 | data slice identifier |
| dslice_start | 12 | start of data slice within C2 channel (max 64MHz) |
| dslice_width | 12 | width of data slice (Max 64MHz) |
| dslice_ti_depth | 2 | time interleaver depth |
| dslice_type | 1 | data slice type (type1, type2)* |
| num_plp | 8 | number of PLPs |
| reserved_1 | 0 | reserved for future use |
|   for i=0..num_plp-1 { | | |
|   plp_id | 8 | PLP identifier |
|   plp_type | 2 | PLP type (common/ normal_data /grouped data ) |
|     if plp_type=='common' or 'grouped' { | | |
|     plp_group_id | 8 | PLP group identifier |
|     } | | |
|   PSI/SI reprocessing | 1 | PSP/SI reprocessing flag |
|   plp_payload_type | 5 | PLP payload type (TS, GS, …) |
|   reserved_2 | 0 | reserved for future use |
|     if dslice_type=='0' { | | |
|     plp_modcod | 5 | PLP modulation/coding |
|     plp_start_addr | 14 | PLP start address |
|     } | | |
|   } | | |
| } | | |
| for i=0..num_notch-1 { | | |
| notch_start | 12 | start of notch band within C2 channel (max 64MHz) |
| notch_width | 9 | width of notch band (Max 7.61MHz) |
| } | | |
| gi | 2 | guard interval mode |
| PAPR | 1 | PAPR flag |
| reserved_3 | 0 | reserved for future use |
| crc32 | 32 | CRC32 |
| Total | 221 | |

\*type1 : Single PLP with CCM
\*type2 :    Others

Fig. 109

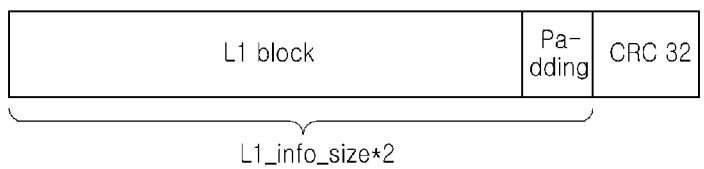

| Value | TI depth | |
|---|---|---|
| 00 | No TI | When TI_flag(1 bit) is used |
| 01 | Best Fit | |
| 10 | 4 OFDM symbols | TI for short L1 block |
| 11 | 8 OFDM symbols | For better TI performance |

Fig. 110

| Field | Bits | Description |
|---|---|---|
| NETWORK_ID | 16 | ID of the current DVB-C2 network |
| C2_SYSTEM_ID | 16 | ID of the C2 system within the DVB-C2 network |
| C2_SIGNAL_START_FREQUENCY | 32 | C2 signal start frequency (unit = 1Hz) |
| NUM_CHBON | 3 | Number of bonded channels |
| NUM_DSLICE | 8 | Number of data slices |
| NUM_NOTCH | 4 | Number of notch bands |
| for i=0..NUM_DSLICE-1 { | | |
| DSLICE_ID | 8 | Data slice identifier |
| DSLICE_START | 12 | Start of data slice within C2 channel (max 64MHz) (unit = 12 OFDM cells) |
| DSLICE_WIDTH | 12 | Width of data slice (Max 64MHz) (unit = 12 OFDM cells) |
| DSLICE_TI_DEPTH | 2 | Time interleaver depth |
| DSLICE_TYPE | 1 | Data slice type (Single PLP with CCM, others) |
| DSLICE_NUM_PLP | 8 | Number of PLPs in current data slice |
| for i=0..DSLICE_NUM_PLP-1 { | | |
| PLP_ID | 8 | PLP identifier |
| PLP_TYPE | 2 | PLP type (common/normal data/grouped data) |
| PLP_PAYLOAD_TYPE | 5 | PLP payload type (GFPS, GCS, GSE, TS, RFU) |
| ifPLP_TYPE=='00' or '01' { | | |
| PLP_GROUP_ID | 8 | PLP group identifier |
| } | | |
| ifDSLICE_TYPE=='0' { | | |
| PLP_START | 14 | PLP start address (unit = 1 OFDM cell) |
| PLP_MODCOD | 5 | PLP modulation/coding |
| } | | |
| PSI/SI_REPROCESSING | 1 | PSP/SI reprocessing flag |
| RESERVED_1 | 8 | Reserved for future use |
| } | | |
| RESERVED_2 | 8 | Reserved for future use |
| } | | |
| for i=0..NUM_NOTCH-1 { | | |
| NOTCH_START | 12 | Start of notch band within C2 channel (max 64MHz) (unit = 12 OFDM cells) |
| NOTCH_WIDTH | 9 | Width of notch band (Max 7.61MHz) (unit = 12 OFDM cells) |
| RESERVED_3 | 8 | Reserved for future use |
| } | | |
| GI | 2 | Guard interval mode |
| PAPR | 1 | PAPR flag |
| L1_PART2_CHANGE_COUNTER | 8 | Number of C2 frames ahead which the L1_part2 will change except for PLP_START (unit = 1 C2 frame) |
| RESERVED_4 | 16 | Reserved for future use |
| CRC32 | 32 | CRC32 |
| Total | 269 | |

Fig. 111

DSLICE_TI_DEPTH

| Value | TI depth |
|---|---|
| 00 | 1 OFDM symbol |
| 01 | 4 OFDM symbols |
| 10 | 8 OFDM symbols |
| 11 | 16 OFDM symbols |

PAPR

| Value | PAPR |
|---|---|
| 0 | disable |
| 1 | enable |

DSLICE_TYPE

| Value | Data slice type |
|---|---|
| 0 | Single PLP with CCM |
| 1 | Others |

GI

| Value | Guard Interval fraction |
|---|---|
| 00 | 1/128 |
| 01 | 1/64 |
| 10 to 11 | Reserved for future use |

PLP_TYPE

| Value | PLP Type |
|---|---|
| 00 | Common PLP |
| 01 | grouped data plp |
| 10 | normal data plp |
| 11 | Reserved for future use |

PLP_PAYLOAD_TYPE

| Value | Payload type |
|---|---|
| 00000 | GFPS |
| 00001 | GCS |
| 00010 | GSE |
| 00011 | TS |
| 00100 to 11111 | Reserved for future use |

PLP_MODCOD

| Value | Modulation | Code rate | FEC type |
|---|---|---|---|
| 00000 | 16QAM | 4/5 | 64K LDPC |
| 00001 | 16QAM | 4/5 | 16K LDPC |
| 00010 | 16QAM | 9/10 | 64K LDPC |
| 00011 | 16QAM | 8/9 | 16K LDPC |
| 00100 | 64QAM | 2/3 | 64K LDPC |
| 00101 | 64QAM | 2/3 | 16K LDPC |
| 00110 | 64QAM | 4/5 | 64K LDPC |
| 00111 | 64QAM | 4/5 | 16K LDPC |
| 01000 | 64QAM | 9/10 | 64K LDPC |
| 01001 | 64QAM | 8/9 | 16K LDPC |
| 01010 | 256QAM | 3/4 | 64K LDPC |
| 01011 | 256QAM | 3/4 | 16K LDPC |
| 01100 | 256QAM | 5/6 | 64K LDPC |
| 01101 | 256QAM | 5/6 | 16K LDPC |
| 01110 | 256QAM | 9/10 | 64K LDPC |
| 01111 | 256QAM | 8/9 | 16K LDPC |
| 10000 | 1024QAM | 3/4 | 64K LDPC |
| 10001 | 1024QAM | 3/4 | 16K LDPC |
| 10010 | 1024QAM | 5/6 | 64K LDPC |
| 10011 | 1024QAM | 5/6 | 16K LDPC |
| 10100 | 1024QAM | 9/10 | 64K LDPC |
| 10101 | 1024QAM | 8/9 | 16K LDPC |
| 10110 | 4096QAM | 5/6 | 64K LDPC |
| 10111 | 4096QAM | 5/6 | 16K LDPC |
| 11000 | 4096QAM | 9/10 | 64K LDPC |
| 11001 | 4096QAM | 8/9 | 16K LDPC |
| 11010 to 11111 | Reserved for future use | | |

Fig. 112

| Field | Bits | Description |
|---|---|---|
| NETWORK_ID | 16 | ID of the current DVB-C2 network |
| C2_SYSTEM_ID | 16 | ID of the C2 system within the DVB-C2 network |
| C2_SIGNAL_START_FREQUENCY | 32 | C2 signal start frequency (unit = 1Hz) |
| GI | 2 | Guard interval mode |
| L1_PART2_CHANGE_COUNTER | 8 | Number of C2 frames ahead which the L1_part2 will change except for PLP_START (unit = 1 C2 frame) |
| NUM_CHBON | 3 | Number of bonded channels |
| NUM_DSLICE | 8 | Number of data slices |
| NUM_NOTCH | 4 | Number of notch bands |
| for i=0..NUM_DSLICE { | | |
| DSLICE_ID | 8 | Data slice identifier |
| DSLICE_START | 12(11) | Start of data slice within C2 channel (max 64MHz) (unit = 12 or 24 OFDM cells for 1/64, 1/128 GI respectively) |
| DSLICE_WIDTH | 12(11) | Width of data slice (Max 64MHz) (unit = 12 or 24 OFDM cells for 1/64, 1/128 GI respectively) |
| DSLICE_TI_DEPTH | 2 | Time interleaver depth |
| DSLICE_TYPE | 1 | Data slice type (Single PLP with CCM, others) |
| DSLICE_CONST_FLAG | 1 | Indicator for Constant data slice |
| DSLICE_NOTCH_FLAG | 2 | Indicator for neighbored notch |
| DSLICE_NUM_PLP | 8 | Number of PLPs in current data slice |
| for i=0..DSLICE_NUM_PLP { | | |
| PLP_ID | 8 | PLP identifier |
| PLP_TYPE | 3 | PLP type (common/grouped data/normal data/bundled data) |
| PLP_PAYLOAD_TYPE | 5 | PLP payload type (GFPS, GCS, GSE, TS, RFU) |
| iPLP_TYPE='00' or '01' { | | |
| PLP_GROUP_ID | 8 | PLP group identifier |
| } | | |
| iDSLICE_TYPE= '0' { | | |
| PLP_START | 14 | PLP start address (unit = 1 OFDM cell) |
| PLP_MODCOD | 5 | PLP modulation/coding |
| } | | |
| PSI/SI_REPROCESSING | 1 | PSP/SI reprocessing flag |
| RESERVED_1 | 8 | Reserved for future use |
| } | | |
| RESERVED_2 | 8 | Reserved for future use |
| } | | |
| for i=0..NUM_NOTCH-1 { | | |
| NOTCH_START | 12(11) | Start of notch band within C2 channel (max 64MHz) (unit = 12 or 24 OFDM cells for 1/64, 1/128 GI respectively) |
| NOTCH_WIDTH | 9(8) | Width of notch band (Max 7.61MHz) (unit = 12 or 24 OFDM cells for 1/64, 1/128 GI respectively) |
| RESERVED_3 | 8 | Reserved for future use |
| } | | |
| PAPR | 1 | PAPR flag |
| RESERVED_4 | 16 | Reserved for future use |
| CRC32 | 32 | CRC32 |
| Total | 228 | |

Fig. 113

| Value | PLP Type |
|---|---|
| 000 | Common PLP |
| 001 | grouped data PLP |
| 010 | normal data PLP |
| 011 | bundled data PLP |
| 100 to 111 | Reserved for future use |

Fig. 116

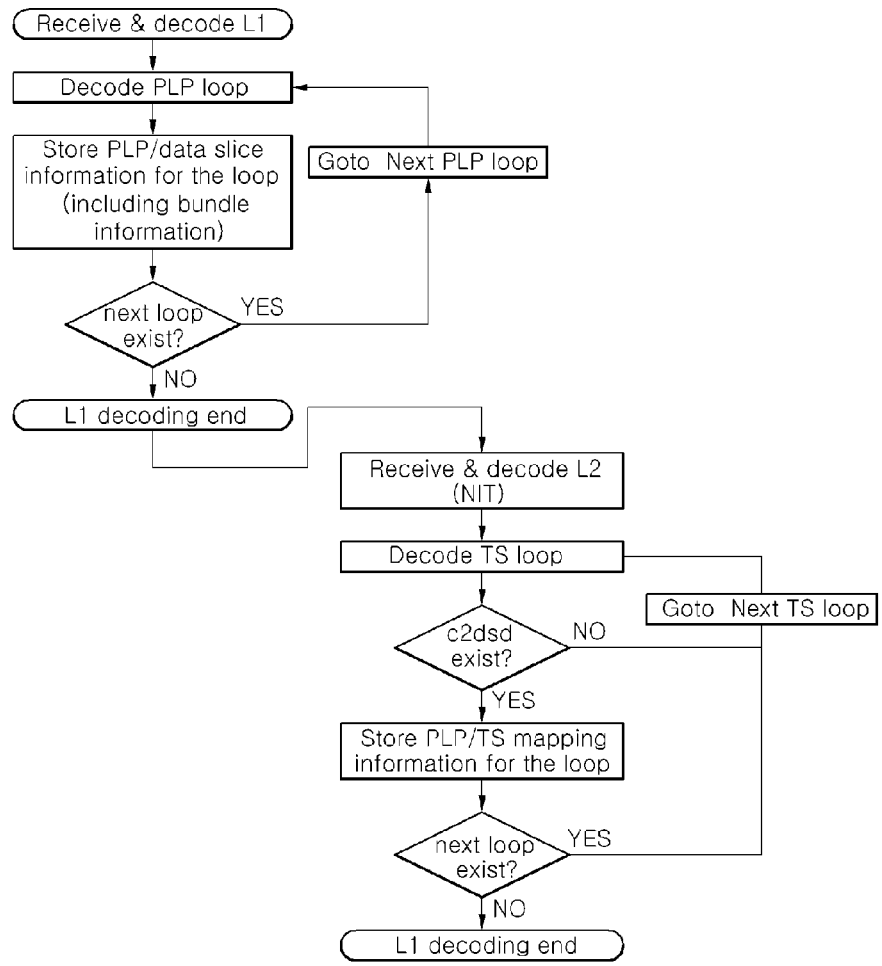

Fig. 117

| Syntax | Number of bits | Identifier |
|---|---|---|
| C2_delivery_system_descriptor() { | | |
|    descriptor_tag | 8 | uimsbf |
|    descriptor_length | 8 | uimsbf |
|    descriptor_tag_extension | 8 | uimsbf |
|    plp_id | 8 | uimsbf |
|    C2_system_id | 16 | uimsbf |
|    if ( descriptor_length > 5){ | | |
|       C2_System_tuning_frequency | 32 | bslbf |
|       active OFDM symbol duration | 3 | bslbf |
|       guard_interval | 3 | bslbf |
|       reserved | 2 | bslbf |
|    } | | |
| } | | |

Fig. 118

| Active_OFDM_symbol_duration | Description |
|---|---|
| 000 | 448μs(4k FFT mode for 8MHz bandwidth CATV systems) |
| 001 | 597μs(4k FFT mode for 6MHz bandwidth CATV systems)) |
| 010 to 111 | reserved for future use |

Fig. 119

| guard_interval | Guard interval values |
|---|---|
| 000 | 1/128 |
| 001 | 1/64 |
| 010 to 111 | reserved for future use |

Fig. 120

| Field | Bits | Description |
|---|---|---|
| NETWORK_ID | 16 | ID of the current DVB-C2 network |
| C2_SYSTEM_ID | 16 | ID of the C2 system within the DVB-C2 network |
| C2_SIGNAL_START_FREQUENCY | 32 | C2 signal start frequency (unit = 1Hz) |
| GI | 2 | Guard interval mode |
| L1_PART2_CHANGE_COUNTER | 8 | Number of C2 frames ahead which the L1_part2 will change except for PLP_START (unit = 1 C2 frame) |
| NUM_CHBON | 3 | Number of bonded channels |
| NUM_DSLICE | 8 | Number of data slices |
| NUM_NOTCH | 4 | Number of notch bands |
| for i=0..NUM_DSLICE { | | |
| DSLICE_ID | 8 | Data slice identifier |
| DSLICE_TUNE_POS | 12(11) | Tuning position for current data slice (unit = 12 or 24 OFDM cells for 1/64, 1/128 GI respectively) |
| DSLICE_OFFSET_LEFT | 9(8) | Offset for data slice left edge from tuning position (unit = 12 or 24 OFDM cells for 1/64, 1/128 GI respectively), Signed |
| DSLICE_OFFSET_RIGHT | 9(8) | Offset for data slice right edge from tuning position (unit = 12 or 24 OFDM cells for 1/64, 1/128 GI respectively), Signed |
| DSLICE_TI_DEPTH | 2 | Time interleaver depth |
| DSLICE_TYPE | 1 | Data slice type ( Single PLP with CCM, others ) |
| DSLICE_CONST_FLAG | 1 | Indicator for Constant data slice |
| DSLICE_NOTCH_FLAG | 1 | Indicator for neighbored notch |
| DSLICE_NUM_PLP | 8 | Number of PLPs in current data slice |
| for i=0..DSLICE_NUM_PLP-1 { | | |
| PLP_ID | 8 | PLP identifier |
| PLP_BUNDLED_FLAG | 1 | Bundled PLP flag |
| PLP_TYPE | 2 | PLP type (common/ grouped data/normal data ) |
| PLP_PAYLOAD_TYPE | 5 | PLP payload type ( GFPS, GCS, GSE, TS, RFU) |
| if PLP_TYPE=='00' or '01' { | | |
| PLP_GROUP_ID | 8 | PLP group identifier |
| } | | |
| if DSLICE_TYPE =='0' { | | |
| PLP_START | 14 | PLP start address (unit = 1 OFDM cell) |
| PLP_MODCOD | 5 | PLP modulation/coding |
| } | | |
| PSI/SI_REPROCESSING | 1 | PSI/SI reprocessing flag |
| RESERVED_1 | 8 | Reserved for future use |
| } | | |
| RESERVED_2 | 8 | Reserved for future use |
| } | | |
| for i=0..NUM_NOTCH-1 { | | |
| NOTCH_START | 12(11) | Start of notch band within C2 channel (max 64MHz) (unit = 12 or 24 OFDM cells for 1/64, 1/128 GI respectively) |
| NOTCH_WIDTH | 9(8) | Width of notch band (Max 7.61MHz) (unit = 12 or 24 OFDM cells for 1/64, 1/128 GI respectively) |
| RESERVED_3 | 8 | Reserved for future use |
| } | | |
| PAPR | 1 | PAPR flag |
| RESERVED_4 | 16 | Reserved for future use |
| CRC 32 | 32 | CRC32 |
| Total | 227 | |

APPARATUS FOR TRANSMITTING AND RECEIVING A SIGNAL AND METHOD OF TRANSMITTING AND RECEIVING A SIGNAL

CROSS-REFERENCE TO RELATED APPLICATIONS

This application is continuation of U.S. application Ser. No. 12/922,683, filed Sep. 14, 2010, now U.S. Pat. No. 8,503,551, which is the National Stage filing under 35 U.S.C. 371 of International Application No. PCT/KR2009/002542, filed on May 13, 2009, which claims the benefit of U.S. Provisional Application Ser. No. 61/152,265, filed on Feb. 13, 2009, the contents of all of which are incorporated by reference herein in their entireties.

TECHNICAL FIELD

The present invention relates to a method for transmitting and receiving a signal and an apparatus for transmitting and receiving a signal, and more particularly, to a method for transmitting and receiving a signal and an apparatus for transmitting and receiving a signal, which are capable of improving data transmission efficiency.

BACKGROUND ART

As a digital broadcasting technology has been developed, users have received a high definition (HD) moving image. With continuous development of a compression algorithm and high performance of hardware, a better environment will be provided to the users in the future. A digital television (DTV) system can receive a digital broadcasting signal and provide a variety of supplementary services to users as well as a video signal and an audio signal.

Digital Video Broadcasting (DVB)-C2 is the third specification to join DVB s family of second generation transmission systems. Developed in 1994, today DVB-C is deployed in more than 50 million cable tuners worldwide. In line with the other DVB second generation systems, DVB-C2 uses a combination of Low-density parity-check (LDPC) and BCH codes. This powerful Forward Error correction (FEC) provides about 5 dB improvement of carrier-to-noise ratio over DVB-C. Appropriate bit-interleaving schemes optimize the overall robustness of the FEC system. Extended by a header, these frames are called Physical Layer Pipes (PLP). One or more of these PLPs are multiplexed into a data slice. Two dimensional interleaving (in the time and frequency domains) is applied to each slice enabling the receiver to eliminate the impact of burst impairments and frequency selective interference such as single frequency ingress.

With the development of these digital broadcasting technologies, a requirement for a service such as a video signal and an audio signal increased and the size of data desired by users or the number of broadcasting channels gradually increased.

DISCLOSURE OF INVENTION

Technical Problem

Accordingly, the present invention is directed to a method for transmitting and receiving a signal and an apparatus for transmitting and receiving a signal that substantially obviate one or more problems due to limitations and disadvantages of the related art.

Technical Solution

An object of the present invention is to provide a method for transmitting and receiving a signal and an apparatus for transmitting and receiving a signal, which are capable of improving data transmission efficiency.

Another object of the present invention is to provide a method for transmitting and receiving a signal and an apparatus for transmitting and receiving a signal, which are capable of improving error correction capability of bits configuring a service.

Additional advantages, objects, and features of the invention will be set forth in part in the description which follows and in part will become apparent to those having ordinary skill in the art upon examination of the following. The objectives and other advantages of the invention may be realized and attained by the structure particularly pointed out in the written description and claims hereof as well as the appended drawings.

To achieve the objects, the present invention provides a transmitter for transmitting broadcasting data to a receiver, the transmitter comprising: a first encoder configured to receive PLP (Physical Layer Pipe) data, to encode the received PLP data and to output the encoded PLP data; a second encoder configured to receive Layer 1 signaling data, to encode the received Layer 1 signaling data and to output the encoded Layer 1 signaling data; and a frame builder configured to receive the output PLP data and the output Layer 1 signaling data and to assemble the received PLP data and the received Layer 1 signaling data to form a frame structure, wherein the transmitter is configured to process the Layer 1 signaling data, wherein the Layer 1 signaling data include PLP_bundled information indicating whether or not the associated PLP is bundled with other PLP within a broadcasting system.

Yet another embodiment of the present invention provides a receiver for processing broadcasting data, the receiver comprising: a frame divider configured to receive a frame having at least one PLP (Physical Layer Pipe) data and a frame header and to divide the frame into the at least one PLP data and the frame header, the frame header having Layer 1 signaling data; and a decoder configured to receive the divided Layer 1 signaling data and to decode the received Layer 1 signaling data, wherein the receiver is configured to process the Layer 1 signaling data, wherein the Layer 1 signaling data include PLP_bundled information indicating whether or not the associated PLP is bundled with other PLP within a broadcasting system.

Yet another embodiment of the present invention provides a method of receiving broadcasting data, the method comprising: receiving a frame having at least one PLP (Physical Layer Pipe) data and a frame header; dividing the frame into the at least one PLP data and the frame header, the frame header including Layer 1 signaling data; receiving the divided Layer 1 signaling data; and decoding the received Layer 1 signaling data, wherein the Layer 1 signaling data include PLP_bundled information indicating whether or not the associated PLP is bundled with other PLP within a broadcasting system.

Yet another embodiment of the present invention provides a method of transmitting broadcasting signal to a receiver, the method comprising: receiving PLP (Physical Layer Pipe) data; encoding the received PLP data; receiving Layer 1 signaling data; encoding the received Layer 1 signaling data; assembling the encoded PLP data and the encoded Layer 1 signaling data to form a frame structure; wherein the Layer 1 signaling data include PLP_bundled information indicating whether or not the associated PLP is bundled with other PLP within a broadcasting system.

Advantageous Effects

According to the present invention, it is possible to provide a receiver for processing broadcasting data, the receiver comprising: a frame divider configured to receive a frame having at least one PLP (Physical Layer Pipe) data and a frame header and to divide the frame into the at least one PLP data and the frame header, the frame header having Layer 1 signaling data; and a decoder configured to receive the divided Layer 1 signaling data and to decode the received Layer 1 signaling data, wherein the receiver is configured to process the Layer 1 signaling data, wherein the Layer 1 signaling data include PLP_bundled information indicating whether or not the associated PLP is bundled with other PLP within a broadcasting system.

BRIEF DESCRIPTION OF DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 3 is an information that can be included in Base band (BB).
FIG. 6 is an example of applying various constellations.
FIG. 7 is another example of cases where compatibility between conventional systems is considered.
FIG. 17 is scattered pilot structure that uses z=56 and z=112.
FIG. 18 is an example of modulator based on OFDM.
FIG. 19 is an example of preamble structure.
FIG. 36 is a new L1 block repetition rate of 7.61 MHz.
FIG. 37 is an example of L1 signaling which is transmitted in frame header.
FIG. 41 is another example of L1 signaling transmitted within a frame header.
FIG. 42 is an example of frequency or time interleaving/deinterleaving.
FIG. 43 is a table analyzing overhead of L1 signaling which is transmitted in FECFRAME header at ModCod Header Inserting module 307 on data path of BICM module shown in FIG. 3.
FIG. 44 is showing a structure for FECFRAME header for minimizing overhead.
FIG. 45 is showing a bit error rate (BER) performance of the aforementioned L1 protection.
FIG. 47 is showing an example of L1 signaling.
FIG. 48 is showing an example of L1-pre signaling.
FIG. 54 is showing an example of L1-pre signaling where power boosting is considered.
FIG. 55 is showing an example of L1 signaling.
FIG. 59 is showing an example of L1-pre signaling.
FIG. 60 is showing an example of L1 signaling.
FIG. 61 is showing an example of L1 signalling path.
FIG. 62 is another example of L1 signaling transmitted within a frame header.
FIG. 63 is another example of L1 signaling transmitted within a frame header.
FIG. 64 is another example of L1 signaling transmitted within a frame header.
FIG. 65 is showing an example of L1 signaling.
FIG. 66 is an example of symbol interleaver.
FIG. 73 is an example of addressing method of FIG. 72.

FIG. 95 is an example of preamble time interleaving and deinterleaving flow.

FIG. 96 is a Time Interleaving depth parameter in L1 header signaling.

FIG. 97 is an example of an L1 header signaling, L1 structure, and a padding method.

FIG. 98 is an example of L1 signaling.

FIG. 99 is an example of dslice_ti_depth.

FIG. 100 is an example of dslice_type.

FIG. 101 is an example of plp_type.

FIG. 102 is an example of Plp_payload_type.

FIG. 103 is an example of Plp_modcod.

FIG. 104 is an example of GI.

FIG. 105 is an example of PAPR.

FIG. 106 is an example of L1 signaling.

FIG. 107 is an example of plp_type.

FIG. 108 is an example of L1 signaling.

FIG. 109 is an example of an L1 header signaling, L1 structure, and a padding method.

FIG. 110 is an example of L1 signaling.

FIG. 111 is showing examples of fields of L1 signaling.

FIG. 112 is an example of L1 signaling.

FIG. 113 is an example of plp_type.

FIG. 116 is an example of L1 and L2 decoding action flow of a premium DVB-C2 receiver with multiple tuners or a wideband single tuner.

FIG. 117 is an example of an L2 signalling for C2.

FIG. 118 is an example of duration of the active OFDM symbol.

FIG. 119 is an example of guard interval values.

FIG. 120 is an example of L1 signaling.

BEST MODE FOR CARRYING OUT THE INVENTION

FIG. 120 is an example of L1 signaling.

Figure 121:
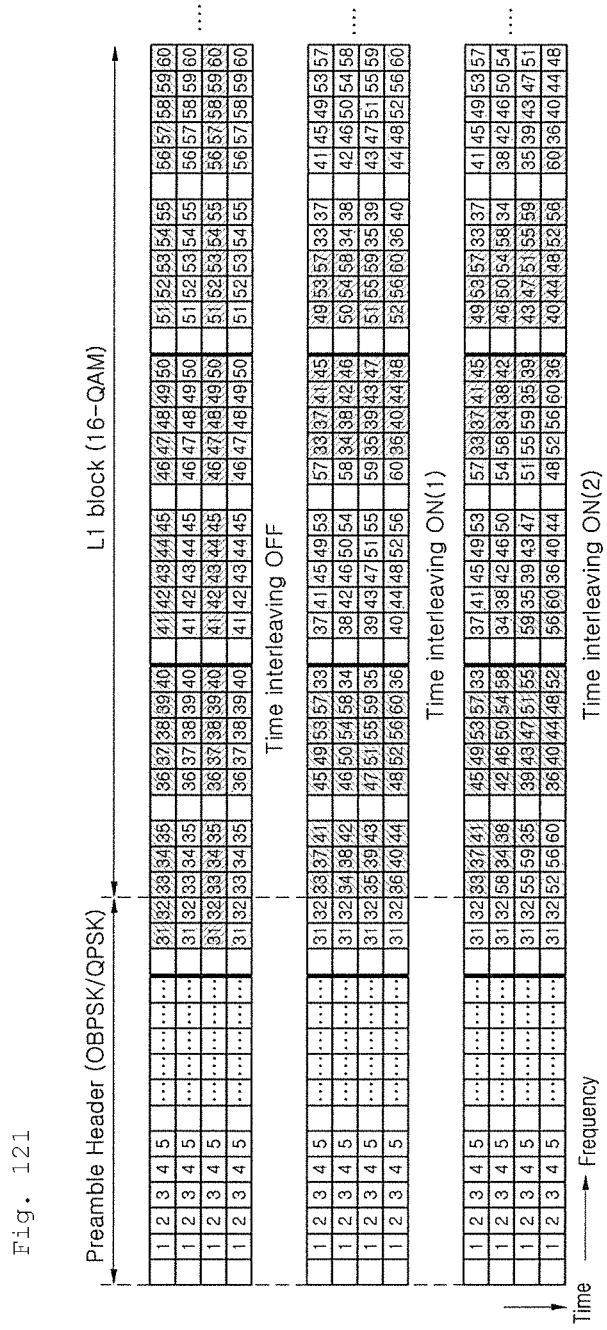
FIG. 121 is an example of L1 block time interleaving.

FIG. 121 is an example of L1 block time interleaving.

Mode for the Invention

Reference will now be made in detail to the preferred embodiments of the present invention, examples of which are illustrated in the accompanying drawings. Wherever possible, the same reference numbers will be used throughout the drawings to refer to the same or like parts.

In the following description, the term "Service" is indicative of either broadcast contents which can be transmitted/received by the signal transmission/reception apparatus.

Figure 1:
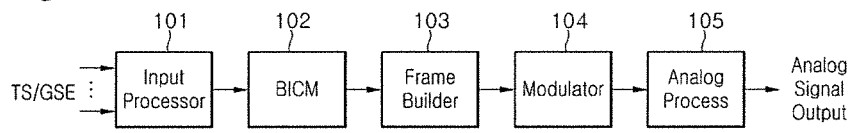
FIG. 1 is an example of digital transmission system.

FIG. 1 shows an example of digital transmission system according to an embodiment of the present invention. Inputs can comprise a number of MPEG-TS streams or GSE (General Stream Encapsulation) streams. An input processor 101 can add transmission parameters to input stream and perform scheduling for a BICM module 102. The BICM module 102 can add redundancy and interleave data for transmission channel error correction. A frame builder 103 can build frames by adding physical layer signaling information and pilots. A modulator 104 can perform modulation on input symbols in efficient methods. An analog processor 105 can perform various processes for converting input digital signals into output analog signals.

Figure 2:
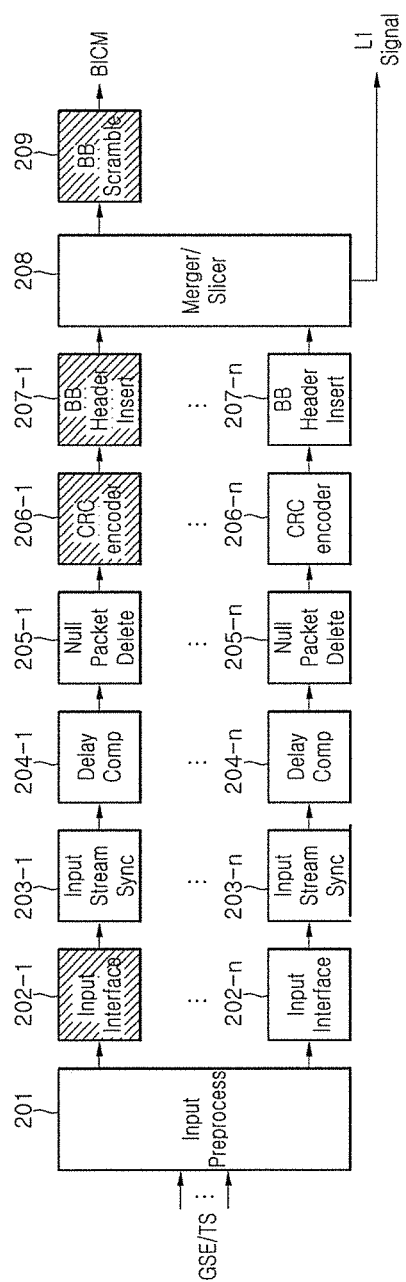
FIG. 2 is an example of an input processor.

FIG. 2 shows an example of an input processor. Input MPEG-TS or GSE stream can be transformed by input pre-processor into a total of n streams which will be independently processed. Each of those streams can be either a complete TS frame which includes multiple service components or a minimum TS frame which includes service component (i.e., video or audio). In addition, each of those streams can be a GSE stream which transmits either multiple services or a single service.

Input interface 202-1 can allocate a number of input bits equal to the maximum data field capacity of a Baseband (BB) frame. A padding may be inserted to complete the LDPC/BCH code block capacity. The input stream synchronizer 203-1 can provide a mechanism to regenerate, in the receiver, the clock of the Transport Stream (or packetized Generic Stream), in order to guarantee end-to-end constant bit rates and delay.

In order to allow the Transport Stream recombining without requiring additional memory in the receiver, the input Transport Streams are delayed by delay compensator 204-1~n considering interleaving parameters of the data PLPs in a group and the corresponding common PLP. Null packet deleting module 205-1~n can increase transmission efficiency by removing inserted null packet for a case of VBR (variable bit rate) service. Cyclic Redundancy Check (CRC) encoder modules 206-1~n can add CRC parity to increase transmission reliability of BB frame. BB header insert (207-1~n) modules can add BB frame header at a beginning portion of BB frame. Information that can be included in BB header is shown in FIG. 3.

A Merger/slicer module 208 can perform BB frame slicing from each PLP, merging BB frames from multiple PLPs, and scheduling each BB frame within a transmission frame. Therefore, the merger/slicer module 208 can output L1 signaling information which relates to allocation of PLP in frame. Lastly, a BB scrambler module 209 can randomize input bitstreams to minimize correlation between bits within bitstreams. The modules in shadow in FIG. 2 are modules used when transmission system uses a single PLP, the other modules in FIG. 2 are modules used when the transmission device uses multiple PLPs.

Figure 4:
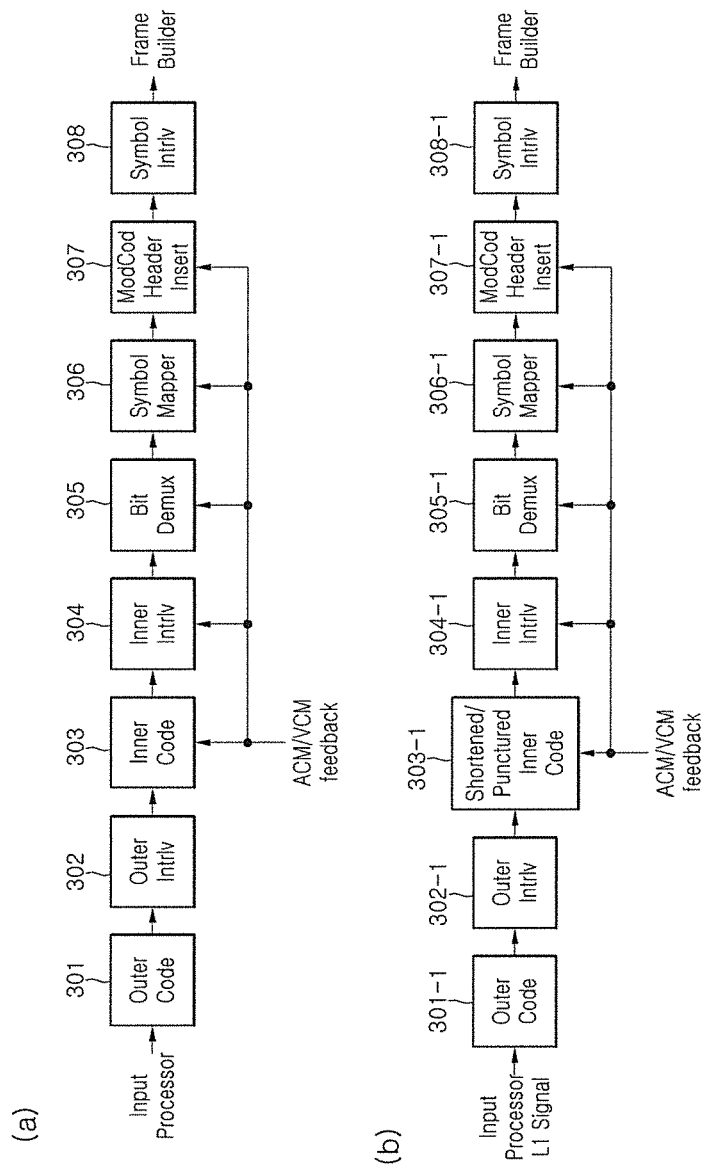
FIG. 4 is an example of BICM module.

FIG. 4 shows an embodiment of BICM module according to the present invention. FIG. 4a shows a BICM for a data path and FIG. 4b shows a BICM for L1 signaling path.

Referring to FIG. 4a, an outer coder 301 and an inner coder 303 can add redundancy to input bitstreams for error correction. An outer interleaver 302 and an inner interleaver 304 can interleave bits to prevent burst error. The Outer interleaver 302 can be omitted if the BICM is specifically for DVB-C2. A bit demux 305 can control reliability of each bit output from the inner interleaver 304. A symbol mapper 306 can map input bitstreams into symbol streams. At this time, it is possible to use any of a conventional QAM, an MQAM which uses the aforementioned BRGC for performance improvement, an NU-QAM which uses Non-uniform modulation, or an NU-MQAM which uses Non-uniform modulation applied BRGC for performance improvement. To construct a system which is more robust against noise, combinations of modulations using MQAM and/or NU-MQAM depending on the code rate of the error correction code and the constellation capacity can be considered. At this time, the Symbol mapper 306 can use a proper constellation according to the code rate and constellation capacity. FIG. 6 shows an example of such combinations.

Case 1 shows an example of using only NU-MQAM at low code rate for simplified system implementation. Case 2 shows an example of using optimized constellation at each code rate. The transmitter can send information about the code rate of the error correction code and the constellation capacity to the receiver such that the receiver can use an appropriate constellation. FIG. 7 shows another example of cases where compatibility between conventional systems is considered. In addition to the examples, further combinations for optimizing the system are possible.

The ModCod Header inserting module 307 shown in FIG. 4 can take Adaptive coding and modulation (ACM)/Variable coding and modulation (VCM) feedback information and add parameter information used in coding and modulation to a FEC block as header. The Modulation type/Coderate (ModCod) header can include the following information:

* FEC type (1 bits) long or short LDPC
* Coderate (3 bits)
* Modulation (3 bits) up-to 64K QAM
* PLP identifier (8 bits)

The Symbol interleaver 308 can perform interleaving in symbol domain to obtain additional interleaving effects. Similar processes performed on data path can be performed on L1 signaling path but with possibly different parameters 301-1~308-1. At this point, a shortened/punctured coder 303-1 can be used for inner code.

Figure 5:
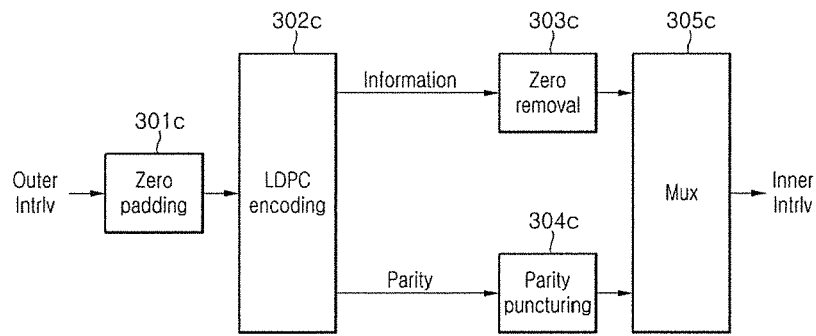
FIG. 5 is an example of shortened/punctured encoder.

FIG. 5 shows an example of LDPC encoding using shortening/puncturing. Shortening process can be performed on input blocks which have less bits than a required number of bits for LDPC encoding as many zero bits required for LDPC encoding can be padded by the zero padding module 301c. Zero Padded input bitstreams can have parity bits through LDPC encoder 302c. At this time, for bitstreams that correspond to original bitstreams, zeros can be removed (303c) and for parity bitstreams, puncturing can be performed according to code-rates by the parity puncturing module 304c. These processed information bitstreams and parity bitstreams can be multiplexed into original sequences and outputted by the Mux 305c.

Figure 8:
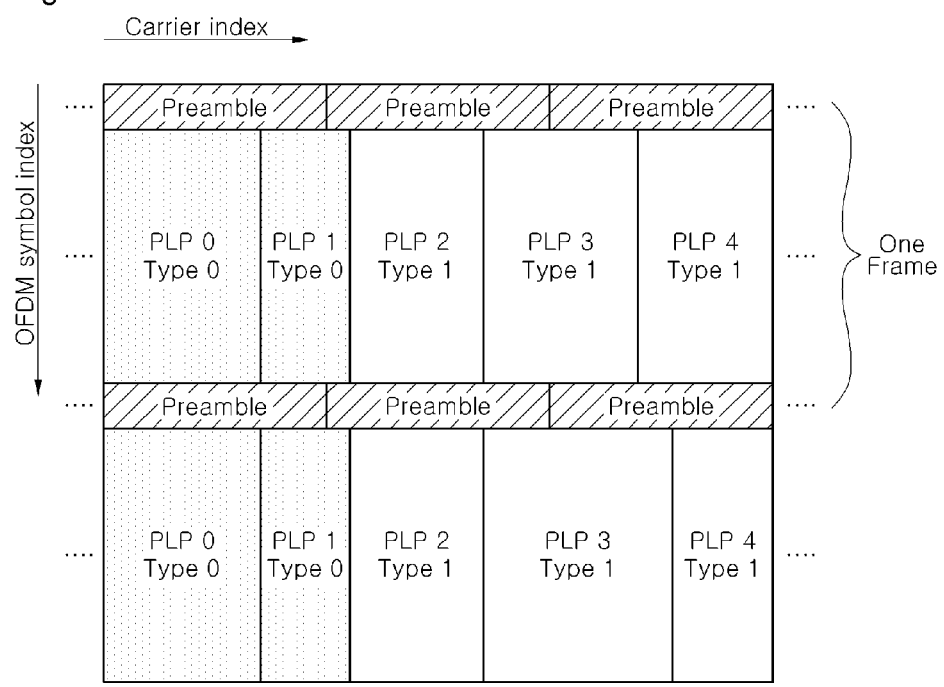
FIG. 8 is a frame structure which comprises preamble for L1 signaling and data symbol for PLP data.

FIG. 8 shows a frame structure which comprises preamble for L1 signaling and data symbol for PLP data. It can be seen that preamble and data symbols are cyclically generated, using one frame as a unit. Data symbols comprise PLP type 0 which is transmitted using a fixed modulation/coding and PLP type 1 which is transmitted using a variable modulation/coding. For PLP type 0, information such as modulation, FEC type, and FEC code rate are transmitted in preamble (see FIG. 9 for Frame header inserting module 401). For PLP type 1, corresponding information can be transmitted in FEC block header of a data symbol (see FIG. 3 for ModCod header inserting module 307). By the separation of PLP types, ModCod overhead can be reduced by 3~4% from a total transmission rate, for PLP type 0 which is transmitted at a fixed bit rate. At a receiver, for fixed modulation/coding PLP of PLP type 0, Frame header remover r401 shown in FIG. 30 can extract information on Modulation and FEC code rate and provide the extracted information to a BICM decoding module. For variable modulation/coding PLP of PLP type 1, ModCod extractor r307, r307-1 shown in FIG. 31 can extract and provide the parameters necessary for BICM decoding.

Figure 9:
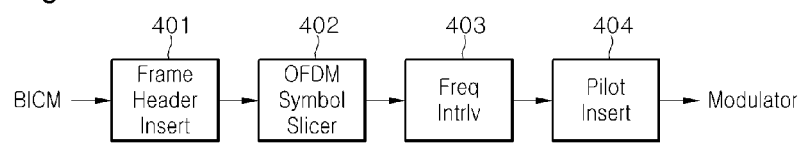
FIG. 9 is an example of frame builder.

FIG. 9 shows an example of a frame builder. A frame header inserting module 401 can form a frame from input symbol streams and can add frame header at front of each transmitted frame. The frame header can include the following information:

* Number of bonded channels (4 bits)
* Guard interval (2 bits)
* PAPR (2 bits)
* Pilot pattern (2 bits)
* Digital System identification (16 bits)
* Frame identification (16 bits)
* Frame length (16 bits) number of Orthogonal Frequency Division Multiplexing (OFDM) symbols per frame
* Superframe length (16 bits) number of frames per superframe
* number of PLPs (8 bits)
* for each PLP
  PLP identification (8 bits)
  Channel bonding id (4 bits)
  PLP start (9 bits)
  PLP type (2 bits) common PLP or others
  PLP payload type (5 bits)
  MC type (1 bit) fixed/variable modulation & coding
  if MC type == fixed modulation & coding
  FEC type (1 bits) long or short LDPC
  Coderate (3 bits)
  Modulation (3 bits) up-to 64K QAM
  end if;
  Number of notch channels (2 bits)
  for each notch
  Notch start (9 bits)
  Notch width (9 bits)
  end for;
  PLP width (9 bits) max number of FEC blocks of PLP
  PLP time interleaving type (2 bits)
  end for;
* CRC-32 (32 bits)

Channel bonding environment is assumed for L1 information transmitted in Frame header and data that correspond to each data slice is defined as PLP. Therefore, information such as PLP identifier, channel bonding identifier, and PLP start address are required for each channel used in bonding. One embodiment of this invention suggests transmitting ModCod field in FEC frame header if PLP type supports variable modulation/coding and transmitting ModCod field in Frame header if PLP type supports fixed modulation/coding to reduce signaling overhead. In addition, if a Notch band exists for each PLP, by transmitting the start address of the Notch and its width, decoding corresponding carriers at the receiver can become unnecessary.

Figure 10:
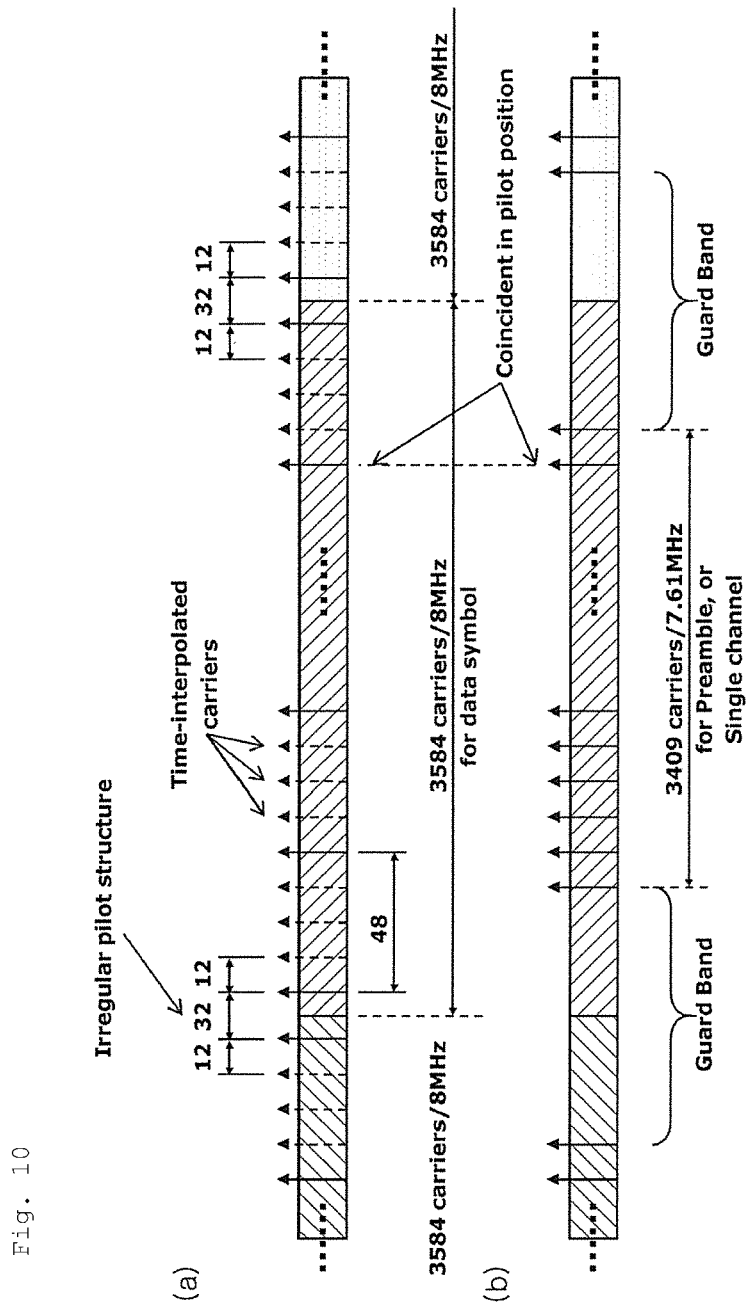
FIG. 10 is an example of pilot inserting module 404 shown in FIG. 4.

FIG. 10 shows an example of Pilot Pattern (PP5) applied in a channel bonding environment. As shown, if SP positions are coincident with preamble pilot positions, irregular pilot structure can occur.

FIG. 10a shows an example of pilot inserting module 404 as shown in FIG. 9. As represented in FIG. 10a, if a single frequency band (for example, 8 MHz) is used, the available bandwidth is 7.61 MHz, but if multiple frequency bands are bonded, guard bands can be removed, thus, frequency efficiency can increase greatly. FIG. 10b is an example of preamble inserting module 504 as shown in FIG. 18 that is transmitted at the front part of the frame and even with channel bonding, the preamble has repetition rate of 7.61 MHz, which is bandwidth of L1 block. This is a structure considering the bandwidth of a tuner which performs initial channel scanning.

Pilot Patterns exist for both Preamble and Data Symbols. For data symbol, scattered pilot (SP) patterns can be used. Pilot Pattern (PP5) and Pilot Pattern (PP7) of T2 can be good candidates for frequency-only interpolation. PP5 has x=12, y=4, z=48 for GI=1/64 and PP7 has x=24, y=4, z=96 for GI=1/128. Additional time-interpolation is also possible for a better channel estimation. Pilot patterns for preamble can cover all possible pilot positions for initial channel acquisition. In addition, preamble pilot positions should be coincident with SP positions and a single pilot pattern for both the preamble and the SP is desired. Preamble pilots could also be used for time-interpolation and every preamble could have an identical pilot pattern. These requirements are important for C2 detection in scanning and necessary for frequency offset estimation with scrambling sequence correlation. In a channel bonding environment, the coincidence in pilot positions should also be kept for channel bonding because irregular pilot structure may degrade interpolation performance.

In detail, if a distance z between scattered pilots (SPs) in an OFDM symbol is 48 and if a distance y between SPs corresponding to a specific SP carrier along the time axis is 4, an effective distance x after time interpolation becomes 12. This is when a guard interval (GI) fraction is 1/64. If GI fraction is 1/128, x=24, y=4, and z=96 can be used. If channel bonding is used, SP positions can be made coincident with preamble pilot positions by generating non-continuous points in scattered pilot structure.

At this time, preamble pilot positions can be coincident with every SP positions of data symbol. When channel bonding is used, data slice where a service is transmitted, can be determined regardless of 8 MHz bandwidth granularity. However, for reducing overhead for data slice addressing, transmission starting from SP position and ending at SP position can be chosen.

Figure 29:
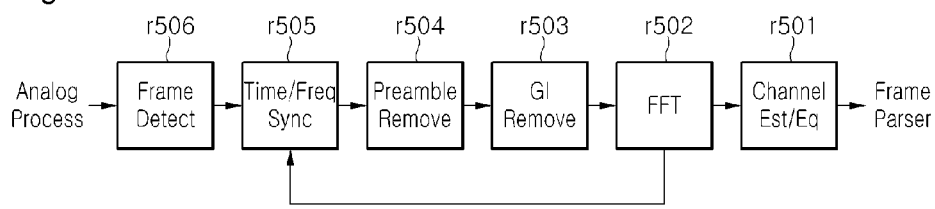
FIG. 29 is an example of demodulator.

When a receiver receives such SPs, if necessary, channel estimation (r501) shown in FIG. 29 can perform time interpolation to obtain pilots shown in dotted lines in FIGS. 10 and 10 and perform frequency interpolation. At this time, for non-continuous points of which intervals are designated as 32 in FIG. 10a, either performing interpolations on left and right separately or performing interpolations on only one side then performing interpolation on the other side by using the already interpolated pilot positions of which interval is 12 as a reference point can be implemented. At this time, data slice width can vary within 7.61 MHz, thus, a receiver can minimize power consumption by performing channel estimation and decoding only necessary subcarriers.

Figure 11:
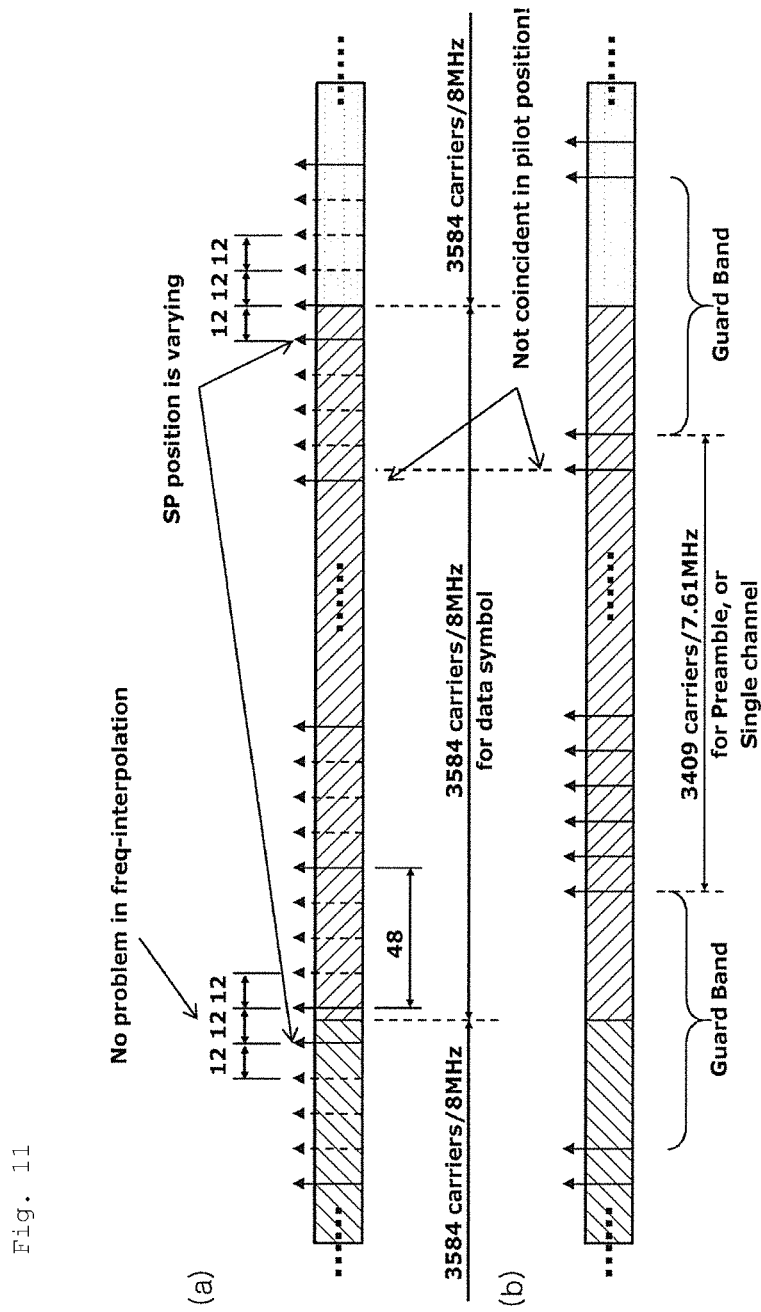
FIG. 11 is a structure of SP.

FIG. 11 shows another example of PP5 applied in channel bonding environment or a structure of SP for maintaining effective distance x as 12 to avoid irregular SP structure shown in FIG. 10 when channel bonding is used. As shown, if SP distance is kept consistent in case of channel bonding, there will be no problem in frequency interpolation but pilot positions between data symbol and preamble may not be coincident. In other words, this structure does not require additional channel estimation for an irregular SP structure, however, SP positions used in channel bonding and preamble pilot positions become different for each channel.

Figure 12:
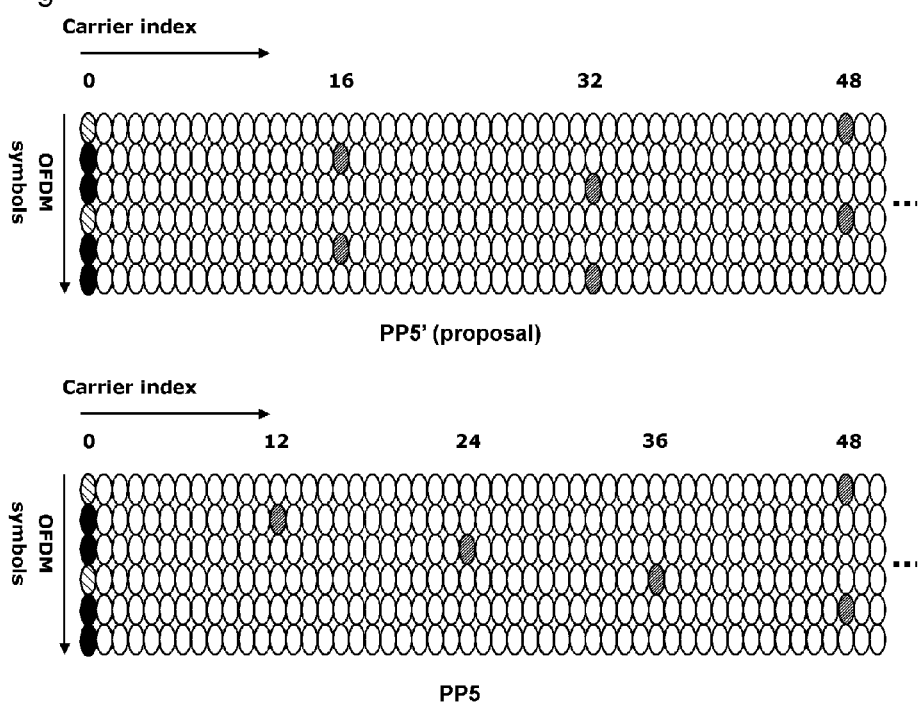
FIG. 12 is a new SP structure or Pilot Pattern (PP5).

FIG. 12 shows a new SP structure or PP5 to provide a solution to the two problems aforementioned in channel bonding environment. Specifically, a pilot distance of x=16 can solve those problems. To preserve pilot density or to maintain the same overhead, a PP5' can have x=16, y=3, z=48 for GI=1/64 and a PP7' can have x=16, y=6, z=96 for GI=1/128. Frequency-only interpolation capability can still be maintained. Pilot positions are depicted in FIG. 12 for comparison with PP5 structure.

Figure 13:
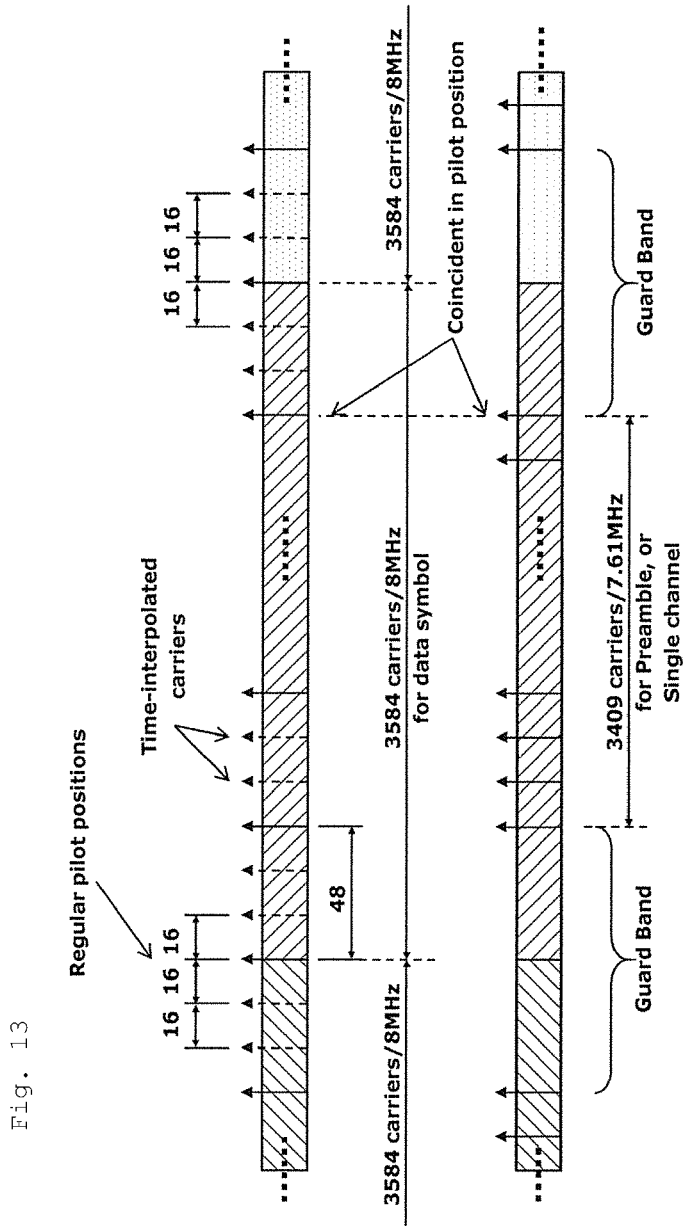
FIG. 13 is a suggested PP5 structure.
Figure 46:
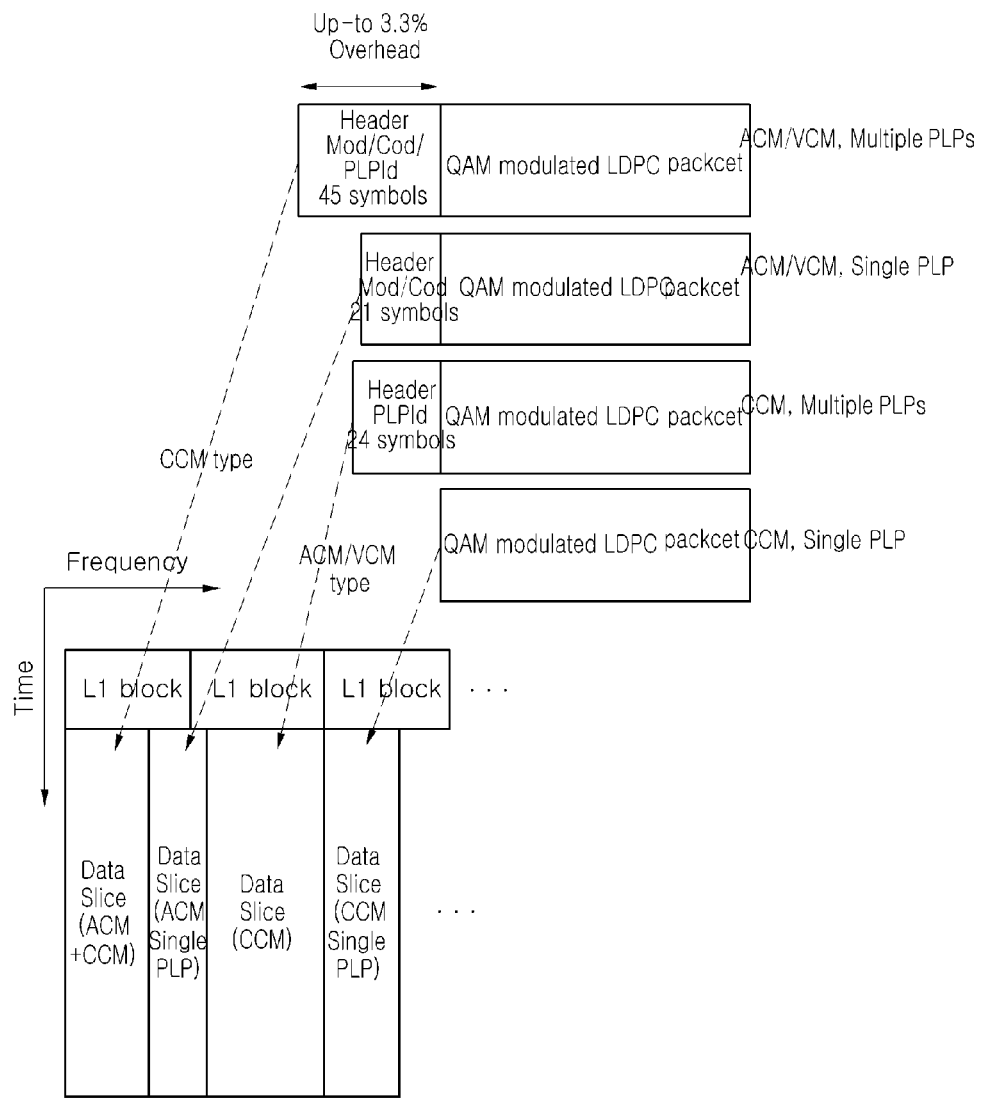
FIG. 46 is showing examples of a transmission frame and FEC frame structure.

FIG. 13 shows an example of a new SP Pattern or PP5 structure in channel bonding environment. As shown in FIG. 46, whether either single channel or channel bonding is used, an effective pilot distance x=16 can be provided. In addition, because SP positions can be made coincident with preamble pilot positions, channel estimation deterioration caused by SP irregularity or non-coincident SP positions can be avoided. In other words, no irregular SP position exists for freq-interpolator and coincidence between preamble and SP positions is provided.

Consequently, the proposed new SP patterns can be advantageous in that single SP pattern can be used for both single and bonded channel; no irregular pilot structure can be caused, thus a good channel estimation is possible; both preamble and SP pilot positions can be kept coincident; pilot density can be kept the same as for PP5 and PP7 respectively; and Frequency-only interpolation capability can also be preserved.

In addition, the preamble structure can meet the requirements such as preamble pilot positions should cover all possible SP positions for initial channel acquisition; maximum number of carriers should be 3409 (7.61 MHz) for initial scanning; exactly same pilot patterns and scrambling sequence should be used for C2 detection; and no detection-specific preamble like P1 in T2 is required.

In terms of relation with frame structure, data slice position granularity may be modified to 16 carriers rather than 12, thus, less position addressing overhead can occur and no other problem regarding data slice condition, Null slot condition etc can be expected.

Therefore, at channel estimation module r501 of FIG. 62, pilots in every preamble can be used when time interpolation of SP of data symbol is performed. Therefore, channel acquisition and channel estimation at the frame boundaries can be improved.

Now, regarding requirements related to the preamble and the pilot structure, there is consensus in that positions of preamble pilots and SPs should coincide regardless of channel bonding; the number of total carriers in L1 block should be dividable by pilot distance to avoid irregular structure at band edge; L1 blocks should be repeated in frequency domain; and L1 blocks should always be decodable in arbitrary tuner window position. Additional requirements would be that pilot positions and patterns should be repeated by period of 8 MHz; correct carrier frequency offset should be estimated without channel bonding knowledge; and L1 decoding (re-ordering) is impossible before the frequency offset is compensated.

Figure 14:
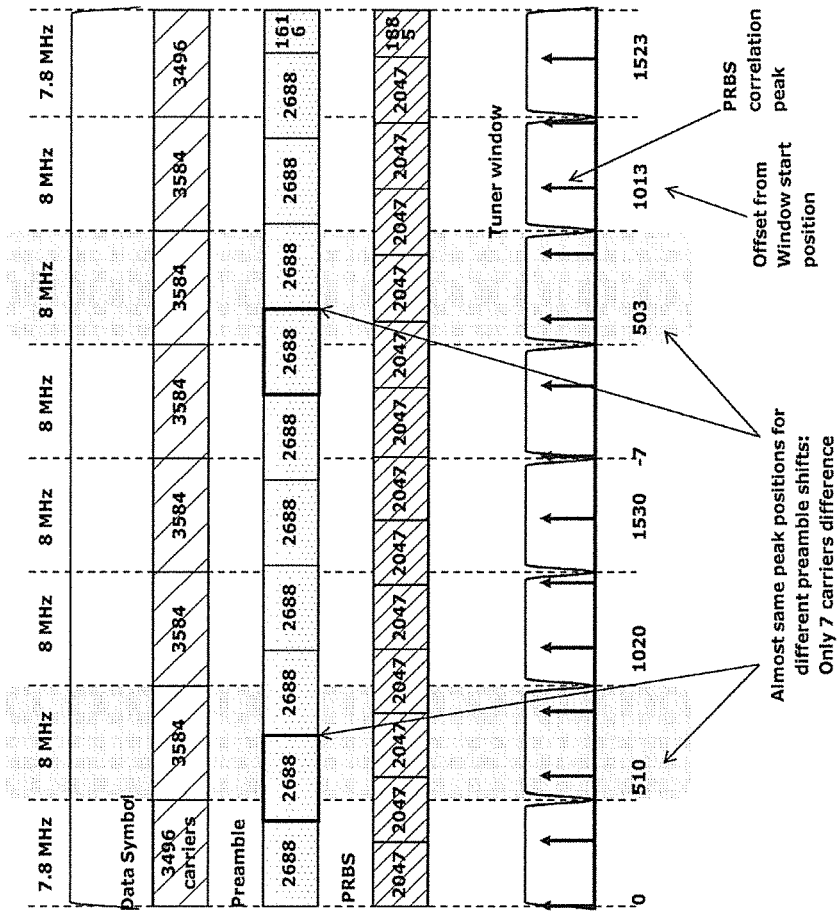
FIG. 14 is a relationship between data symbol and preamble.
Figure 20:
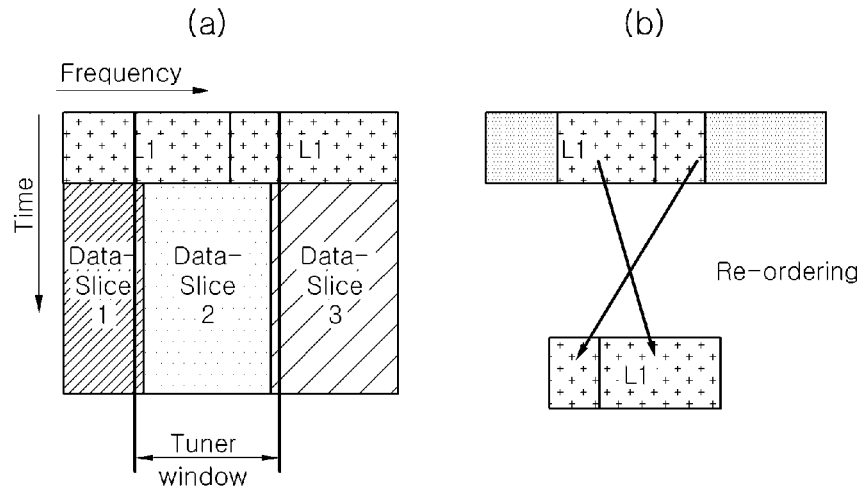
FIG. 20 is an example of Preamble decoding.

FIG. 14 shows a relationship between data symbol and preamble when preamble structures as shown in FIG. 19 and FIG. 20 are used. L1 block can be repeated by period of 6 MHz. For L1 decoding, both frequency offset and Preamble shift pattern should be found. L1 decoding is not possible in arbitrary tuner position without channel bonding information and a receiver cannot differentiate between preamble shift value and frequency offset.

Figure 30:
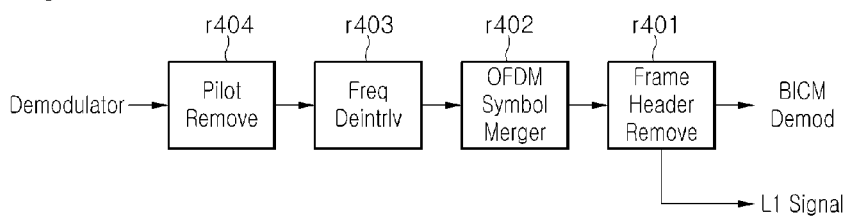
FIG. 30 is an example of frame parser.

Thus, a receiver, specifically for Frame header remover (r401) shown in FIG. 30 to perform L1 signal decoding, channel bonding structure needs to be obtained. Because preamble shift amount expected at two vertically shadowed regions in FIG. 30 is known, time/freq synchronizer r505 in FIG. 29 can estimate carrier frequency offset. Based on the estimation, L1 signaling path r308-1~r301-1 in FIG. 31 can decode L1 block.

Figures 15, 16:
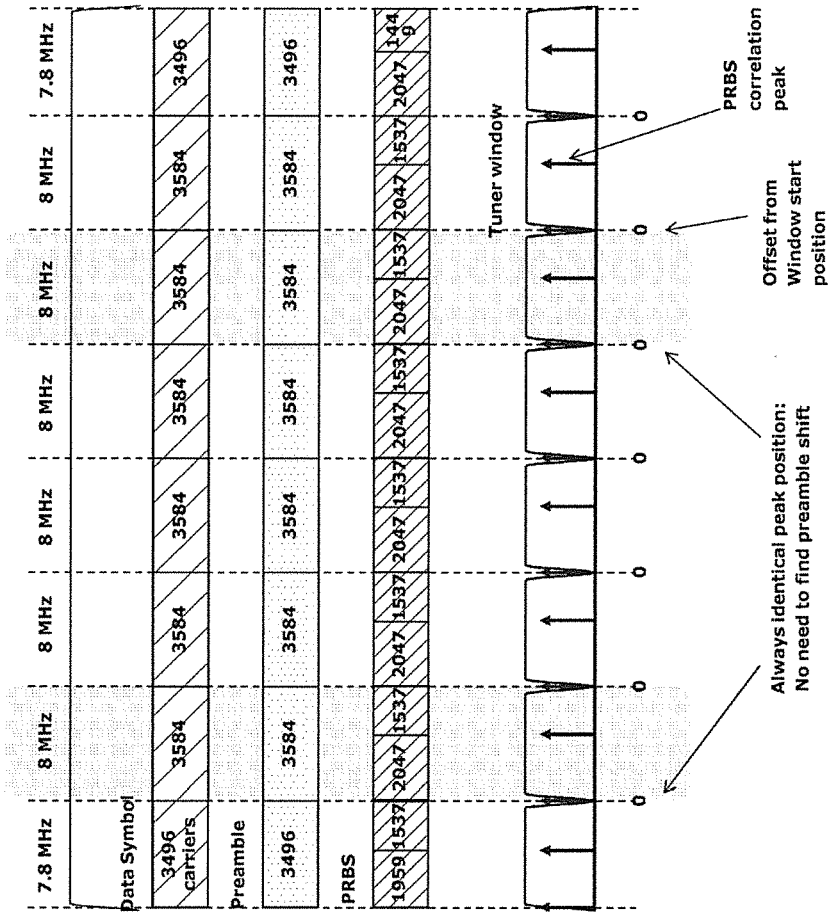
FIG. 15 is another relationship between data symbol and preamble.
FIG. 16 is an example of cable channel delay profile.
Figure 22:
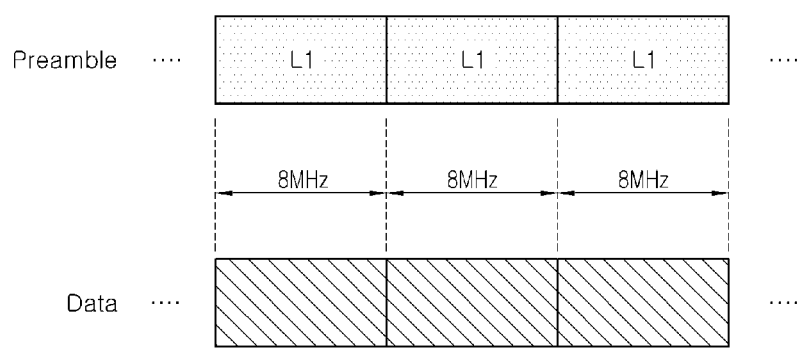
FIG. 22 is another example of preamble structure

FIG. 15 shows a relationship between data symbol and preamble when the preamble structure as shown in FIG. 22 is used. L1 block can be repeated by period of 8 MHz. For L1 decoding, only frequency offset needs to be found and channel bonding knowledge may not be required. Frequency offset can be easily estimated by using known Pseudo Random Binary Sequence (PRBS) sequence. As shown in FIG. 48, preamble and data symbols are aligned, thus, additional sync search can become unnecessary. Therefore, for a receiver, specifically for the Frame header remover r401 shown in FIG. 63, it is possible that only correlation peak with pilot scrambling sequence needs to be obtained to perform L1 signal decoding. The time/freq synchronizer r505 in FIG. 29 can estimate carrier frequency offset from peak position.

FIG. 16 shows an example of cable channel delay profile.

From the point of view of pilot design, current GI already over-protects delay spread of cable channel. In the worst case, redesigning the channel model can be an option. To repeat the pattern exactly every 8 MHz, the pilot distance should be a divisor of 3584 carriers (z=32 or 56). A pilot density of z=32 can increase pilot overhead, thus, z=56 can be chosen. Slightly less delay coverage may not be an important in cable channel. For example, it can be 8 µs for PP5' and 4 µs for PP7' compared to 9.3 µs (PP5) and 4.7 µs (PP7). Meaningful delays can be covered by both pilot patterns even in a worst case. For preamble pilot position, no more than all SP positions in data symbol are necessary.

If the −40 dB delay path can be ignored, actual delay spread can become 2.5 us, 1/64 GI=7 µs, or 1/128 GI=3.5 µs. This shows that pilot distance parameter, z=56 can be a good enough value. In addition, z=56 can be a convenient value for structuring pilot pattern that enables preamble structure shown in FIG. 48.

FIG. 17 shows scattered pilot structure that uses z=56 and z=112 which is constructed at pilot inserting module 404 in FIG. 42. PP5' (x=14, y=4, z=56) and PP7' (x=28, y=4, z=112) are proposed. Edge carriers could be inserted for closing edge.

Figure 50:
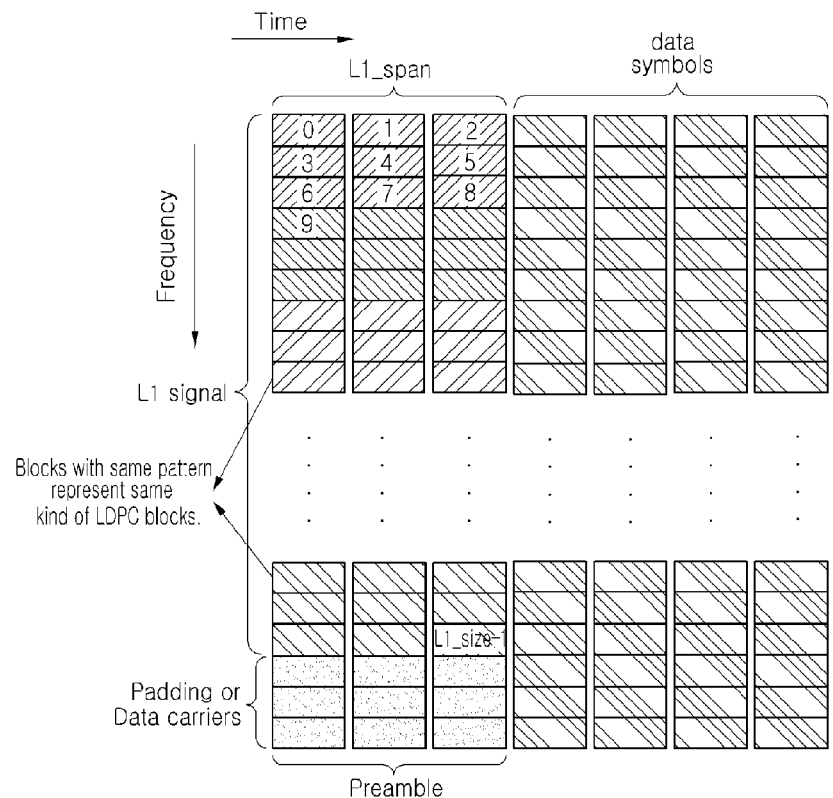
FIG. 50 is showing an L1 time interleaving.

As shown in FIG. 50, pilots are aligned at 8 MHz from each edge of the band, every pilot position and pilot structure can be repeated every 8 MHz. Thus, this structure can support the preamble structure shown in FIG. 48. In addition, a common pilot structure between preamble and data symbols can be used. Therefore, channel estimation module r501 in FIG. 29 can perform channel estimation using interpolation on preamble and data symbols because no irregular pilot pattern can occur, regardless of window position which is decided by data slice locations. At this time, using only frequency interpolation can be enough to compensate channel distortion from delay spread. If time interpolation is performed additionally, more accurate channel estimation can be performed.

Consequently, in the new proposed pilot pattern, pilot position and pattern can be repeated based on a period of 8 MHz. A single pilot pattern can be used for both preamble and data symbols. L1 decoding can always be possible without channel bonding knowledge. In addition, the proposed pilot pattern may not affect commonality with T2 because the same pilot strategy of scattered pilot pattern can be used; T2 already uses 8 different pilot patterns; and no significant receiver complexity can be increased by modified pilot patterns. For a pilot scrambling sequence, the period of PRBS can be 2047 (m-sequence); PRBS generation can be reset every 8 MHz, of which the period is 3584; pilot repetition rate of 56 can be also co-prime with 2047; and no PAPR issue can be expected.

FIG. 18 shows an example of a modulator based on OFDM. Input symbol streams can be transformed into time domain by IFFT module 501. If necessary, peak-to-average power ratio (PAPR) can be reduced at PAPR reducing module 502. For PAPR methods, Active constellation extension (ACE) or tone reservation can be used. GI inserting module 503 can copy a last part of effective OFDM symbol to fill guard interval in a form of cyclic prefix.

Preamble inserting module 504 can insert preamble at the front of each transmitted frame such that a receiver can detect digital signal, frame and acquire time/freq offset acquisition. At this time, the preamble signal can perform physical layer signaling such as FFT size (3 bits) and Guard interval size (3 bits). The Preamble inserting module 504 can be omitted if the modulator is specifically for DVB-C2.

Figure 51:
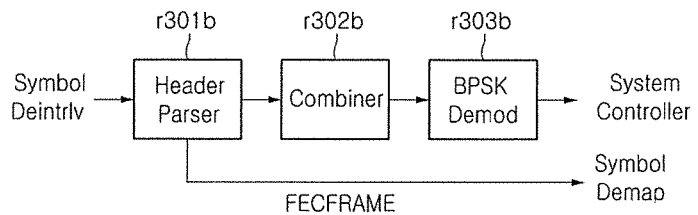
FIG. 51 is showing an example of extracting modulation and code information.

FIG. 19 shows an example of a preamble structure for channel bonding, generated at preamble inserting module 504 in FIG. 51. One complete L1 block should be "always decodable" in any arbitrary 7.61 MHz tuning window position and no loss of L1 signaling regardless of tuner window position should occur. As shown, L1 blocks can be repeated in frequency domain by period of 6 MHz. Data symbol can be channel bonded for every 8 MHz. If, for L1 decoding, a receiver uses a tuner such as the tuner r603 represented in FIG. 28 which uses a bandwidth of 7.61 MHz, the Frame header remover r401 in FIG. 30 needs to rearrange the received cyclic shifted L1 block (FIG. 20) to its original form. This rearrangement is possible because L1 block is repeated for every 6 MHz block.

Figure 21:
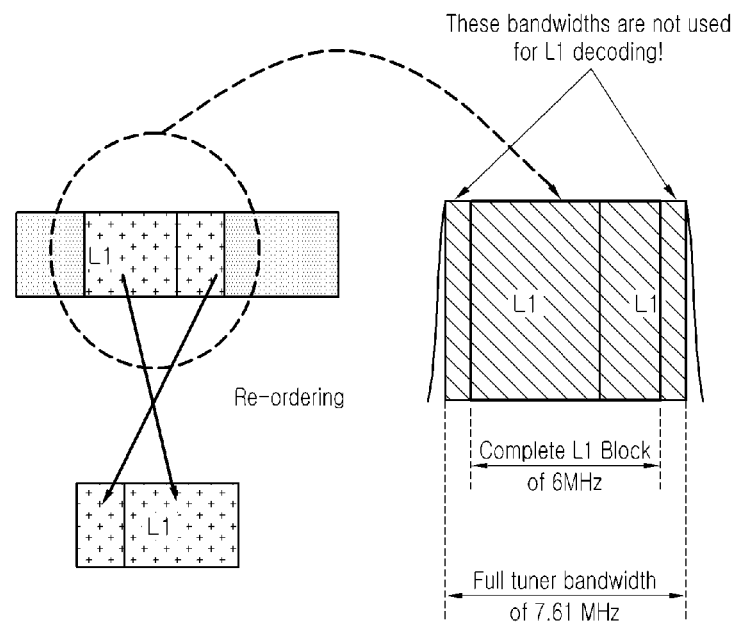
FIG. 21 is a process for designing more optimized preamble.

FIG. 21 shows a process for designing a more optimized preamble. The preamble structure of FIG. 19 uses only 6 MHz of total tuner bandwidth 7.61 MHz for L1 decoding. In terms of spectrum efficiency, tuner bandwidth of 7.61 MHz is not fully utilized. Therefore, there can be further optimization in spectrum efficiency.

Figure 57:
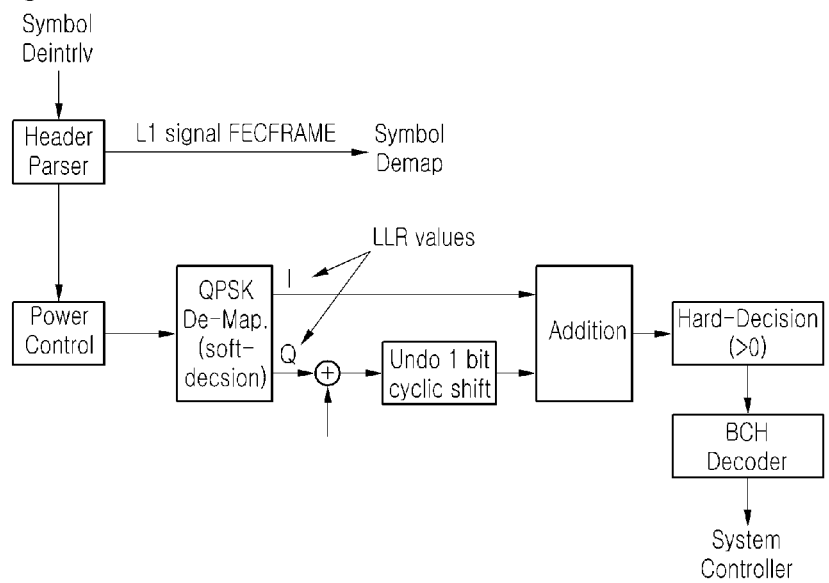
FIG. 57 is showing another example of extracting modulation and code information.

FIG. 22 shows another example of preamble structure or preamble symbols structure for full spectrum efficiency, generated at Frame Header Inserting module 401 in FIG. 42. Just like data symbol, L1 blocks can be repeated in frequency domain by period of 8 MHz. One complete L1 block is still always decodable in any arbitrary 7.61 MHz tuning window position. After tuning, the 7.61 MHz data can be regarded as a virtually punctured code. Having exactly the same bandwidth for both the preamble and data symbols and exactly the same pilot structure for both the preamble and data symbols can maximize spectrum efficiency. Other features such as cyclic shifted property and not sending L1 block in case of no data slice can be kept unchanged. In other words, the bandwidth of preamble symbols can be identical with the bandwidth of data symbols or, as shown in FIG. 57, the bandwidth of the preamble symbols can be the bandwidth of the tuner (here, it s 7.61 MHz). The tuner bandwidth can be defined as a bandwidth that corresponds to a number of total active carriers when a single channel is used. That is, the bandwidth of the preamble symbol can correspond to the number of total active carriers (here, it s 7.61 MHz).

Figure 23:
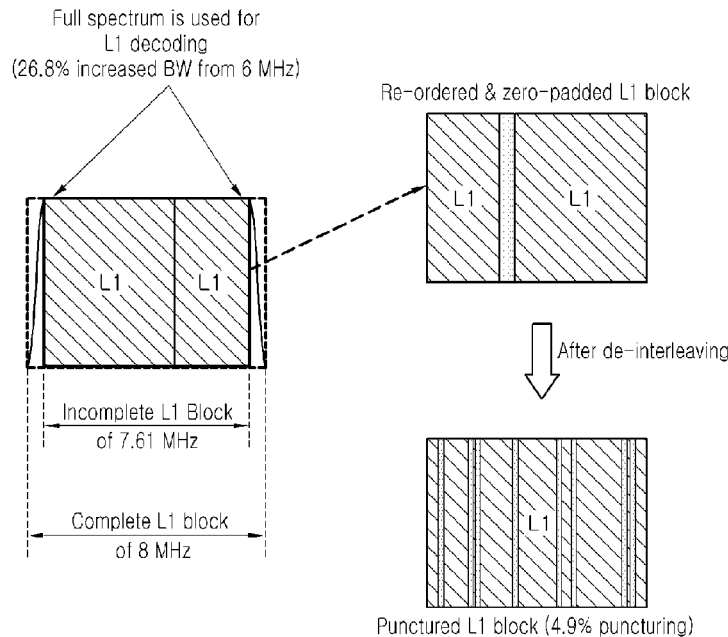
FIG. 23 is another example of Preamble decoding.
Figure 24:
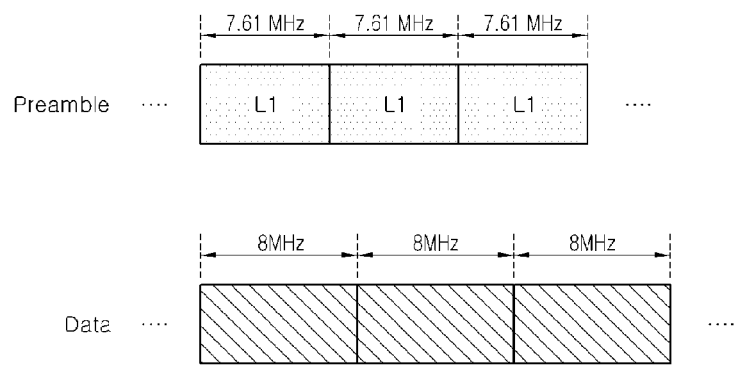
FIG. 24 is an example of Preamble structure.
Figure 56:
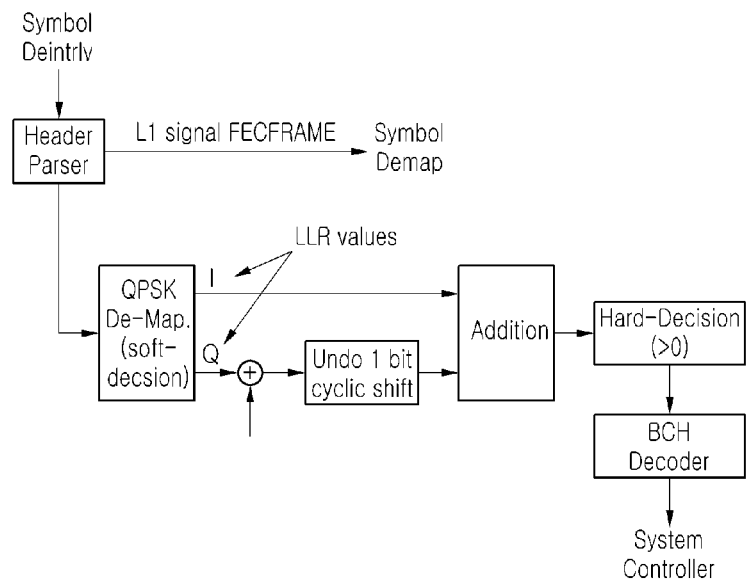
FIG. 56 is showing another example of extracting modulation and code information.

FIG. 23 shows a virtually punctured code. The 7.61 MHz data among the 8 MHz L1 block can be considered as punctured coded. When a tuner r603 shown in FIG. 28 uses 7.61 MHz bandwidth for L1 decoding, Frame header remover r401 in FIG. 30 needs to rearrange received, cyclic shifted L1 block into original form as shown in FIG. 56. At this time, L1 decoding is performed using the entire bandwidth of the tuner. Once the L1 block is rearranged, a spectrum of the rearranged L1 block can have a blank region within the spectrum as shown in upper right side of FIG. 23 because an original size of L1 block is 8 MHz bandwidth.

Figure 31:
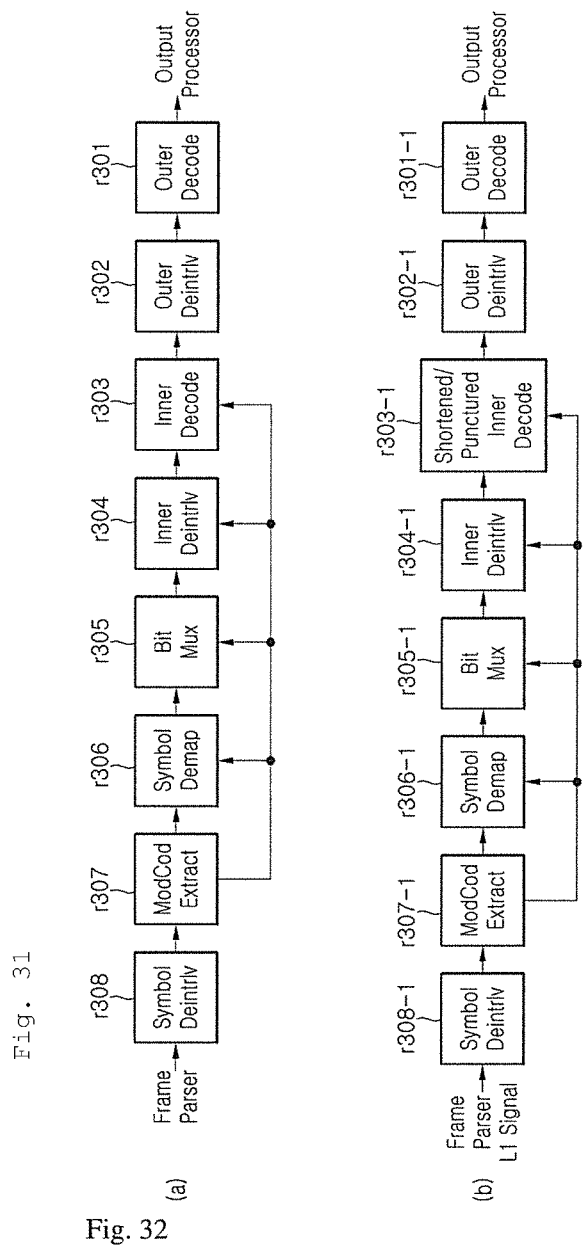
FIG. 31 is an example of BICM demodulator.

Once the blank region is zero padded, either after deinterleaving in symbol domain by the freq. deinterleaver r403 in FIG. 30 or by the symbol deinterleaver r308-1 in FIG. 31 or after deinterleaving in bit domain by the symbol demapper r306-1, bit mux r305-1, and inner deinterleaver r304-1 in FIG. 31, the block can have a form which appears to be punctured as shown in lower right side of FIG. 23.

This L1 block can be decoded at the punctured/shortened decoding module r303-1 in FIG. 31. By using these preamble structure, the entire tuner bandwidth can be utilized, thus spectrum efficiency and coding gain can be increased. In addition, an identical bandwidth and pilot structure can be used for the preamble and data symbols.

Figure 25:
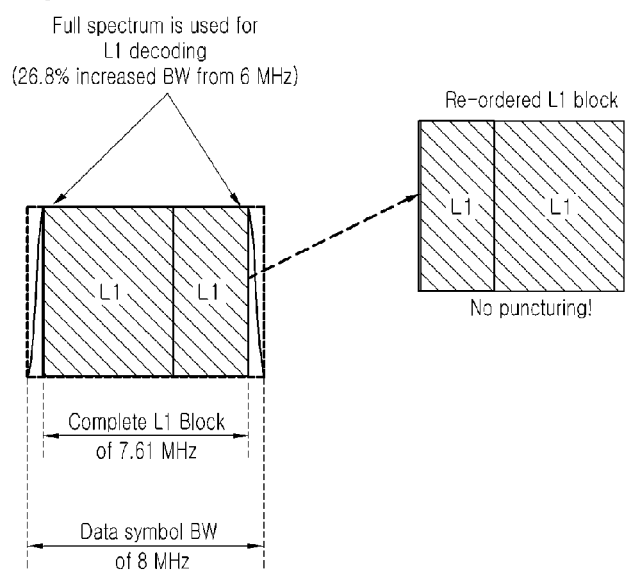
FIG. 25 is an example of L1 decoding.

In addition, if the preamble bandwidth or the preamble symbols bandwidth is set as a tuner bandwidth as shown in FIG. 25, (it s 7.61 MHz in the example), a complete L1 block can be obtained after rearrangement even without puncturing. In other words, for a frame having preamble symbols, wherein the preamble symbols have at least one layer 1 (L1) block, it can be said, the L1 block has 3408 active subcarriers and the 3408 active subcarriers correspond to 7.61 MHz of 8 MHz Radio Frequency (RF) band.

Thus, spectrum efficiency and L1 decoding performance can be maximized. In other words, at a receiver, decoding can be performed at punctured/shortened decoding module block r303-1 in FIG. 31, after performing only deinterleaving in the symbol domain.

Consequently, the proposed new preamble structure can be advantageous in that it s fully compatible with previously used preamble except that the bandwidth is different; L1 blocks are repeated by period of 8 MHz; L1 block can be always decodable regardless of tuner window position; Full tuner bandwidth can be used for L1 decoding; maximum spectrum efficiency can guarantee more coding gain; incomplete L1 block can be considered as punctured coded; simple and same pilot structure can be used for both preamble and data; and identical bandwidth can be used for both preamble and data.

Figure 26:
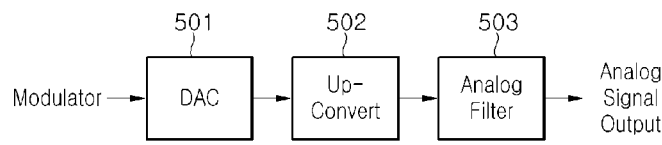
FIG. 26 is an example of analog processor.

FIG. 26 shows an example of an analog processor. A DAC (601) can convert digital signal input into analog signal. After transmission frequency bandwidth is up-converted at up-converter 602 and analog filtered signal through analog filter 603 can be transmitted.

Figure 27:
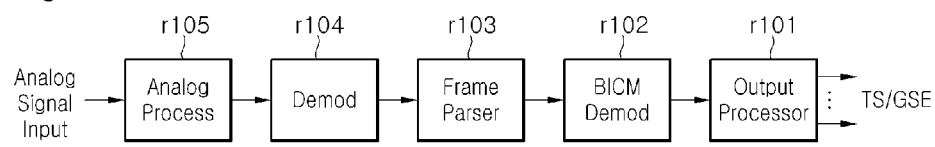
FIG. 27 is an example of digital receiver system.

FIG. 27 shows an example of a digital receiver system according to an embodiment of the present invention. Received signal is converted into digital signal at an analog processor r105. A demodulator r104 can convert the signal into data in frequency domain. A frame parser r103 can remove pilots and headers and enable selection of service information that needs to be decoded. A BICM demodulator r102 can correct errors in the transmission channel. An output processor r101 can restore the originally transmitted service stream and timing information.

Figure 28:
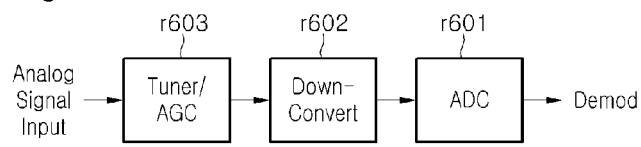
FIG. 28 is an example of analog processor used at receiver.

FIG. 28 shows an example of analog processor used at the receiver. A Tuner/AGC (Auto gain controller) module r603 can select desired frequency bandwidth from received signal. A down converter r602 can restore baseband. An ADC r601 can convert analog signal into digital signal.

FIG. 29 shows an example of demodulator. A frame detector r506 can detect the preamble, check if a corresponding digital signal exists, and detect a start of a frame. A time/freq synchronizer r505 can perform synchronization in time and frequency domains. At this time, for time domain synchronization, a guard interval correlation can be used. For frequency domain synchronization, correlation can be used or offset can be estimated from phase information of a subcarrier that is transmitted in the frequency domain. A preamble remover r504 can remove preamble from the front of detected frame. A GI remover r503 can remove guard interval. A FFT module r501 can transform signal in the time domain into signal in the frequency domain. A channel estimation/equalization module r501 can compensate errors by estimating distortion in transmission channel using pilot symbol. The Preamble remover r504 can be omitted if the demodulator is specifically for DVB-C2.

FIG. 30 shows an example of frame parser. A pilot remove (r404) can remove pilot symbol. A frequency deinterleaver r403 can perform deinterleaving in the frequency domain. An OFDM symbol merger r402 can restore data frame from symbol streams transmitted in OFDM symbols. A frame header remover r401 can extract physical layer signaling from header of each transmitted frame and remove header. Extracted information can be used as parameters for following processes in the receiver.

FIG. 31 shows an example of a BICM demodulator. FIG. 31a shows a data path and FIG. 31b shows a L1 signaling path. A symbol deinterleaver r308 can perform deinterleaving in the symbol domain. A ModCod extractor r307 can extract ModCod parameters from front of each BB frame and make the parameters available for following adaptive/variable demodulation and decoding processes. A Symbol demapper r306 can demap input symbol streams into bit Log-Likelyhood Ratio (LLR) streams. The Output bit LLR streams can be calculated by using a constellation used in a Symbol mapper 306 of the transmitter as reference point. At this point, when the aforementioned MQAM or NU-MQAM is used, by calculating both I axis and Q axis when calculating bit nearest from MSB and by calculating either I axis or Q axis when calculating the rest bits, an efficient symbol demapper can be implemented. This method can be applied to, for example, Approximate LLR, Exact LLR, or Hard decision.

When an optimized constellation according to constellation capacity and code rate of error correction code at the Symbol mapper 306 of the transmitter is used, the Symbol demapper r306 of the receiver can obtain a constellation using the code rate and constellation capacity information transmitted from the transmitter. The bit mux r305 of the receiver can perform an inverse function of the bit demux 305 of the transmitter. The Inner deinterleaver r304 and outer deinterleaver r302 of the receiver can perform inverse functions of the inner interleaver (304) and outer interleaver 302 of the transmitter, respectively to get the bitstream in its original sequence. The outer deinterleaver r302 can be omitted if the BICM demodulator is specifically for DVB-C2.

The inner decoder r303 and outer decoder r301 of the receiver can perform corresponding decoding processes to the inner coder 303 and outer coder 301 of the transmitter, respectively, to correct errors in the transmission channel.

Similar processes performed on data path can be performed on L1 signaling path, but with different parameters r308-1~r301-1. At this point, as explained in the preamble part, a shortened/punctured coding module r303-1 can be used for L1 signal decoding.

Figure 32:
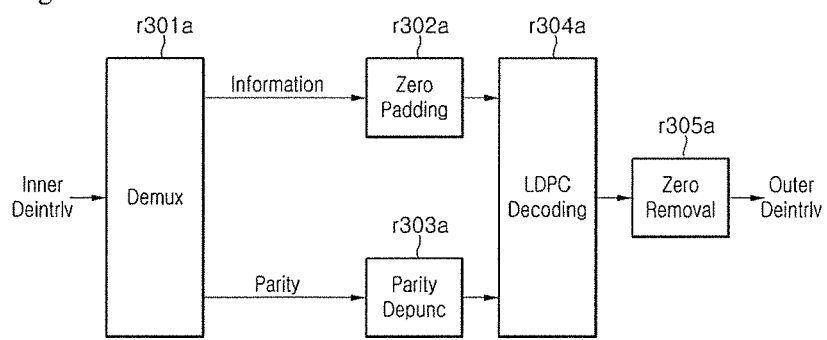
FIG. 32 is an example of LDPC decoding using shortening/puncturing.

FIG. 32 shows an example of LDPC decoding using shortening/puncturing module r303-1. A demux r301a can separately output information part and parity part of systematic code from input bit streams. For the information part, a zero padding module r302a can perform zero padding according to a number of input bit streams of LDPC decoder, and for the parity part, input bit streams for the LDPC decoder can be generated by de-puncturing the punctured part at the parity depuncturing module r303a. LDPC decoding by the module r304a can be performed on generated bit streams, and zeros in information part can be removed by the zero remover r305a and outputted.

Figure 33:
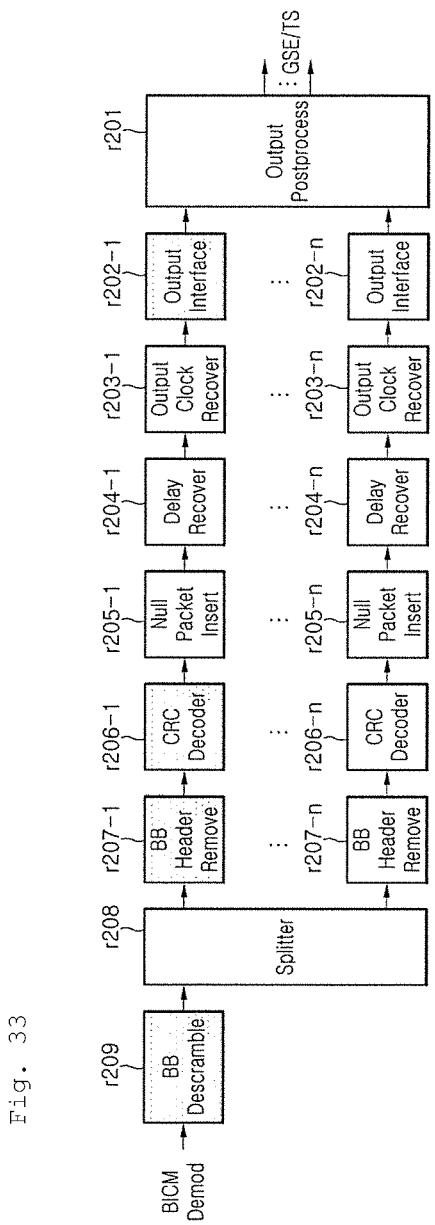
FIG. 33 is an example of output processor.

FIG. 33 shows an example of output processor. A BB descrambler r209 can restore scrambled bit streams at the transmitter. A Splitter r208 can restore BB frames that correspond to multiple PLP that are multiplexed and transmitted from the transmitter according to PLP path. For each PLP path, a BB header removers r207-1~n can remove the header that is transmitted at the front of the BB frame. A CRC decoder r206-1~n can perform CRC decoding and make reliable BB frames available for selection. A Null packet inserting module r205-1~n can restore null packets which were removed for higher transmission efficiency in their original location. A Delay recovering module r204-1~n can restore a delay that exists between each PLP path.

An output clock recovering module r203-1~n can restore the original timing of the service stream from timing information transmitted from the input stream synchronizer 203-1~n. An output interface module r202-1~n can restore data in TS/GS packet from input bit streams that are sliced in BB frame. An output postprocessor r201-1~n can restore multiple TS/GS streams into a complete TS/GS stream, if necessary. The shaded blocks shown in FIG. 33 represent modules that can be used when a single PLP is processed at a time and the rest of the blocks represent modules that can be used when multiple PLPs are processed at the same time.

Preamble pilot patterns were carefully designed to avoid PAPR increase, thus, whether L1 repetition rate may increase PAPR needs to be considered. The number of L1 information bits varies dynamically according to the channel bonding, the number of PLPs, etc. In detail, it is necessary to consider things such as fixed L1 block size may introduce unnecessary overhead; L1 signaling should be protected more strongly than data symbols; and time interleaving of L1 block can improve robustness over channel impairment such as impulsive noise need.

Figure 34:
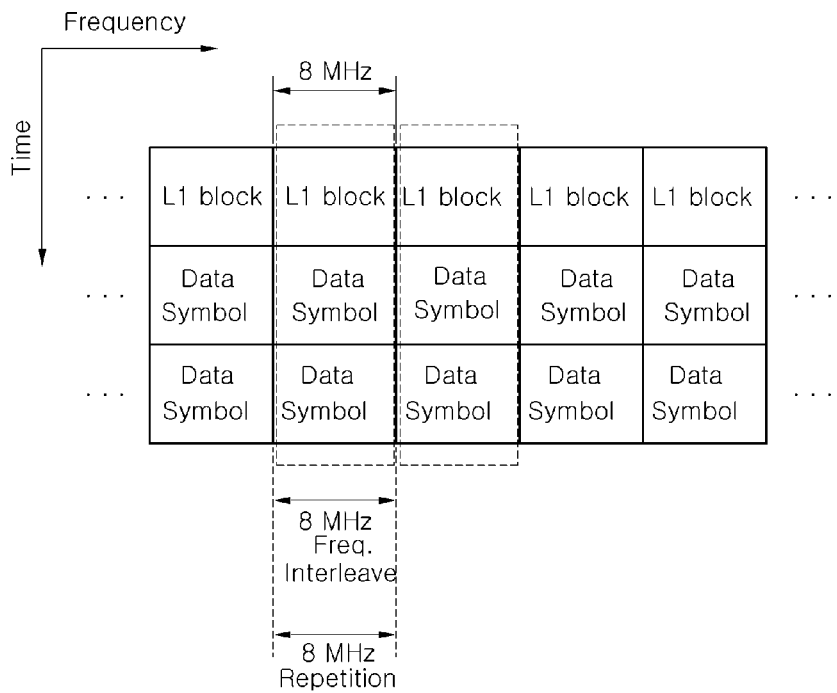
FIG. 34 is an example of L1 block repetition rate of 8 MHz.

For a L1 block repetition rate of 8 MHz, as shown in FIG. 34, full spectrum efficiency (26.8% BW increase) is exhibited with virtual puncturing but the PAPR may be increased since L1 bandwidth is the same as that of the data symbols. For the repetition rate of 8 MHz, 4K-FFT DVB-T2 frequency interleaving can be used for commonality and the same pattern can repeat itself at a 8 MHz period after interleaving.

Figure 35:
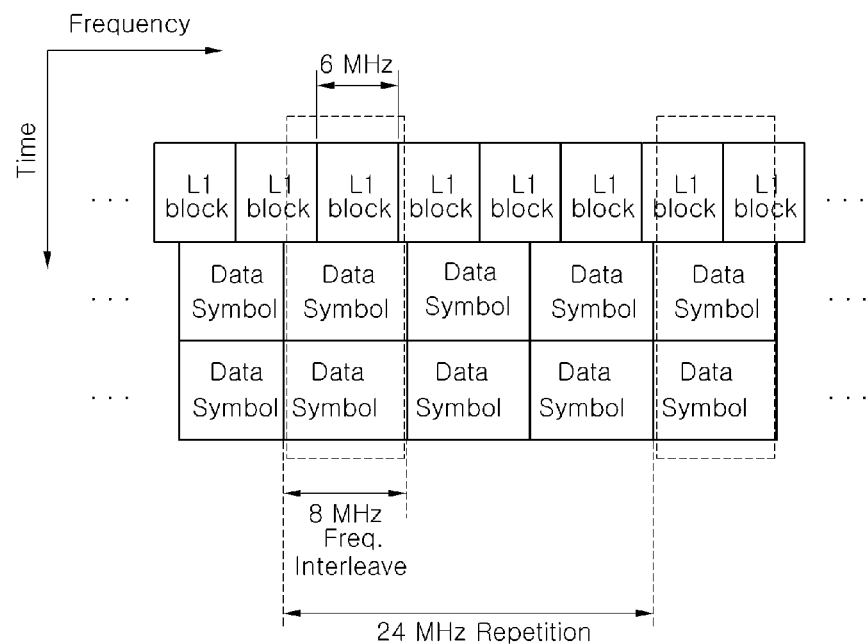
FIG. 35 is an example of L1 block repetition rate of 8 MHz.

For a L1 block repetition rate of 6 MHz, as shown in FIG. 35, reduced spectrum efficiency can be exhibited with no virtual puncturing. A similar problem of PAPR as for the 8 MHz case can occur since the L1 and data symbol bandwidths share LCM=24 MHz. For the repetition rate of 6 MHz, 4K-FFT DVB-T2 frequency interleaving can be used for commonality and the same pattern can repeat itself at a period of 24 MHz after interleaving.

FIG. 36 shows a new L1 block repetition rate of 7.61 MHz or full tuner bandwidth. A full spectrum efficiency (26.8% BW increase) can be obtained with no virtual puncturing. There can be no PAPR issue since L1 and data symbol bandwidths share LCM=1704 MHz. For the repetition rate of 7.61 MHz, 4K-FFT DVB-T2 frequency interleaving can be used for commonality and the same pattern can repeat itself by period of about 1704 MHz after interleaving.

FIG. 37 is an example of L1 signaling which is transmitted in the frame header. Each information in L1 signaling can be transmitted to the receiver and can be used as a decoding parameter. Especially, the information can be used in L1 signal path shown in FIG. 31 and PLPs can be transmitted in each data slice. An increased robustness for each PLP can be obtained.

Figures 38, 39:
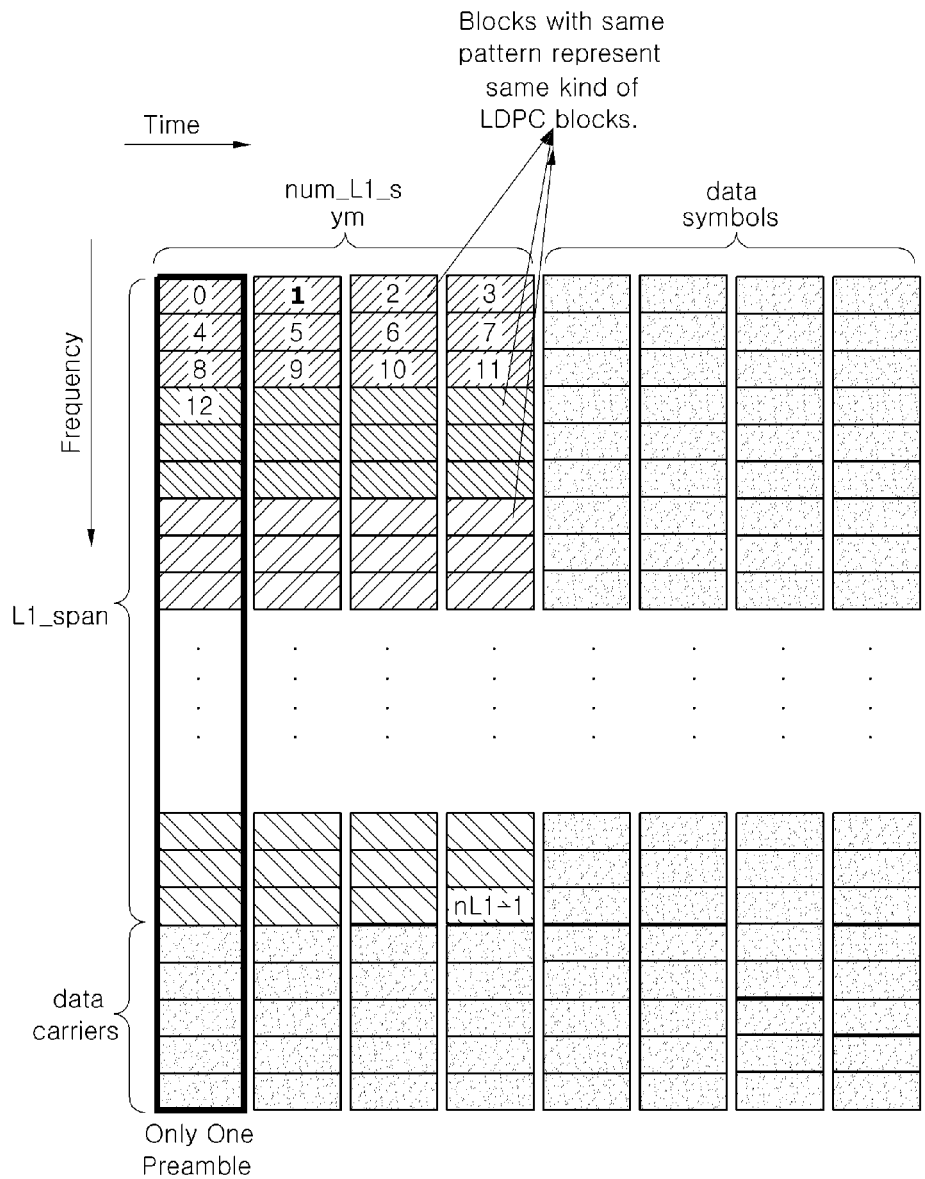
FIG. 38 is preamble and L1 Structure simulation result.
FIG. 39 is an example of symbol interleaver.

FIG. 39 is an example of a symbol interleaver 308-1 as shown in L1 signaling path in FIG. 4 and also can be an example of its corresponding symbol deinterleaver r308-1 as shown in L1 signaling path in FIG. 31. Blocks with tilted lines represent L1 blocks and solid blocks represent data carriers. L1 blocks can be transmitted not only within a single preamble, but also can be transmitted within multiple OFDM blocks. Depending on a size of L1 block, the size of the interleaving block can vary. In other words, num_L1_sym and L1 span can be different from each other. To minimize unnecessary overhead, data can be transmitted within the rest of the carriers of the OFDM symbols where the L1 block is transmitted. At this point, full spectrum efficiency can be guaranteed because the repeating cycle of L1 block is still a full tuner bandwidth. In FIG. 39, the numbers in blocks with tilted lines represent the bit order within a single LDPC block.

Figure 72:
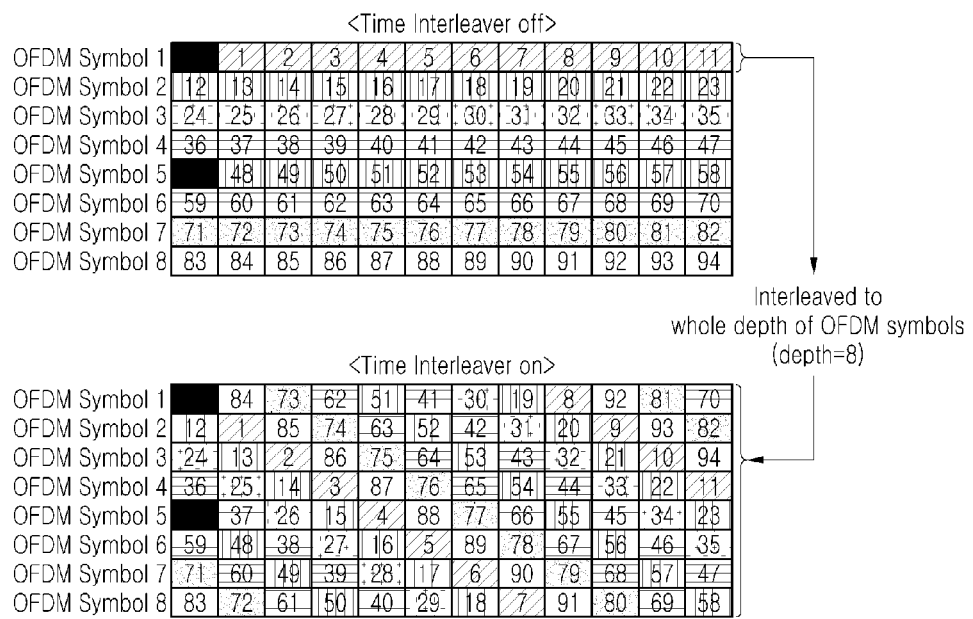
FIG. 72 is a result of interleaving using method shown in FIG. 71.

Consequently, when bits are written in an interleaving memory in the row direction according to a symbol index as shown in FIG. 72 and read in the column direction according to a carrier index, a block interleaving effect can be obtained. In other words, one LDPC block can be interleaved in the time domain and the frequency domain and then can be transmitted. Num_L1_sym can be a predetermined value, for example, a number between 2~4 can be set as a number of OFDM symbols. At this point, to increase the granularity of the L1 block size, a punctured/shortened LDPC code having a minimum length of the codeword can be used for L1 protection.

Figure 40:
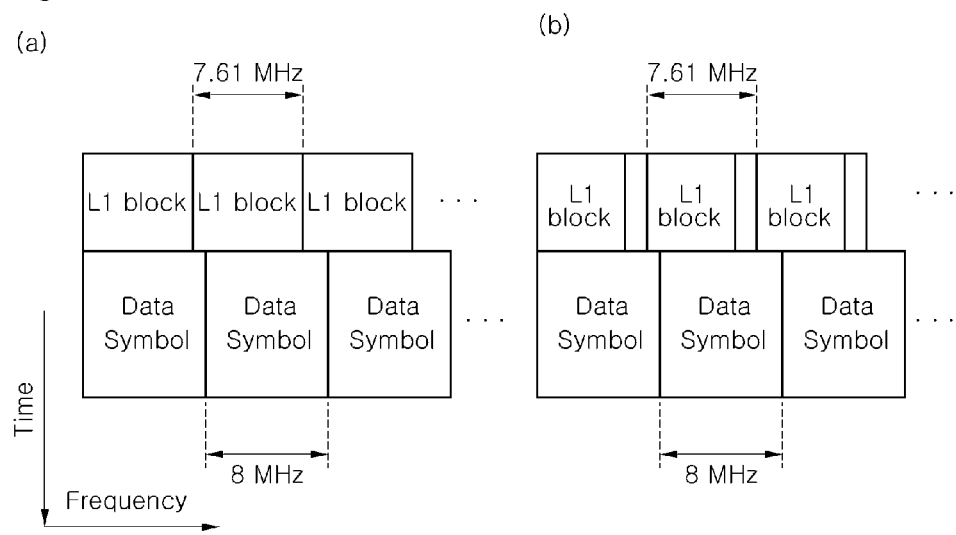
FIG. 40 is an example of an L1 block transmission.

FIG. 40 is an example of an L1 block transmission. FIG. 40 illustrates FIG. 39 in frame domain. As shown on the left side of FIG. 40, L1 blocks can be spanning in full tuner bandwidth or as shown on the right side of FIG. 40, L1 blocks can be partially spanned and the rest of the carriers can be used for data carrier. In either case, it can be seen that the repetition rate of L1 block can be identical to a full tuner bandwidth. In addition, for OFDM symbols which uses L1 signaling including preamble, only symbol interleaving can be performed while not allowing data transmission in that OFDM symbols. Consequently, for OFDM symbol used for L1 signaling, a receiver can decode L1 by performing deinterleaving without data decoding. At this point, the L1 block can transmit L1 signaling of current frame or L1 signaling of a subsequent frame. At the receiver side, L1 parameters decoded from L1 signaling decoding path shown in FIG. 31 can be used for decoding process for data path from frame parser of subsequent frame.

In summary, at a transmitter, interleaving blocks of L1 region can be performed by writing blocks to a memory in a row direction and reading the written blocks from the memory in a column direction. At a receiver, deinterleaving blocks of L1 region can be performed by writing blocks to a memory in a column direction and reading the written blocks from the memory in a row direction. The reading and writing directions of transmitter and receiver can be interchanged.

When simulation is performed with assumptions such as CR=½ for L1 protection and for T2 commonality; 16-QAM symbol mapping; pilot density of 6 in the Preamble; number of short LDPC implies required amount of puncturing/shortening are made, results or conclusions such as only preamble for L1 transmission may not be sufficient; the number of OFDM symbols depends on the amount of L1 block size; shortest LDPC codeword (e.g. 192 bits information) among shortened/punctured code may be used for flexibility and fine granularity; and Padding may be added if required with negligible overhead, can be obtained. The result is summarized in FIG. 38.

Consequently, for a L1 block repetition rate, full tuner bandwidth with no virtual puncturing can be a good solution and still no PAPR issue can arise with full spectrum efficiency. For L1 signaling, efficient signaling structure can allow maximum configuration in an environment of 8 channels bonding, 32 notches, 256 data slices, and 256 PLPs. For L1 block structure, flexible L1 signaling can be implemented according to L1 block size. Time interleaving can be performed for better robustness for T2 commonality. Less overhead can allow data transmission in preamble.

Block interleaving of L1 block can be performed for better robustness. The interleaving can be performed with fixed pre-defined number of L1 symbols (num_L1_sym) and a number of carriers spanned by L1 as a parameter (L1_span). The same technique is used for P2 preamble interleaving in DVB-T2.

L1 block of variable size can be used. Size can be adaptable to the amount of L1 signaling bits, resulting in a reduced overhead. Full spectrum efficiency can be obtained with no PAPR issue. Less than 7.61 MHz repetition can mean that more redundancy can be sent but unused. No PAPR issue can arise because of 7.61 MHz repetition rate for L1 block.

FIG. 41 is another example of L1 signaling transmitted within a frame header. FIG. 41 is different from FIG. 37 in that the L1_span field having 12 bits it is divided into two fields. In other words, the L1_span field is divided into a L1_column having 9 bits and a L1_row having 3 bits. The L1_column represents the carrier index that L1 spans. Because data slice starts and ends at every 12 carriers, which is the pilot density, the 12 bits of overhead can be reduced by 3 bits to reach 9 bits.

L1_row represents the number of OFDM symbols where L1 is spanning when time interleaving is applied. Consequently, time interleaving can be performed within an area of L1_columns multiplied by L1_rows. Alternatively, a total size of L1 blocks can be transmitted such that L1_span shown in FIG. 37 can be used when time interleaving is not performed. For such a case, L1 block size is 11,776×2 bits in the example, thus 15 bits is enough. Consequently, the L1_span field can be made up of 15 bits.

FIG. 42 is an example of frequency or time interleaving/deinterleaving. FIG. 42 shows a part of a whole transmission frame. FIG. 42 also shows bonding of multiple 8 MHz bandwidths. A frame can consist of a preamble which transmits L1 blocks and a data symbol which transmits data. The different kinds of data symbols represent data slices for different services. As shown in FIG. 42, the preamble transmits L1 blocks for every 7.61 MHz.

For the preamble, frequency or time interleaving is performed within L1 blocks and not performed between L1 blocks. That is, for the preamble, it can be said that interleaving is performed at L1 block level. This allows decoding the L1 blocks by transmitting L1 blocks within a tuner window bandwidth even when the tuner window has moved to a random location within a channel bonding system.

For decoding data symbol at a random tuner window bandwidth, interleaving between data slices should not occur. That is, for data slices, it can be said that interleaving is performed at data slice level. Consequently, frequency interleaving and time interleaving should be performed within a data slice. Therefore, a symbol interleaver 308 in a data path of a BICM module of transmitter as shown in FIG. 4 can perform symbol interleaving for each data slice. A symbol interleaver 308-1 in an L1 signal path can perform symbol interleaving for each L1 block.

A frequency interleaver 403 shown in FIG. 9 needs to perform interleaving on the preamble and data symbols separately. Specifically, for the preamble, frequency interleaving can be performed for each L1 block and for data symbol, frequency interleaving can be performed for each data slice. At this point, time interleaving in data path or L1 signal path may not be performed considering low latency mode.

Figure 76:
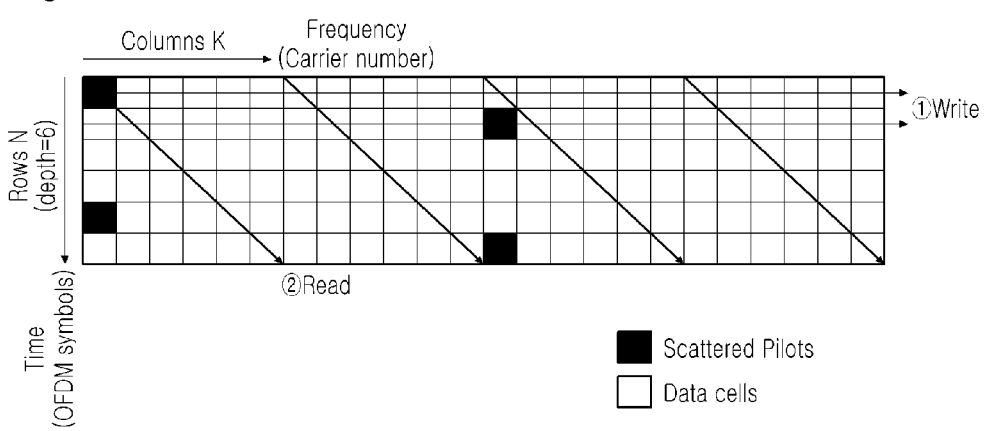
FIG. 76 is another example of deinterleaver.

FIG. 43 is a table analyzing overhead of L1 signaling which is transmitted in a FECFRAME header at the ModCod Header Insert (307) on the data path of the BICM module as shown in FIG. 37. As seen in FIG. 76, for short LDPC block (size=16200), a maximum overhead of 3.3% can occur which may not be negligible. In the analysis, 45 symbols are assumed for FECFRAME protection and the preamble is a C2 frame specific L1 signaling and FECFRAME header is FECFRAME specific L1 signaling i.e., Mod, Cod, and PLP identifier.

To reduce L1 overhead, approaches according to two Dataslice types can be considered. For ACM/VCM type and multiple PLP cases, frame can be kept same as for the FECFRAME header. For ACM/VCM type and single PLP cases, the PLP identifier can be removed from the FECFRAME header, resulting in up to 1.8% overhead reduction. For CCM type and multiple PLP cases, the Mod/Cod field can be removed from the FECFRAME header, resulting in up to 1.5% overhead reduction. For CCM type and single PLP cases, no FECFRAME header is required, thus, up to 3.3% of overhead reduction can be obtained.

In a shortened L1 signaling, either Mod/Cod (7 bits) or PLP identifier (8 bits) can be transmitted, but it can be too short to get any coding gain. However, it is possible not to require synchronization because PLPs can be aligned with the C2 transmission frame; every ModCod of each PLP can be known from the preamble; and a simple calculation can enable synchronization with the specific FECFRAME.

FIG. 44 is showing a structure for a FECFRAME header for minimizing the overhead. In FIG. 44, the blocks with tilted lines and the FECFRAME Builder represent a detail block diagram of the ModCod Header Inserting module 307 on data path of the BICM module as shown in FIG. 4. The solid blocks represent an example of inner coding module 303, inner interleaver 304, bit demux 305, and symbol mapper 306 on the data path of the BICM module as shown in FIG. 4. At this point, shortened L1 signaling can be performed because CCM does not require a Mod/Cod field and single PLP does not require a PLP identifier. On this L1 signal with a reduced number of bits, the LI signal can be repeated three times in the preamble and BPSK modulation can be performed, thus, a very robust signaling is possible. Finally, the ModCod Header Inserting module 307 can insert the generated header into each FEC frame. FIG. 51 is showing an example of the ModCod extractor r307 on the data path of BICM demod module shown in FIG. 31.

As shown in FIG. 51, the FECFRAME header can be parsed at the parser r301*b*, then symbols which transmit identical information in repeated symbols can be delayed, aligned, and then combined at Rake combining module r302b. Finally, when BPSK demodulation is performed at module r303b, received L1 signal field can be restored and this restored L1 signal field can be sent to the system controller to be used as parameters for decoding. Parsed FECFRAME can be sent to the symbol demapper.

FIG. 45 is showing a bit error rate (BER) performance of the aforementioned L1 protection. It can be seen that about 4.8 dB of SNR gain is obtained through a three time repetition. Required SNR is 8.7 dB at BER=1E-11.

FIG. 46 is showing examples of transmission frame and FEC frame structures. The FEC frame structures shown on the upper right side of FIG. 46 represent FECFRAME header inserted by the ModCod Header Inserting module 307 in FIG. 4. It can be seen that depending on various combinations of conditions i.e., CCM or ACM/VCM type and single or multiple PLP, different size of headers can be inserted. Or, no header can be inserted. Transmission frames formed according to data slice types and shown on the lower left side of FIG. 46 can be formed by the Frame header inserting module 401 of the Frame builder as shown in FIG. 9 and the merger/slicer 208 of the input processor shown in FIG. 2. At this point, the FECFRAME can be transmitted according to different types of data slice. Using this method, a maximum of 3.3% of overhead can be reduced. In the upper right side of the FIG. 79, four different types of structures are shown, but a skilled person in the art would understand that these are only examples, and any of these types or their combinations can be used for the data slice.

At the receiver side, the Frame header remover r401 of the Frame parser module as shown in FIG. 30 and the ModCod extractor r307 of the BICM demod module shown in FIG. 31 can extract a ModCod field parameter which is required for decoding. At this point, according to the data slice types of transmission frame parameters can be extracted. For example, for CCM type, parameters can be extracted from L1 signaling which is transmitted in the preamble and for ACM/VCM type, parameters can be extracted from the FECFRAME header.

Figure 79:
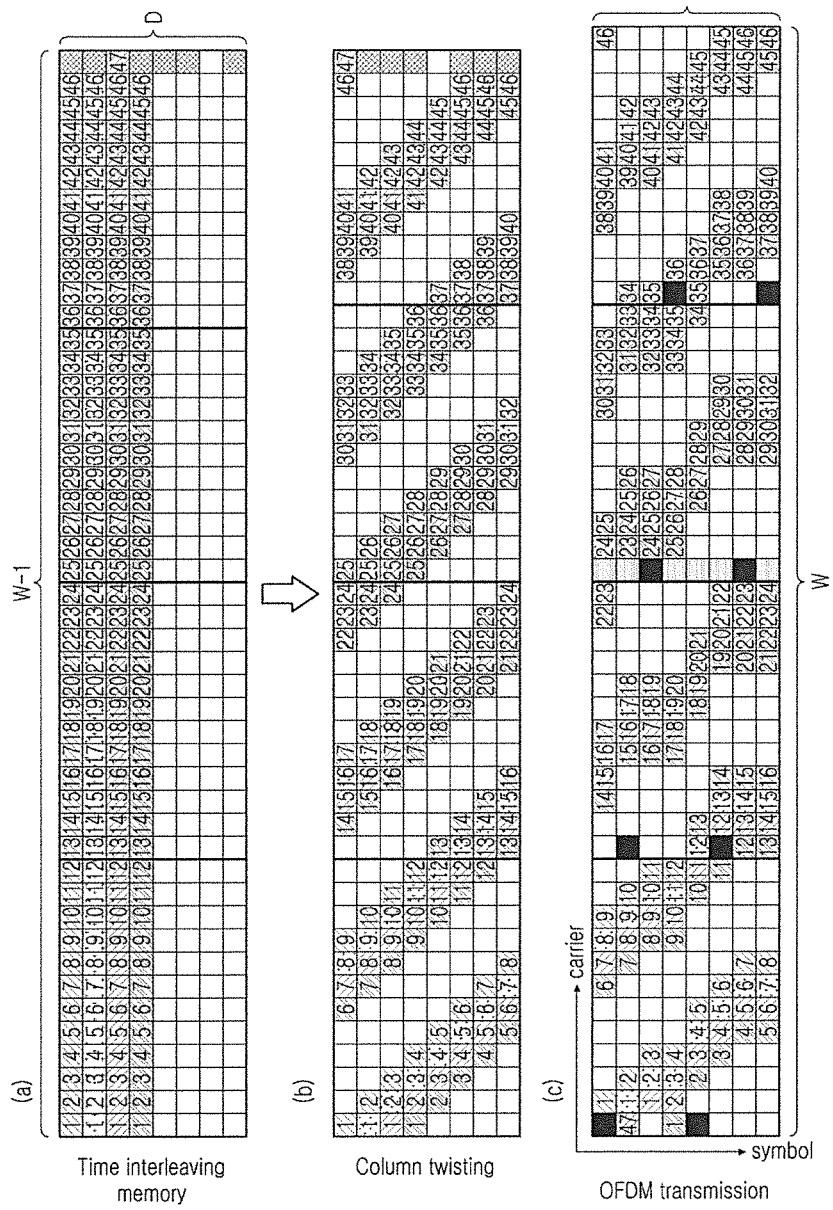
FIG. 79 shows an example of general block interleaving in a data symbol domain where pilots are not used.

As shown in the upper right side of FIG. 79, the fecframe structure can be divided into two groups, in which the first group is the upper three frame structures with header and the second group is the last frame structure without header.

FIG. 47 is showing an example of L1 signaling which can be transmitted within the preamble by the Frame header inserting module 401 of the Frame builder module shown in FIG. 42. This L1 signaling is different from the previous L1 signaling in that L1 block size can be transmitted in bits (L1_size, 14 bits); turning on/off time interleaving on data slice is possible (dslice_time_intrlv, 1 bit); and by defining data slice type (dslice_type, 1 bit), L1 signaling overhead is reduced. At this point, when the data slice type is CCM, the Mod/Cod field can be transmitted within the preamble rather than within the FECFRAME header (plp_mod (3 bits), plp_fec_type (1 bit), plp_cod (3 bits)).

At the receiver side, the shortened/punctured inner decoding module r303-1 of the BICM demod as shown in FIG. 31 can obtain the first LDPC block, which has a fixed L1 block size, transmitted within the preamble, through decoding. The numbers and size of the rest of the LDPC blocks can also be obtained.

Time interleaving can be used when multiple OFDM symbols are needed for L1 transmission or when there is a time-interleaved data slice. A flexible on/off of the time interleaving is possible with an interleaving flag. For preamble time interleaving, a time interleaving flag (1 bit) and a number of OFDM symbols interleaved (3 bits) may be required, thus, a total of 4 bits can be protected by a way similar to a shortened FECFRAME header.

FIG. 48 is showing an example of L1-pre signaling that can be performed at the ModCod Header Inserting module 307-1 on the data path of BICM module shown in FIG. 4. The blocks with tilted lines and Preamble Builder are examples of the ModCod Header Inserting module 307-1 on the L1 signaling path of the BICM module shown in FIG. 4. The solid blocks are examples of the Frame header inserting module 401 of the Frame builder as shown in FIG. 42.

Also, the solid blocks can be examples of shortened/punctured inner coding module 303-1, inner interleaver 304-1, bit demux 305-1, and symbol mapper 306-1 on L1 signaling path of BICM module shown in FIG. 4.

As seen in FIG. 48, the L1 signal that is transmitted in the preamble can be protected using shortened/punctured LDPC encoding. Related parameters can be inserted into the Header in a form of L1-pre signaling. At this point, only time interleaving parameters can be transmitted in the Header of the preamble. To ensure more robustness, a four times repetition can be performed. At the receiver side, to be able to decode the L1 signal that is transmitted in the preamble, the ModCod extractor r307-1 on the L1 signaling path of BICM demod as shown in FIG. 31 needs to use the decoding module shown in FIG. 18. At this point, because there is a four times repetition unlike the previous decoding FECFRAME header, a Rake receiving process which synchronizes the four times repeated symbols and adding the symbols, is required.

Figure 49:
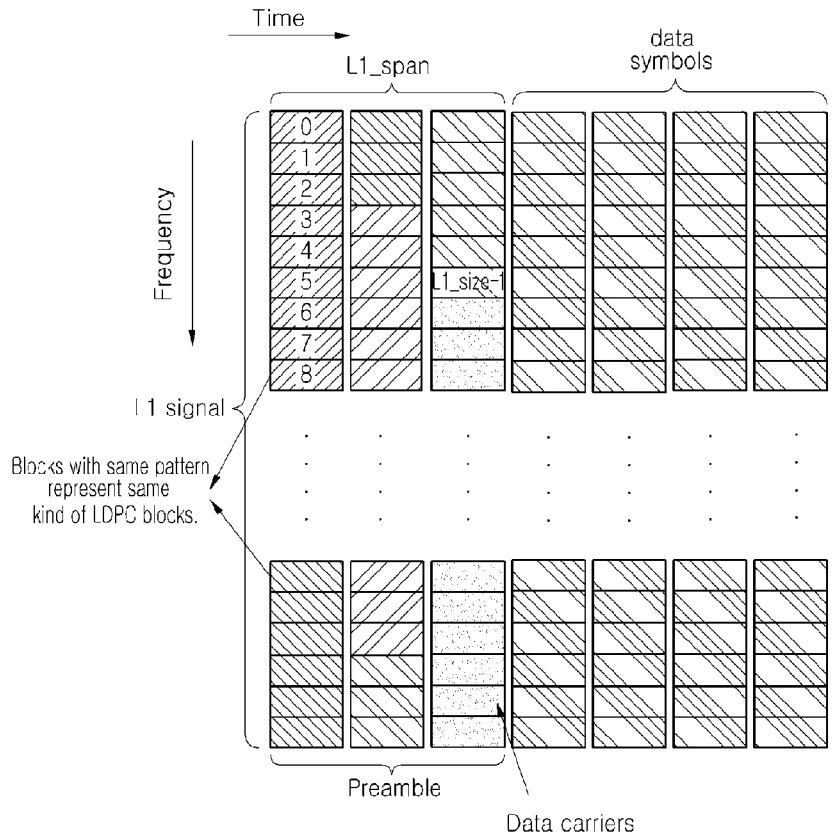
FIG. 49 is showing a structure of L1 signaling block.

FIG. 49 shows a structure of L1 the signaling block that is transmitted from the Frame header inserting module 401 of the Frame builder module as shown in FIG. 42. It is showing a case where no time interleaving is used in a preamble. As shown in FIG. 49, different kind of LDPC blocks can be transmitted in the order of the carriers. Once an OFDM symbol is formed and transmitted then a following OFDM symbol is formed and transmitted. For the last OFDM symbol to be transmitted, if there is any carrier left, that carriers can be used for data transmission or can be dummy padded. The example in FIG. 49 shows a preamble that comprises three OFDM symbol. At a receiver side, for this non-interleaving case, the symbol deinterleaver r308-1 on the L1 signaling path of BICM demod as shown in FIG. 31 can be skipped.

FIG. 50 shows a case where L1 time interleaving is performed. As shown in FIG. 50, block interleaving can be performed in a fashion of forming an OFDM symbol for identical carrier indices then forming an OFDM symbols for the next carrier indices. As in the case where no interleaving is performed, if there is any carrier left, that carriers can be used for data transmission or can be dummy padded. At a receiver side, for this non-interleaving case, the symbol deinterleaver r308-1 on the L1 signaling path of the BICM demod shown in FIG. 31 can perform block deinterleaving by reading LDPC blocks in increasing order of numbers of the LDPC blocks.

In addition, there can be at least two types of data slices. Data slice type 1 has dslice_type=0 in L1 signaling fields. This type of data slice has no XFECFrame header and has its mod/cod values in L1 signaling fields. Data slice type 2 has dslice_type=1 in L1 signaling fields. This type of data slice has XFECFrame header and has its mod/cod values in XFECFrame header.

XFECFrame means XFEC (compleX Forward Error Correction) Frame and mod/cod means modulation type/coderate.

At a receiver, a frame parser can form a frame from demodulated signals. The frame has data symbols and the data symbols can have a first type of data slice which has an XFECFrame and an XFECFrame header and a second type of data slice which has XFECFrame without XFECFrame header. Also, a receiver can extract a field for indicating whether to perform time de-interleaving on the preamble symbols or not to perform time de-interleaving on the preamble symbols, from the L1 of the preamble symbols.

At a transmitter, a frame builder can build a frame. Data symbols of the frame comprise a first type of data slice which has an XFECFrame and an XFECFrame header and a second type of data slice which has XFECFrame without XFECFrame header. In addition, a field for indicating whether to perform time interleaving on preamble symbols or not to perform time interleaving on preamble symbols can be inserted in L1 of the preamble symbols.

Lastly, for shortened/punctured code for the Frame header inserting module 401 of the Frame builder shown in FIG. 9, a minimum size of codeword that can obtain coding gain can be determined and can be transmitted in a first LDPC block. In this manner, for the rest of LDPC block sizes can be obtained from that transmitted L1 block size.

Figure 52:
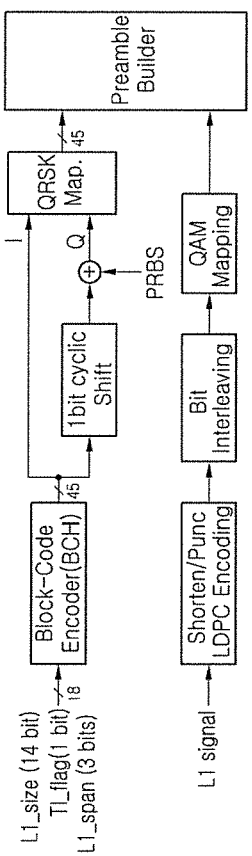
FIG. 52 is showing another example of L1-pre signaling.

FIG. 52 is showing another example of L1-pre signaling that can be transmitted from ModCod Header Inserting module 307-1 on L1 signaling path of BICM module shown in FIG. 4. FIG. 52 is different from FIG. 48 in that Header part protection mechanism has been modified. As seen in FIG. 52, L1 block size information L1_size (14 bits) is not transmitted in L1 block, but transmitted in Header. In the Header, time interleaving information of 4 bits can be transmitted too. For total of 18 bits of input, BCH (45, 18) code which outputs 45 bits are used and copied to the two paths and finally, QPSK mapped. For the Q-path, 1 bit cyclic shift can be performed for diversity gain and PRBS modulation according to sync word can be performed. Total of 45 QPSK symbols can be output from these I/Q path inputs. At this point, if time interleaving depth is set as a number of preambles that is required to transmit L1 block, L1_span (3 bits) that indicates time interleaving depth may not need to be transmitted. In other words, only time interleaving on/off flag (1 bit) can be transmitted. At a receiver side, by checking only a number of transmitted preambles, without using L1_span, time deinterleaving depth can be obtained.

Figure 53:
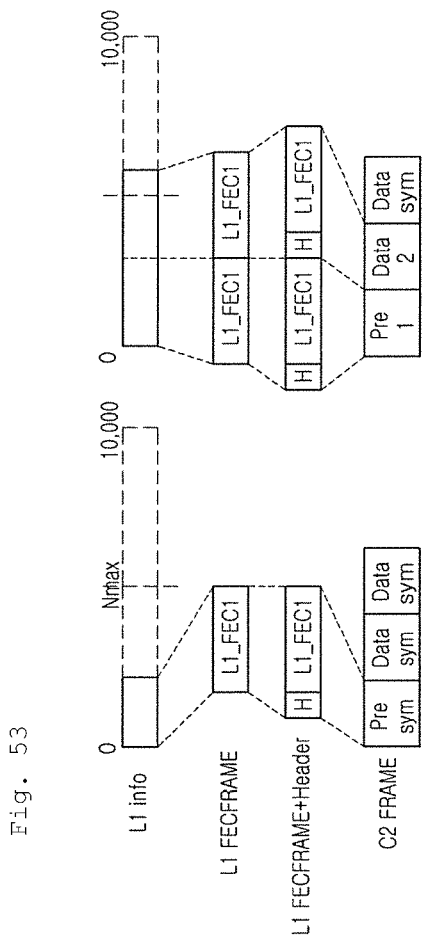
FIG. 53 is showing an example of scheduling of L1 signaling block that is transmitted in preamble.

FIG. 53 is showing an example of scheduling of L1 signaling block that is transmitted in preamble. If a size of L1 information that can be transmitted in a preamble is Nmax, when L1 size is smaller than Nmax, one preamble can transmit the information. However, when L1 size is bigger than Nmax, L1 information can be equally divided such that the divided L1 sub-block is smaller than Nmax, then the divided L1 sub-block can be transmitted in a preamble. At this point, for a carrier that is not used because of L1 information being smaller than Nmax, no data are transmitted.

Instead, as shown in FIG. 55, power of carriers where L1 block are transmitted can be boosted up to maintain a total preamble signal power equal to data symbol power. Power boosting factor can be varied depending on transmitted L1 size and a transmitter and a receiver can have a set value of this power boosting factor. For example, if only a half of total carriers are used, power boosting factor can be two.

FIG. 54 is showing an example of L1-pre signaling where power boosting is considered. When compared to FIG. 52, it can be seen that power of QPSK symbol can be boosted and sent to preamble builder.

FIG. 56 is showing another example of ModCod extractor r307-1 on L1 signaling path of BICM demod module shown in FIG. 31. From input preamble symbol, L1 signaling FEC-FRAME can be output into symbol demapper and only header part can be decoded.

For input header symbol, QPSK demapping can be performed and Log-Likelihood Ratio (LLR) value can be obtained. For Q-path, PRBS demodulation according to sync word can be performed and a reverse process of the 1-bit cyclic shift can be performed for restoration.

These aligned two I/Q path values can be combined and SNR gain can be obtained. Output of hard decision can be input into BCH decoder. The BCH decoder can restore 18 bits of L1-pre from the input 45 bits.

FIG. 57 is showing a counterpart, ModCod extractor of a receiver. When compared to FIG. 56, power control can be performed on QPSK demapper input symbols to restore from power level boosted by transmitter to its original value. At this point, power control can be performed by considering a number of carriers used for L1 signaling in a preamble and by taking an inverse of obtained power boosting factor of a transmitter. The power boosting factor sets preamble power and data symbol power identical to each other.

Figure 58:
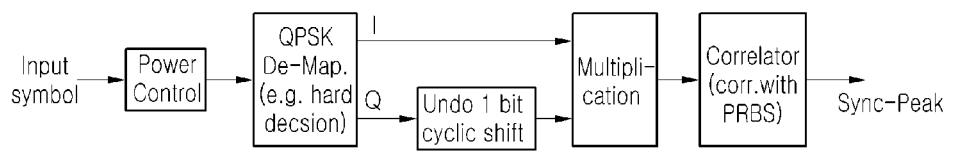
FIG. 58 is showing an example of L1-pre synchronization.

FIG. 58 is showing an example of L1-pre synchronization that can be performed at ModCod extractor r307-1 on L1 signaling path of BICM demodulation module shown in FIG. 31. This is a synchronizing process to obtain a start position of Header in a preamble. Input symbols can be QPSK demapped then for the output Q-path, an inverse of 1 bit cyclic shift can be performed and alignment can be performed. Two I/Q paths values can be multiplied and modulated values by L1-pre signaling can be demodulated. Thus, output of multiplier can express only PRBS which is a sync word. When the output is correlated with a known sequence PRBS, a correlation peak at Header can be obtained. Thus, a start position of Header in a preamble can be obtained. If necessary, power control which is performed to restore original power level, as in FIG. 57, can be performed on input of QPSK demapper.

FIG. 59 is showing another example of L1 block header field which is sent to the Header Inserting module 307-1 on the L1 signaling path of the BICM module as shown in FIG. 4. FIG. 59 is different from FIG. 52 in that L1_span which represents the time interleaving depth is reduced to 2 bits and reserved bits are increased by 1 bit. A receiver can obtain time interleaving parameter of L1 block from the transmitted L1_span.

FIG. 60 is showing processes of equally dividing a L1 block into as many portions as a number of preambles then inserting a header into each of the divided L1 blocks and then assigning the header inserted L1 blocks into a preamble. This can be performed when a time interleaving is performed with a number of preambles where the number of preambles is greater than a minimum number of preambles that is required for transmitting L1 block. This can be performed at the L1 block on the L1 signaling path of the BICM module as shown in FIG. 37. The rest of the carriers, after transmitting L1 blocks can have cyclic repetition patterns instead of being zero padded.

FIG. 61 is showing an example of the Symbol Demapper r306-1 of the BICM demodulation module as shown in FIG. 31. For a case where L1 FEC blocks are repeated as shown in FIG. 60, each starting point of L1 FEC blocks can be aligned, combined at module r301f, and then QAM demapped at QAM demapper r302f to obtain diversity gain and SNR gain. At this point, the combiner can include processes of aligning and adding each L1 FEC block and dividing the added L1 FEC block. For a case where only part of the last FEC block is repeated as shown in FIG. 60, only the repeated part can be divided into as many as a number of FEC block header and the other part can be divided by a value which is one less than a number of FEC block header. In other words, the dividing number corresponds to a number of carriers that is added to each carrier.

FIG. 65 is showing another example of L1 block scheduling. FIG. 65 is different from FIG. 60 in that, instead of performing zero padding or repetition when L1 blocks do not fill one OFDM symbol, OFDM symbol can be filled with parity redundancy by performing less puncturing on shortened/punctured code at the transmitter. In other words, when parity puncturing module 304c is performed at FIG. 5, the effective coderate can be determined according to the puncturing ratio, thus, by puncturing as less bits have to be zero padded, the effective coderate can be lowered and a better coding gain can be obtained. The Parity depuncturing module r303a of a receiver as shown in FIG. 32 can perform depuncturing considering the less punctured parity redundancy. At this point, because a receiver and a transmitter can have information of the total L1 block size, the puncturing ratio can be calculated.

FIG. 62 is showing another example of L1 signaling field. FIG. 62 is different from FIG. 41 in that, for a case where the data slice type is CCM, a start address (21 bits) of the PLP can be transmitted. This can enable FECFRAME of each PLP to form a transmission frame, without the FECFRAME being aligned with a start position of a transmission frame. Thus, padding overhead, which can occur when a data slice width is narrow, can be eliminated. A receiver, when a data slice type is CCM, can obtain ModCod information from the preamble at the L1 signaling path of the BICM demod module as shown in FIG. 31, instead of obtaining it from FECFRAME header. In addition, even when a zapping occurs at a random location of transmission frame, FECFRAME synchronization can be performed without delay because the start address of PLP can be already obtained from the preamble.

FIG. 63 is showing another example of L1 signaling fields which can reduce the PLP addressing overhead.

FIG. 64 is showing the numbers of QAM symbols that corresponds to a FECFRAME depending on the modulation types. At this point, a greatest common divisor of QAM symbol is 135, thus, an overhead of log 2(135)~7 bits can be reduced. Thus, FIG. 63 is different from FIG. 62 in that a number of PLP_start field bits can be reduced from 21 bits to 14 bits. This is a result of considering 135 symbols as a single group and addressing the group. A receiver can obtain an OFDM carrier index where the PLP starts in a transmission frame after obtaining the PLP_start field value and multiplying it by 135.

Figures 67, 68, 69:
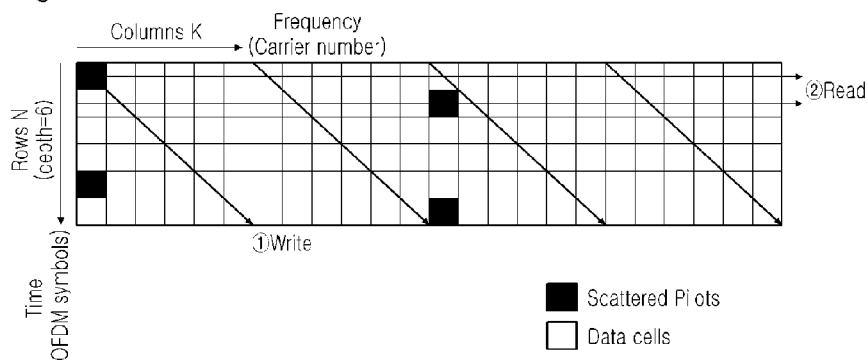
FIG. 67 is showing an interleaving performance of time interleaver of FIG. 66.
FIG. 68 is an example of symbol interleaver.
FIG. 69 is showing an interleaving performance of time interleaver of FIG. 68.

FIG. 66 and FIG. 68 show examples of symbol interleaver 308 which can time interleave data symbols which are sent from the ModCod Header Inserting module 307 on the data path of BICM module as shown in FIG. 4.

FIG. 66 is an example of Block interleaver for time interleaving which can operate on a data-slice basis. The row value means a number of payload cells in four of the OFDM symbols within one data-slice. Interleaving on OFDM symbol basis may not be possible because the number of cells may change between adjacent OFDM cells. The column value K means a time interleaving depth, which can be 1, 2, 4, 8, or 16 . . . . Signaling of K for each data-slice can be performed within the L1 signaling. Frequency interleaver 403 as shown in FIG. 9 can be performed prior to time interleaver 308 as shown in FIG. 4.

FIG. 67 shows an interleaving performance of the time interleaver as shown in FIG. 66. It is assumed that a column value is 2, a row value is 8, a data-slice width is 12 data cells, and that no continual pilots are in the data-slice. The top figure in FIG. 67 is an OFDM symbol structure when time interleaving is not performed and the bottom figure is an OFDM symbol structure when time interleaving is performed. The black cells represent scattered pilot and the non-black cells represent data cells. The same kind of data cells represents an OFDM symbol. In FIG. 100, data cells that correspond to a single OFDM symbol are interleaved into two symbols. An interleaving memory that corresponds to eight OFDM symbols is used but the interleaving depth corresponds to only two OFDM symbols, thus, full interleaving depth is not obtained.

FIG. 68 is suggested for achieving full interleaving depth. In FIG. 68, the black cells represent scattered pilots and the non-black cells represent data cells. Time interleaver as shown in FIG. 68 can be implemented in a form of block interleaver and can interleave data-slices. In FIG. 68, a number of column, K represents a data-slice width, a number of row, N represents time interleaving depth and the value, K can be random values i.e., K=1, 2, 3, . . . . The interleaving process includes writing data cell in a column twist fashion and reading in a column direction, excluding pilot positions. That is, it can be said that the interleaving is performed in a row-column twisted fashion.

In addition, at a transmitter, the cells which are read in a column twisted fashion of the interleaving memory correspond to a single OFDM symbol and the pilot positions of the OFDM symbols can be maintained while interleaving the cells.

Also, at a receiver, the cells which are read in a column twisted fashion of the deinterleaving memory correspond to a single OFDM symbol and the pilot positions of the OFDM symbols can be maintained while time de-interleaving the cells.

FIG. 69 shows time interleaving performance of FIG. 68. For comparison with FIG. 66, it is assumed that a number of row is 8, a data-slice width is 12 data cells, and that no continual pilots are in the data-slice. In FIG. 69, data cells correspond to a single OFDM symbol are interleaved into eight OFDM symbols. As shown in FIG. 102, an interleaving memory that corresponds to eight OFDM symbols is used and the resulting interleaving depth corresponds to eight OFDM symbols, thus, full interleaving depth is obtained.

The time interleaver as shown in FIG. 68 can be advantageous in that full interleaving depth can be obtained using identical memory; interleaving depth can be flexible, as opposed to FIG. 66; consequently, a length of transmission frame can be flexible too, i.e., rows need not be multiples of four. Additionally, the time interleaver used for data slice, can be identical to the interleaving method used for the preamble and also can have commonality with a digital transmission system which uses general OFDM. Specifically, the time interleaver 308 as shown in FIG. 4 can be used before the frequency interleaver 403 as shown in FIG. 9 is used. Regarding a receiver complexity, no additional memory can be required other than additional address control logic which can require very small complexity.

Figure 70:
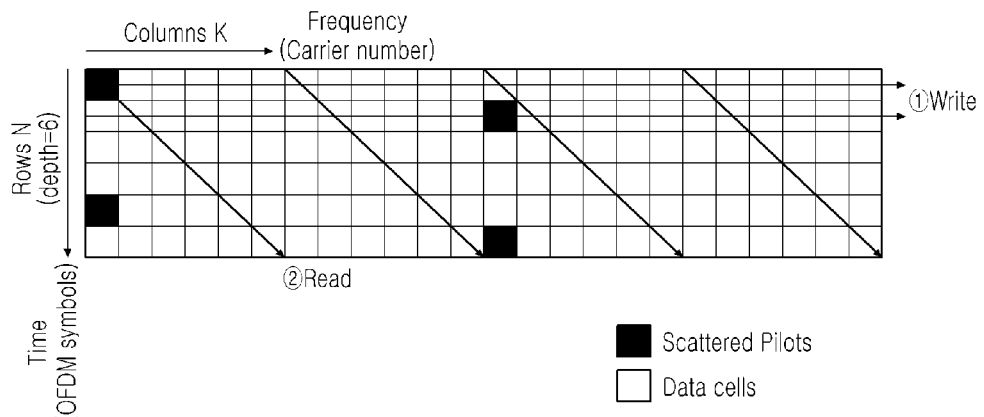
FIG. 70 is an example of symbol deinterleaver.

FIG. 70 shows a corresponding symbol deinterleaver (r308) in a receiver. It can perform deinterleaving after receiving output from the Frame Header Remover r401. In the deinterleaving processes, compared to FIG. 66, the writing and reading processes of block interleaving are inverted. By using pilot position information, time deinterleaver can perform virtual deinterleaving by not writing to or reading from a pilot position in the interleaver memory and by writing to or reading from a data cell position in the interleaver memory. Deinterleaved information can be output into the ModCod Extractor r307.

Figure 71:
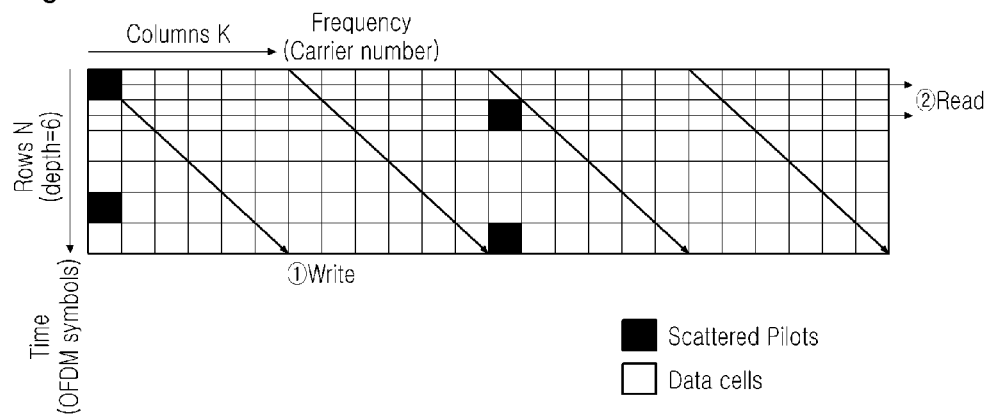
FIG. 71 is another example of time interleaving.

FIG. 71 shows another example of time interleaving. Writing in diagonal direction and reading row-by-row can be performed. As in FIG. 68, interleaving is performed taking into account the pilot positions. Reading and writing is not performed for pilot positions but interleaving memory is accessed by considering only data cell positions.

FIG. 72 shows a result of interleaving using the method shown in FIG. 71. When compared to FIG. 69, cells with the same patterns are dispersed not only in time domain, but also in the frequency domain. In other words, full interleaving depth can be obtained in both time and frequency domains.

Figure 75:
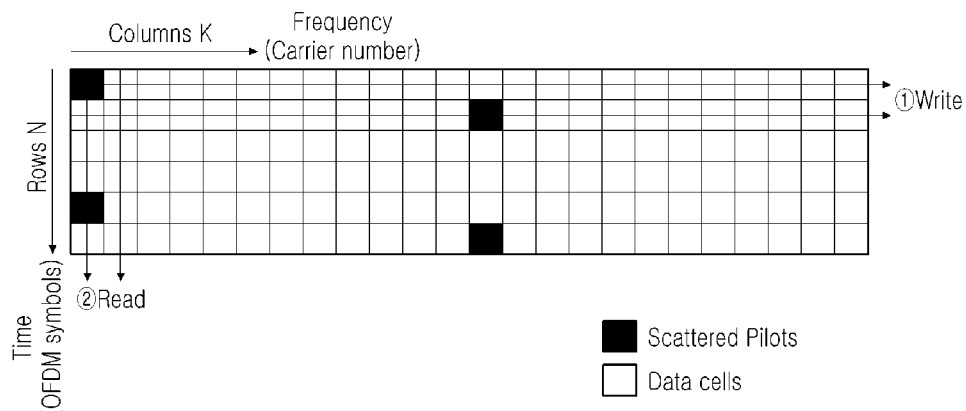
FIG. 75 is an example of symbol deinterleaver.

FIG. 75 shows a symbol deinterleaver r308 of a corresponding receiver. The output of Frame Header Remover r401 can be deinterleaved. When compared to FIG. 66, deinterleaving has switched the order of reading and writing. Time deinterleaver can use pilot position information to perform virtual deinterleaving such that no reading or writing is performed on pilot positions but so that reading or writing can be performed only on data cell positions. Deinterleaved data can be output into the ModCod Extractor r307.

FIG. 73 shows an example of the addressing method of FIG. 72. NT means time interleaving depth and ND means data slice width. It is assumed that a row value, N is 8, a data-slice width is 12 data cells, and no continual pilots are in data-slice. FIG. 73 represents a method of generating addresses for writing data on a time interleaving memory, when a transmitter performs time interleaving. Addressing starts from a first address with Row Address (RA)=0 and Column Address (CA)=0. At each occurrence of addressing, RA and CA are incremented. For RA, a modulo operation with the OFDM symbols used in time interleaver can be performed. For CA, a modulo operation with a number of carriers that corresponds to a data slice width can be performed. RA can be incremented by 1 when carriers that correspond to a data slice are written on a memory. Writing on a memory can be performed only when a current address location is not a location of a pilot. If the current address location is a location of a pilot, only the address value can be increased.

In FIG. 73, a number of column, K represents the data-slice width, a number of row, N represents the time interleaving depth and the value, K can be a random values i.e., K=1, 2, 3, . . . . The interleaving process can include writing data cells in a column twist fashion and reading in column direction, excluding pilot positions. In other words, virtual interleaving memory can include pilot positions but pilot positions can be excluded in actual interleaving.

FIG. 76 shows deinterleaving, an inverse process of time interleaving as shown in FIG. 71. Writing row-by-row and reading in diagonal direction can restore cells in original sequences.

The addressing method used in a transmitter can be used in a receiver. Receiver can write received data on a time deinterleaver memory row-by-row and can read the written data using generated address values and pilot location information which can be generated in a similar manner with that of a transmitter. As an alternative manner, generated address values and pilot information that were used for writing can be used for reading row-by-row.

These methods can be applied in a preamble that transmits L1. Because each OFDM symbol which comprises preamble can have pilots in identical locations, either interleaving referring to address values taking into account the pilot locations or interleaving referring to address values without taking into account the pilot locations can be performed. For the case of referring to address values without taking into account the pilot locations, the transmitter stores data in a time interleaving memory each time. For such a case, a size of memory required to perform interleaving/deinterleaving preambles at a receiver or a transmitter becomes identical to a number of payload cells existing in the OFDM symbols used for time interleaving.

Figure 74:
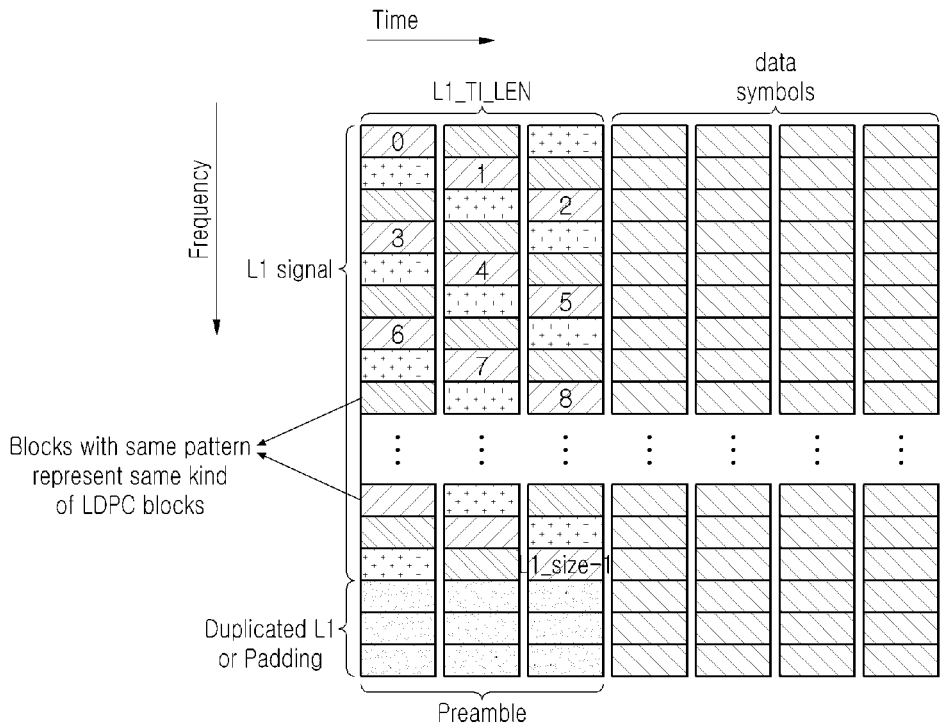
FIG. 74 is another example of L1 time interleaving.

FIG. 74 is another example of L1 time interleaving. In this example, time interleaving can place carriers to all OFDM symbols while the carriers would all be located in a single OFDM symbol if no time interleaving was performed. For example, for data located in a first OFDM symbol, the first carrier of the first OFDM symbol will be located in its original location. The second carrier of the first OFDM symbol will be located in a second carrier index of the second OFDM symbol. In other words, i-th data carrier that is located in n-th OFDM symbol will be located in an i-th carrier index of (i+n) mod N th OFDM symbol, where i=0, 1, 2 number of carrier-1, n=0, 1, 2, N−1, and N is a number of OFDM symbols used in L1 time interleaving. In this L1 time interleaving method, it can be said that interleaving for all the OFDM symbols are performed a twisted fashion as shown in FIG. 107. Even though pilot positions are not illustrated in FIG. 107, as mentioned above, interleaving can be applied to all the OFDM symbols including pilot symbols. That is, it can be said that interleaving can be performed for all the OFDM symbols without considering pilot positions or regardless of whether the OFDM symbols are pilot symbols or not.

If a size of a LDPC block used in L1 is smaller than a size of a single OFDM symbol, the remaining carriers can have copies of parts of the LDPC block or can be zero padded. At this point, a same time interleaving as above can be performed. Similarly, in FIG. 74, a receiver can perform deinterleaving by storing all the blocks used in L1 time interleaving in a memory and by reading the blocks in the order in which they have been interleaved, i.e., in order of numbers written in blocks shown in FIG. 74.

When a block interleaver as shown in FIG. 73 is used, two buffers are used. Specifically, while one buffer is storing input symbols, previously input symbols can be read from the other buffer. Once these processes are performed for one symbol interleaving block, deinterleaving can be performed by switching order of reading and writing, to avoid memory access conflict. This "ping-pong" style deinterleaving can have a simple address generation logic. However, hardware complexity can be increased when using two symbol interleaving buffers.

Figures 77, 78:
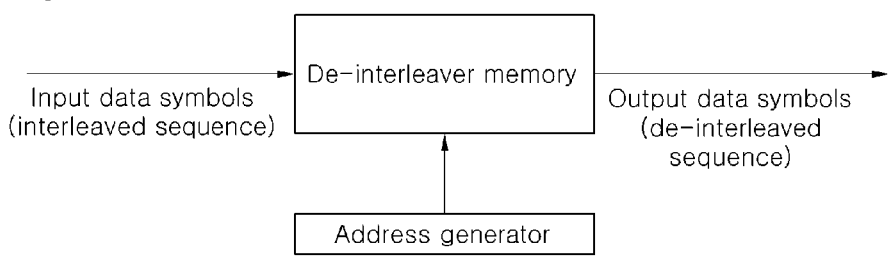
FIG. 77 is an example of symbol deinterleaver.
FIG. 78 is an example of row and column addresses for time deinterleaving.

FIG. 77 shows an example of a symbol deinterleaver r308 or r308-1 as shown in FIG. 31. This proposed embodiment of the invention can use only a single buffer to perform deinterleaving. Once an address value is generated by the address generation logic, the address value can be output from the buffer memory and in-placement operation can be performed by storing a symbol that is input into the same address. By these processes, a memory access conflict can be avoided while reading and writing. In addition, symbol deinterleaving can be performed using only a single buffer. Parameters can be defined to explain this address generation rule. As shown in FIG. 73, a number of rows of a deinterleaving memory can be defined as time interleaving depth, D and a number of columns of the deinterleaving memory can be defined as data slice width, W. Then the address generator can generate the following addresses.

i-th sample on j-th block, including pilot
i=0,1,2,...,N−1;
N=D*W;

-continued

C$_{i,j}$=i mod W;
Tw=((C$_{i,j}$ mod D)*j) mod D;
R$_{i,j}$=((i div W)+Tw) mod D;
L$_{i,j}$(1)=R$_{i,j}$*W+C$_{i,j}$;
Or
L$_{i,j}$(2)=C$_{i,j}$*D+R$_{i,j}$;

The addresses include pilot positions, thus, input symbols are assumed to include pilot positions. If input symbols that include only data symbols need to be processed, additional control logic which skips the corresponding addresses can be required. At this point, i represents an input symbol index, j represents an input interleaving block index, and N=D*W represents an interleaving block length. Mod operation represents modulo operation which outputs remainder after division. Div operation represents division operation which outputs quotient after division. R$_{i,j}$ and C$_{i,j}$ represent row address and column address of i-th symbol input of j-th interleaving block, respectively. Tw represents column twisting value for addresses where symbols are located. In other words, each column can be considered as a buffer where independent twisting is performed according to Tw values. L$_{i,j}$ represents an address when single buffer is implemented in an one dimension sequential memory, not in two dimension. L$_{i,j}$ can have values from 0 to (N−1). Two different methods are possible. L$_{i,j}$(1) is used when the memory matrix is connected row-by-row and L$_{i,j}$(2) is used when the memory matrix is connected in column-by-column.

FIG. 78 shows an example of row and column addresses for time deinterleaving when D is 8 and W is 12. J starts from j=0 and for each j value, a first row can represent the row address and a second row can represent the column address. FIG. 78 shows only addresses of the first 24 symbols. Each column index can be identical to the input symbol index i.

Figure 80:
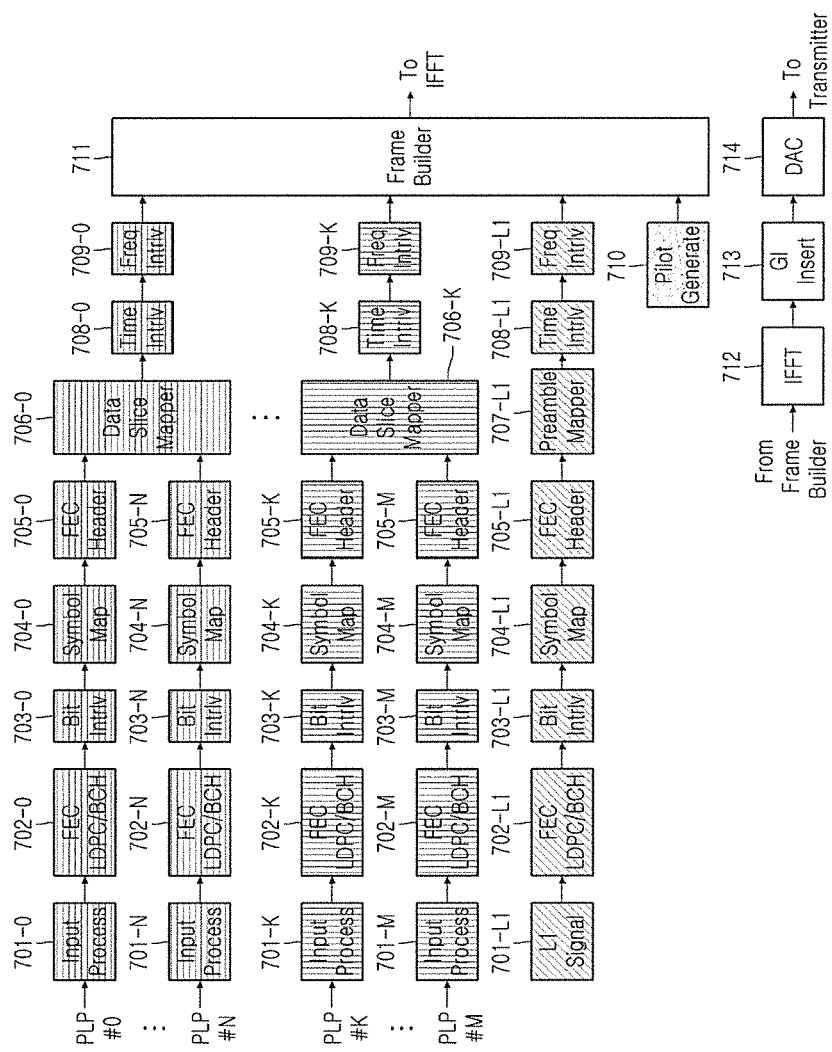
FIG. 80 is an example of an OFDM transmitter which uses data slices.

FIG. 80 shows an example of an OFDM transmitter using a data slice. As shown in FIG. 80, the transmitter can comprise a data PLP path, an L1 signaling path, a frame builder, and an OFDM modulation part. The data PLP path is indicated by blocks with horizontal lines and vertical lines. The L1 signaling path is indicated by blocks with tilted lines. Input processing modules 701-0, 701-N, 701-K, and 701-M can comprise blocks and sequences of input interface module 202-1, input stream synchronizer 203-1, delay compensator 204-1, null packet deleting module 205-1, CRC encoder 206-1, BB header inserting module 207-1, and BB scrambler 209 performed for each PLP as shown in FIG. 2. FEC modules 702-0, 702-N, 702-K, and 702-M can comprise blocks and sequences of outer coding module 301 and inner coding module 303 as shown in FIG. 4. An FEC module 702-L1 used on the L1 path can comprise blocks and sequences of outer coding module 301-1 and shortened/punctured inner coding module 303-1 as shown in FIG. 4. L1 signal module 700-L1 can generate L1 information required to comprise a frame.

Bit interleaving modules 703-0, 703-N, 703-K, and 703-M can comprise blocks and sequences of inner interleaver 304 and bit demux 305 as shown in FIG. 37. Bit interleaving module 703-L1 used on the L1 path can comprise blocks and sequences of inner interleaving module 304-1 and bit demux 305-1 as shown in FIG. 4. Symbol mapper modules 704-0, 704-N, 704-K, and 704-M can perform functions identical with the functions of the symbol mapper 306 shown in FIG. 4. The symbol mapper module 704-L1 used on L1 path can perform functions identical with the functions of the symbol mapper 306-1 shown in FIG. 4. FEC header modules 705-0, 705-N, 705-K, and 705-M can perform functions identical with the functions of the ModCod Header inserting module 307 shown in FIG. 4. FEC header module 705-L1 for the L1 path can perform functions identical with the functions of the ModCod Header inserting module 307-1 shown in FIG. 4.

Data slice mapper modules 706-0 and 706-K can schedule FEC blocks to corresponding data slices and can transmit the scheduled FEC blocks, where the FEC blocks correspond to PLPs that are assigned to each data slice. Preamble mapper 707-L1 can schedule L1 signaling FEC blocks to preambles. L1 signaling FEC blocks are transmitted in preambles. Time interleaver modules 708-0 and 708-K can perform functions identical with the functions of the symbol interleaver 308 shown in FIG. 4 which can interleave data slices. Time interleaver 708-L1 used on L1 path can perform functions identical with the functions of the symbol interleaver 308-1 shown in FIG. 4.

Alternatively, time interleaver 708-L1 used on L1 path can perform identical functions with symbol interleaver 308-1 shown in FIG. 3, but only on preamble symbols.

Frequency interleaver blocks 709-0 and 709-K can perform frequency interleaving on data slices. Frequency interleaver 709-L1 used on L1 path can perform frequency interleaving according to preamble bandwidth.

Pilot generating module 710 can generate pilots that are suitable for continuous pilot (CP), scattered pilot (SP), data slice edge, and preamble. A frame can be built from scheduling the data slice, preamble, and pilot at module 711. The IFFT module 712 and GI inserting module 713 can perform functions identical with the functions of the IFFT module 501 and the GI inserting module 503 blocks shown in FIG. 18, respectively. Lastly, DAC 714 can convert digital signals into analog signals and the converted signals can be transmitted.

Figures 81, 82:
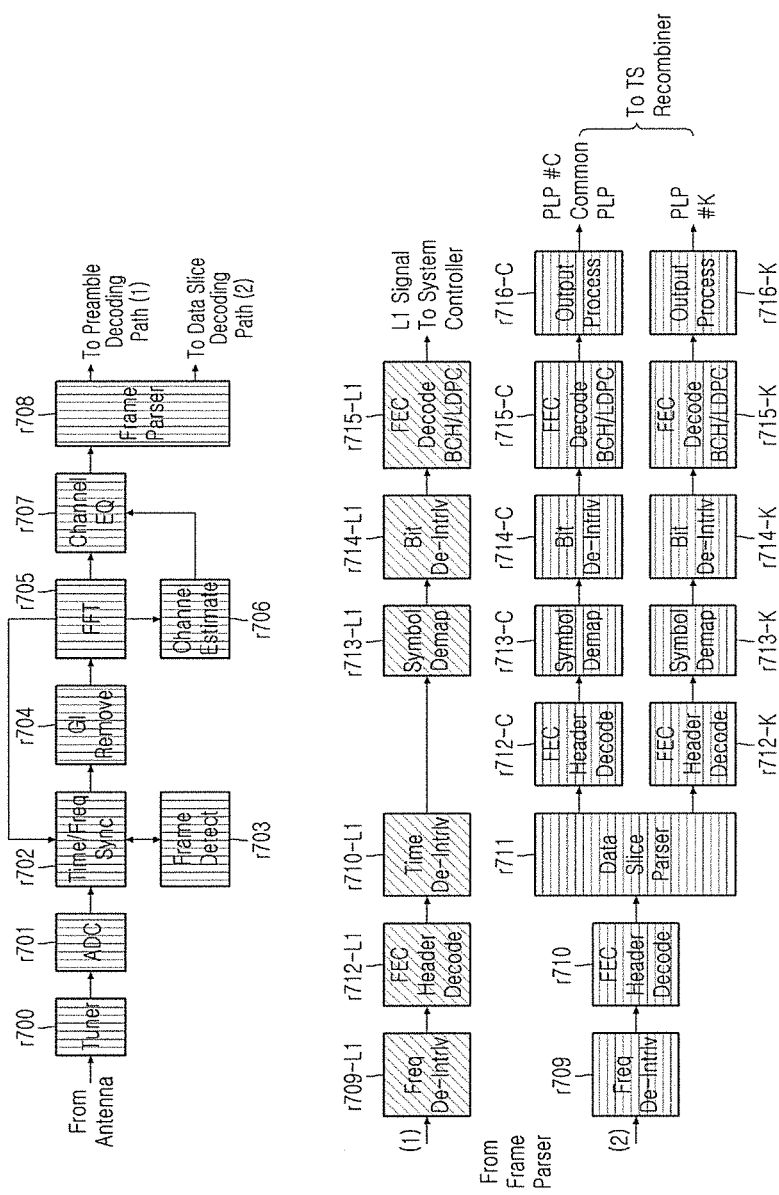
FIG. 81 is an example of an OFDM receiver which uses data slice.
FIG. 82 is an example of time interleaver and an example of time deinterleaver.

FIG. 81 shows an example of an OFDM receiver which uses data slice. In FIG. 81, tuner r700 can perform the functions of the tuner/AGC r603 and the functions of the down converter r602 shown in FIG. 61. ADC r701 can convert received analog signals into digital signals. Time/freq synchronizer r702 can perform functions identical with the functions of the time/freq synchronizer r505 shown in FIG. 62. Frame detector r703 can perform functions identical with the functions of the frame detector r506 shown in FIG. 62.

At this point, after time/frequency synchronization are performed, synchronization can be improved by using preamble in each frame that is sent from frame detector r703 during tracking process.

GI remover r704 and FFT module r705 can perform functions identical with the functions of the GI remover r503 and the FFT module r502 shown in FIG. 62, respectively.

Channel estimator r706 and channel EQ r707 can perform a channel estimation part and a channel equalization part of the channel Est/Eq r501 as shown in FIG. 62. Frame parser r708 can output a data slice and preamble where services selected by a user are transmitted. Blocks indicated by tilted lines process a preamble. Blocks indicated by horizontal lines which can include common PLP, process data slices. Frequency deinterleaver r709-L1 used on the L1 path can perform frequency deinterleaving within the preamble bandwidth. Frequency deinterleaver r709 used on the data slice path can perform frequency deinterleaving within data slice. FEC header decoding module r712-L1, time deinterleaver r710-L1, and symbol demapper r713-L1 used on the L1 path can perform functions identical with the functions of the ModCod extractor r307-1, symbol deinterleaver r308-1, and symbol demapper r306-1 shown in FIG. 31.

Bit deinterleaver r714-L1 can comprise modules and sequences of bit demux r305-1 and inner deinterleaver r304-1 as shown in FIG. 31. FEC decoding module r715-L1 can comprise modules and sequences of shortened/punctured inner coding module r303-1 and outer decoding module r301-1 shown in FIG. 31. At this point, the output of the L1 path can be L1 signaling information and can be sent to a system controller for restoring PLP data that are transmitted in data slices.

Time deinterleaver r710 used on the data slice path can perform functions identical with the functions of the symbol deinterleaver r308 shown in FIG. 31. Data slice parser r711 can output user selected PLP from the data slices and, if necessary, common PLP associated with the user selected PLP. FEC header decoding module r712-C and r712-K can perform functions identical with the functions of the ModCod extractor r307 shown in FIG. 31. Symbol demapper r713-C and r713-K can perform functions identical with the functions of the symbol demapper r306 shown in FIG. 31.

Bit deinterleaver r714-C and r714-K can comprise blocks and sequences of bit demux r305 and inner deinterleaver r304 as shown in FIG. 31. FEC decoding module r715-C and r715-K can comprise blocks and sequences of inner decoding module r303 and outer decoding module r301 as shown in FIG. 31. Lastly, output processor r716-C and r716-K can comprise blocks and sequences of BB descrambler r209, BB header remover r207-1, CRC decoder r206-1, null packet inserting module r205-1, delay recover r204-1, output clock recovering module r203-1, and output interface module r202-1 which are performed for each PLP in FIG. 2. If a common PLP is used, the common PLP and data PLP associated with the common PLP can be transmitted to a TS recombiner and can be transformed into a user selected PLP.

It should be noted from FIG. 81, that in a receiver, the blocks on the L1 path are not symmetrically sequenced to a transmitter as opposed to the data path where the blocks are symmetrically positioned or in opposite sequence of a transmitter. In other words, for the data path, Frequency deinterleaver r709, Time deinterleaver r710, Data slice parser r711, and FEC header decoding module r712-C and r712-K are positioned. However, for the L1 path, Frequency deinterleaver r709-L1, FEC header decoding module r712-L1, and time deinterleaver r710-L1 are positioned.

FIG. 79 shows an example of general block interleaving in a data symbol domain where pilots are not used. As seen from the left figure, interleaving memory can be filled without black pilots. To form a rectangular memory, padding cells can be used if necessary. In the left figure, padding cells are indicated as cells with tilted lines. In the example, because one continual pilot can overlap with one kind of scattered pilot pattern, a total of three padding cells are required during four of OFDM symbol duration. Finally, n the middle figure, interleaved memory contents are shown.

As in the left figure of FIG. 79, either writing row-by-row and performing column twisting; or writing in a twisted fashion from the beginning, can be performed. Output of the interleaver can comprise reading row-by-row from memory. The output data that has been read can be placed as shown in the right figure when OFDM transmission is considered. At this time, for simplicity, frequency interleaving can be ignored. As seen in the figure, frequency diversity is not as high as that of FIG. 73, but is maintained at a similar level. Most of all, it can be advantageous in that the memory required to perform interleaving and deinterleaving can be optimized. In the example, memory size can be reduced from W*D to (W−1)*D. As the data slice width becomes bigger, the memory size can be further reduced.

For time deinterleaver inputs, a receiver should restore memory buffer contents in a form of the middle figure while considering padding cells. Basically, OFDM symbols can be read symbol-by-symbol and can be saved row-by-row. Detwisting corresponding to column twisting can then be performed. The output of the deinterleaver can be output in a form of reading row-by-row from the memory of the left figure. In this fashion, when compared to the method shown in FIG. 73, pilot overhead can be minimized, and consequently interleaving/deinterleaving memory can be minimized.

FIG. 82 shows an example of a time interleaver 708-L1 for L1 path of FIG. 80. As shown in the FIG. 82, time interleaving for the preamble where L1 is transmitted, can include interleaving L1 data cells, excluding pilots that are usually transmitted in the preamble. The interleaving method can include writing input data in a diagonal direction (solid lines) and reading the data row-by-row (dotted lines), using identical to methods which are shown in reference to FIG. 73.

FIG. 82 shows an example of a time deinterleaver r712-L1 on the L1 path as shown in FIG. 81. As shown in FIG. 82, for a preamble where L1 is transmitted, deinterleaving L1 data cell can be performed, excluding the pilots that are regularly transmitted in the preamble. The deinterleaving method can be identical to the method as shown in FIG. 76 where input data are written row-by-row (solid lines) and read in a diagonal direction (dotted lines). The input data does not include any pilot, consequently, the output data has L1 data cells that do not include pilot either. When a receiver uses a single buffer in a time deinterleaver for the preamble, the address generator structure that has a deinterleaver memory as shown in FIG. 77 can be used.

Deinterleaving r712-L1 can be performed using address operations as follows:

i-th sample on j-th block, including pilot
i=0,1,2,...,N−1;
N=D*W;
$C_{i,j} = i \bmod W$;
$Tw = ((C_{i,j} \bmod D)*j) \bmod D$;
$R_{i,j} = ((i \div W)+Tw) \bmod D$;
$L_{i,j}(1) = R_{i,j}*W + C_{i,j}$;
Or
$L_{i,j}(2) = C_{i,j}*D + R_{i,j}$;

In the above operations, a length of a row, W is a length of a row of an interleaving memory as shown in FIG. 82. Column length, D is a preamble time interleaving depth, which is a number of OFDM symbols that are required for transmitting preambles.

Figure 83:
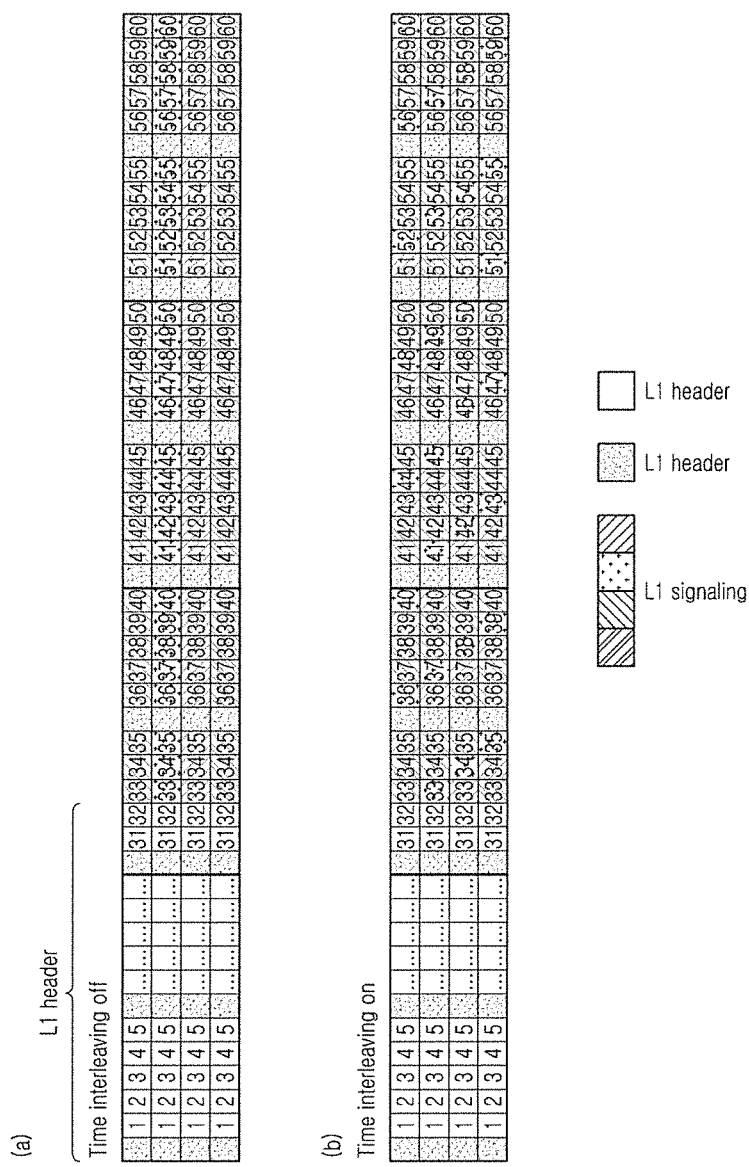
FIG. 83 is an example of forming OFDM symbols.

FIG. 83 shows an example of forming OFDM symbols by scheduling pilots and input preambles from the frame builder 711 as shown in FIG. 80. Blank cells form a L1 header which is an output signal of the FEC header 705-L1 on the L1 path, as shown in FIG. 80. Grey cells represent continual pilots for the preamble which are generated by the pilot generating module 710 as shown in FIG. 80. Cells with patterns represent the L1 signaling cells which are an output signal of the preamble mapper 707-L1 as shown in FIG. 80. The left figure represents OFDM symbols when time interleaving is off and the right figure represents OFDM symbols when time interleaving is on. L1 header can be excluded from time interleaving because L1 header transmits a L1 signaling field length and a time interleaving on/off flag information. It is because the L1 header is added before time interleaving. As aforementioned, time interleaving is performed excluding pilot cells. The remaining of L1 data cells can be interleaved as shown in FIG. 82, then can be assigned to OFDM subcarriers.

Figure 84:
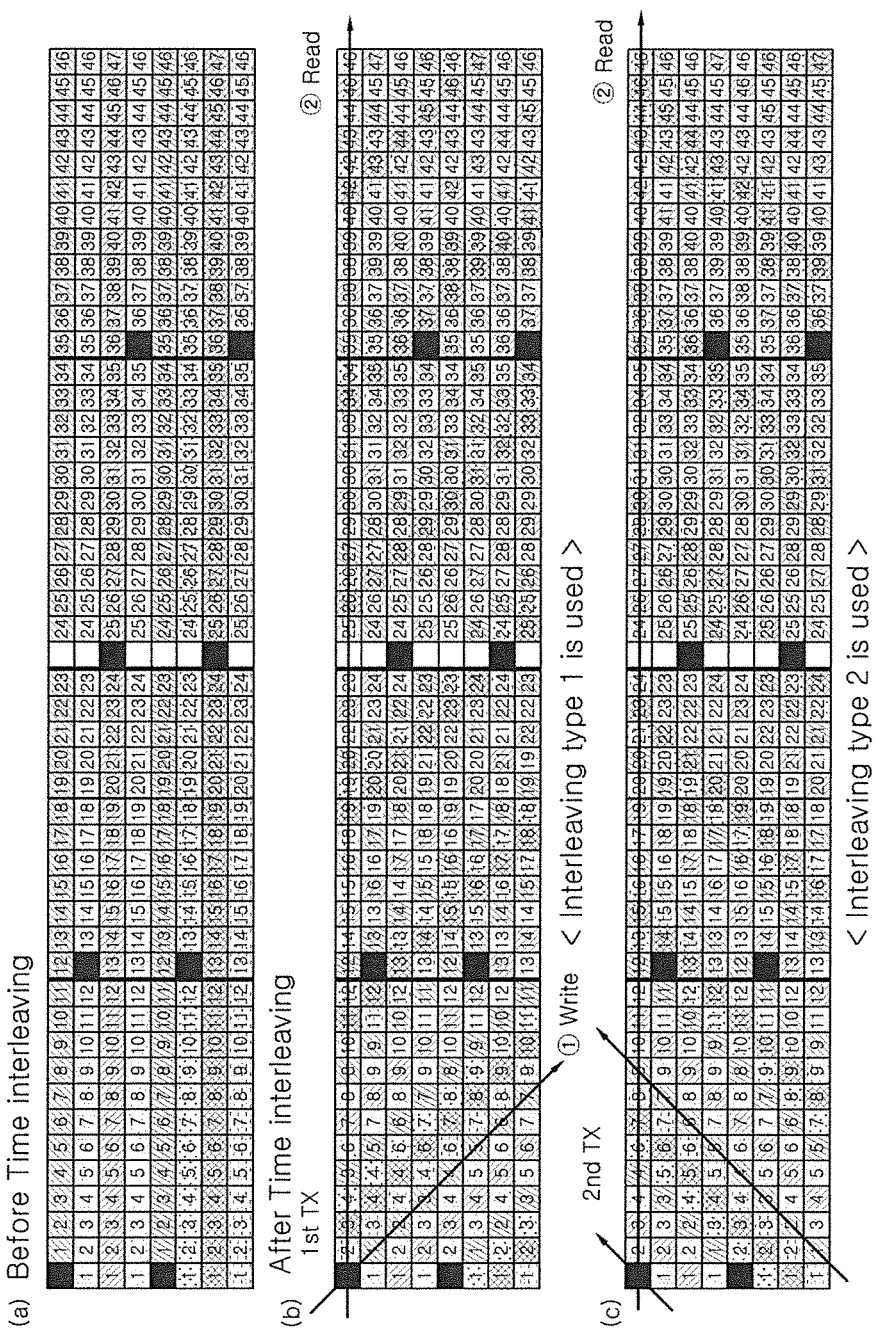
FIG. 84 is an example of a Time Interleaver (TI).

FIG. 84 shows an example of a Time Interleavers 708-0~708-K that can interleave data symbols that are sent from Data Slice Mappers 706-0~706-K on data path of an OFDM transmitter using data slice shown in FIG. 80. Time interleaving can be performed for each data slice. Time interleaved symbols can be output into Frequency Interleavers 709-0~709-K.

FIG. 84 also shows an example of a simple time interleaver using a single buffer. FIG. 84a shows a structure of OFDM symbols before Time interleaving. Blocks with same patterns represent same kind of OFDM symbols. FIGS. 84b and 84c show a structure of OFDM symbols after Time interleaving. Time interleaving method can be divided into Type 1 and Type 2. Each type can be performed alternatively for even symbols and odd symbols. A receiver can perform deinterleaving accordingly. One of reasons of alternatively using type 1 and type 2 is to reduce memory required at a receiver by using a single buffer during time deinterleaving.

FIG. 84b shows a time interleaving using interleaving type 1. Input symbols can be written in downward diagonal direction and can be read in a row direction. FIG. 84c shows a time interleaving using interleaving type 2. Input symbols can be written in upward diagonal direction and can be read in a row direction. The difference between type 1 and type 2 is whether a direction of writing input symbol is upward or downward. The two methods are different in a manner of writing symbols, however the two methods are identical in terms of exhibiting full time interleaving depth and full frequency diversity. However, using these methods can cause a problem during synchronization at a receiver because of using two interleaving schemes.

There can be two possible solutions. First solution can be signaling 1 bit of an interleaving type of a first interleaver block that comes first after each preamble, through L1 signaling of preamble. This method is performing a correct interleaving through signaling. Second solution can be forming a frame to have a length of an even number of interleaving blocks. Using this method, a first interleaving block of each frame can have an identical type, thus, interleaving block synchronization problem can be resolved. For example, synchronization issue can be resolved by applying type 1 interleaving to a first interleaving block and sequentially applying to next interleaving blocks within each frame, then ending a last interleaving block of each frame with type 2 interleaving. This method requires a frame to be composed of two interleaving blocks but can be advantageous in that no additional signaling is required as in the first method.

Figure 89:
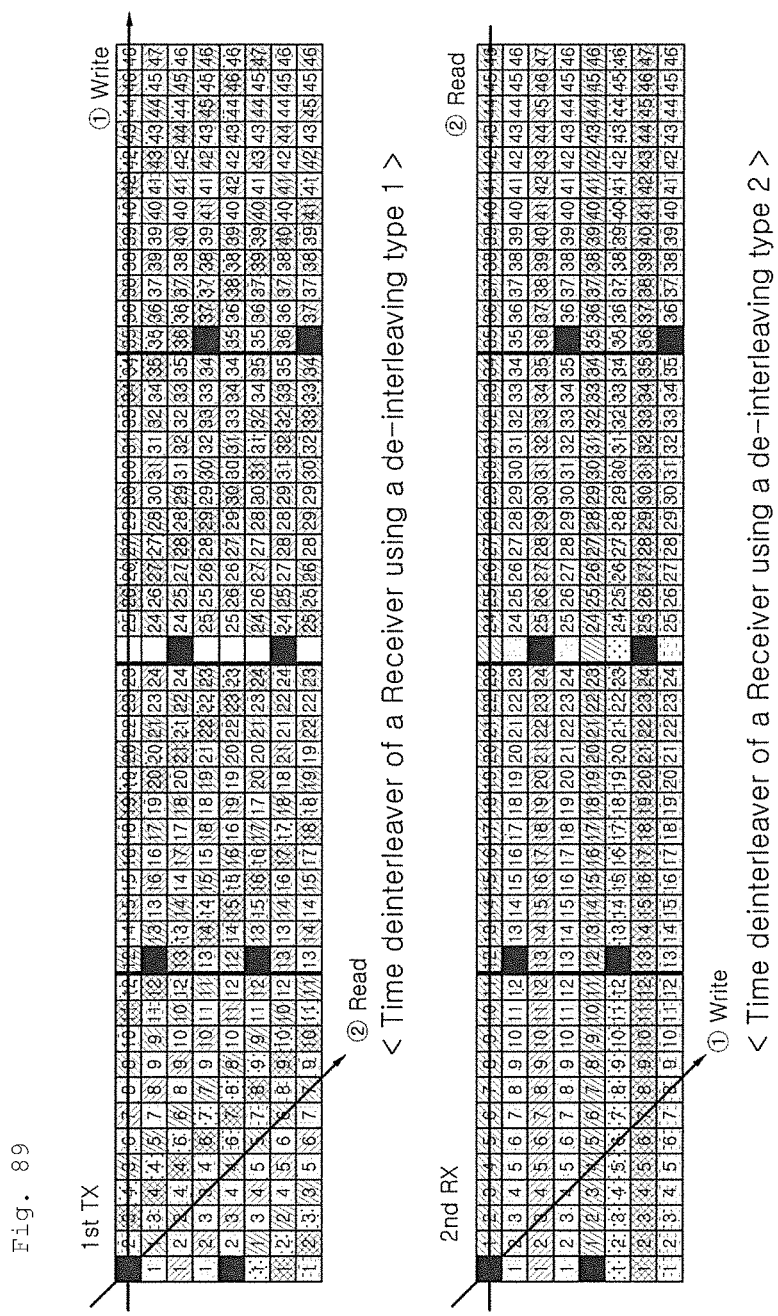
FIG. 89 is an example of a Time Interleaver (TI).

FIG. 89 shows a structure of a Time deinterleaver r710 of a receiver shown in FIG. 81. Time De-interleaving can be performed on outputs of Frequency deinterleaver r709. Time de-interleaver of FIG. 89 represents a de-interleaving scheme which is an inverse process of a time interleaving shown in FIG. 84. The de-interleaving, compared to FIG. 84, will have an opposite manner in reading and writing. In other words, type 1 deinterleaver can write input symbols in a row direction and can read the written symbols in downward diagonal direction. Type 2 deinterleaver can write input symbols in downward diagonal direction and can read the written symbols in a row direction. These methods can enable writing received symbols where symbols are previously read by making a direction of writing symbols of type 2 deinterleaver identical to a direction of reading symbols of type 1 deinterleaver. Thus, a receiver can perform deinterleaving using a single buffer. In addition, a simple implementation can be realized because of deinterleaving methods of type 1 and type 2 are performed by either writing and reading symbols in a diagonal direction or in a row direction.

However, using these methods can cause a problem in synchronization at a receiver because of using two interleaving schemes. For example, de-interleaving type 1 interleaved symbols in a type 2 manner can cause deterioration in performance. There can be two possible solutions. First solution can be determining a type of an interleaving block that comes after a preamble, using 1 bit of an interleaving type of a transmitted L1 signaling part. Second solution can be performing deinterleaving using a type according to a first interleaving block within a frame, if a number of interleaving blocks within a frame is even number. De-interleaved symbol can be output into Data Slice Parser r711.

Figure 85:
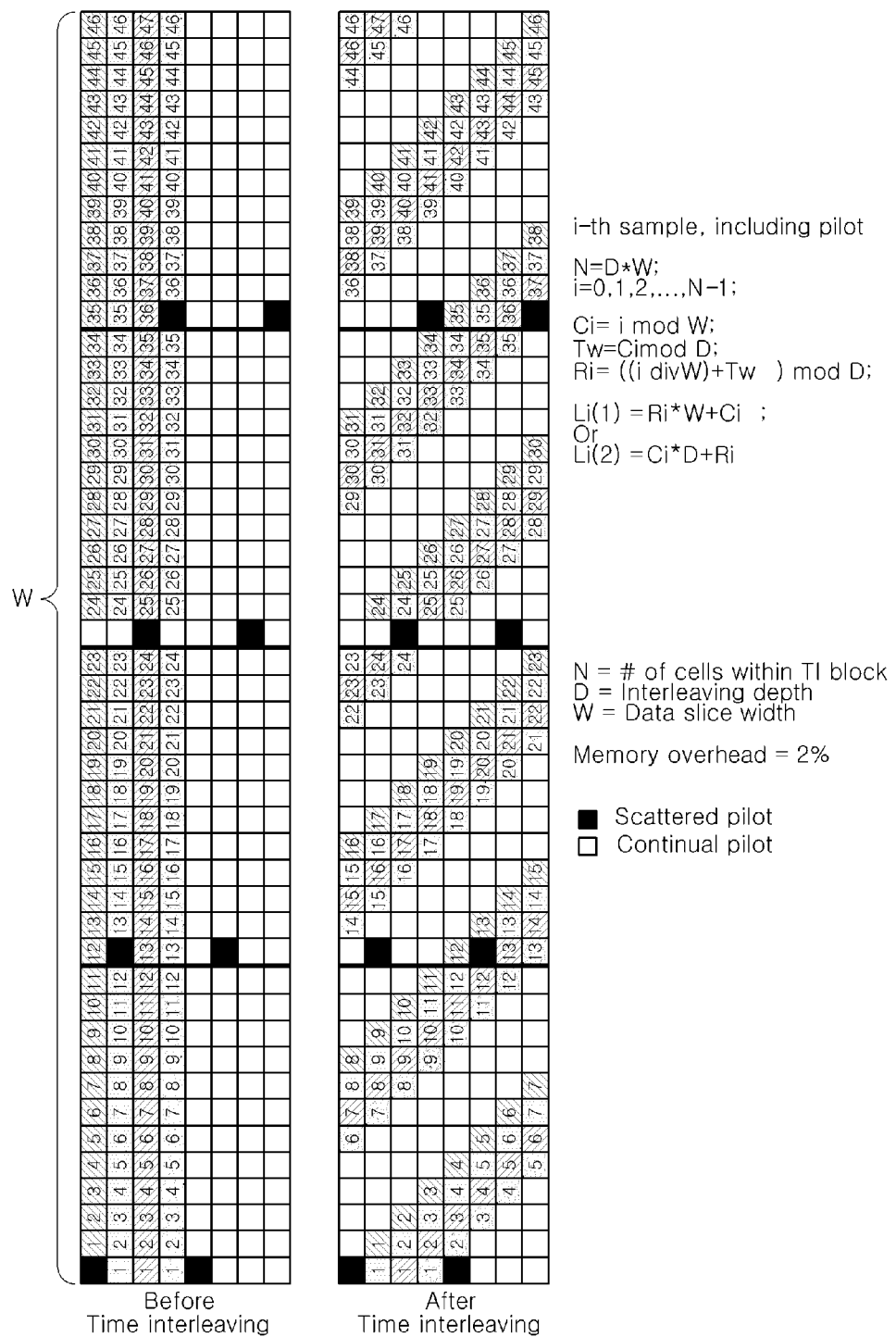
FIG. 85 is an example of a Time Interleaver (TI).

FIG. 85 shows an address generation logic that is identical with an address generation logic of a single buffer, when a block interleaver uses two memory buffers as in FIG. 73. The address generation logic can perform identical functions as functions shown in FIG. 73. By defining a time interleaving depth D as a number of rows of a deinterleaving memory and defining a data slice width W as a number of column, addresses shown in the FIG. 85 can be generated by an address generator. The addresses can include pilot positions. To time interleave input symbols that include only data symbols, a control logic that can skip addresses may be required. Addresses used in interleaving preambles may not require pilot positions and interleaving can be performed using L1 blocks. The i represents an index of an input symbol, N=D*W represents an interleaving block length. Ri and Ci represent a row address and a column address of an i-th input symbol, respectively. Tw represents a column twisting value or twisting parameter from an address where a symbol is located. Li represents addresses when one dimensional memory having a single buffer is implemented. Values of Li can be from 0 to (N−1). In this one dimensional memory, at least two methods are possible. Li(1) is coupling a memory matrix row-by-row and Li(2) is coupling a memory matrix column-by-column. A receiver can use the address generation logic in reading symbols during a de-interleaving.

Figure 86:
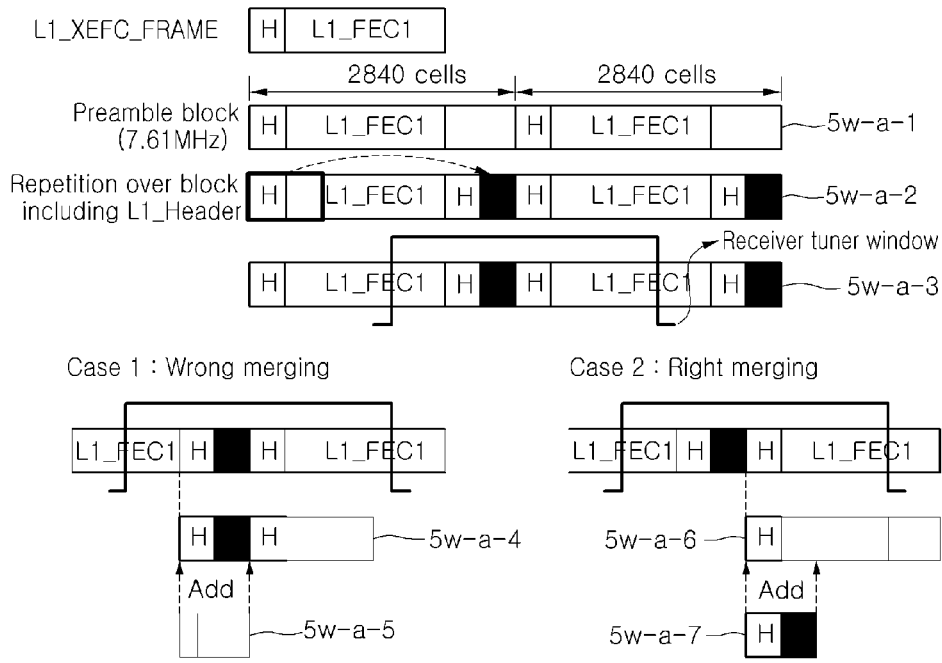
FIG. 86 is an example of a preamble structure at a transmitter and an example of a process at a receiver.

FIG. 86 shows another example of a preamble. For a case when an OFDM symbol having a size of 4K-FFT is used in 7.61 MHz bandwidth and a sixth carrier within a OFDM symbol and carriers at both ends are used as pilots, a number of carriers that can be used in L1 signaling can be assumed to be 2840. When multiple channels are bonded, multiple preamble bandwidths can exist. The number of carriers can change depending on a type of pilots to be used, an FFT size, a number of bonded channels, and others factors. If a size of an L1_XFEC_FRAME that includes L1_header (H) that is to be assigned to a single OFDM symbol and L1 FEC block (L1_FEC1) is smaller than a single OFDM symbol (5w-a-1), L1_XFEC_FRAME including L1_header can be repeated to fill a remaining part of the single OFDM symbol (5w-a-2). This is similar to preamble structure of FIG. 60. For a receiver to receive a data slice that is located in a certain bandwidth of bonded channels, a tuner window of the receiver can be located in a certain bandwidth.

Figure 87:
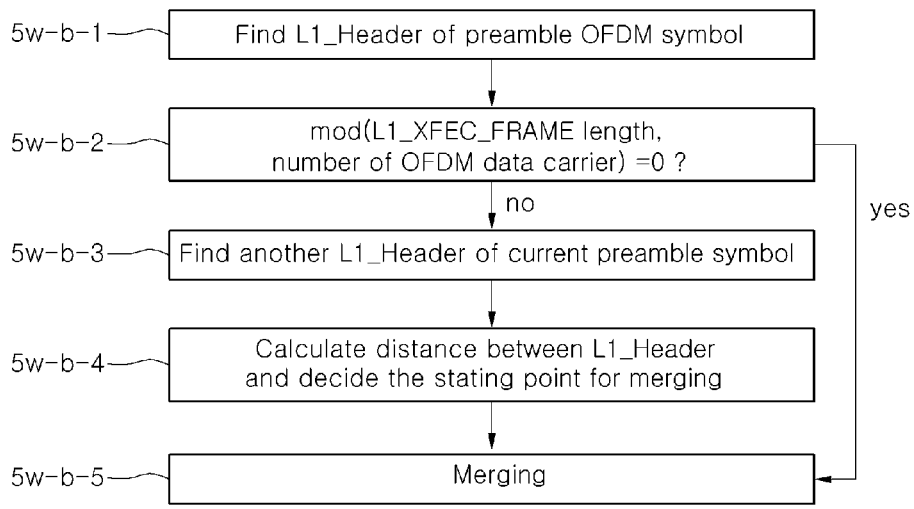
FIG. 87 is an example of a process at a receiver to obtain L1_XFEC_FRAME from preamble.

If a tuner window of a receiver is located as 5w-a-3 of FIG. 86, an incorrect result can occur during merging repeated L1_XFEC_FRAMEs. Case 1 of FIG. 86 can be such an example. A receiver finds L1_Header (H) to locate a start position of a L1_Header (H) within a tuner window, but the found L1_Header can be a header of a incomplete L1_XFEC_FRAME (5w-a-4). L1 signaling information may not be obtained correctly if a length of L1_XFEC_FRAME is obtained based on that L1_Header and a rest of part (5w-a-5) is added to a start position of that L1_Header. To prevent such a case, a receiver may need additional operations to find a header of a complete L1_XFEC_FRAME. FIG. 87 shows such operations. In the example, to find a header of a complete L1_XFEC_FRAME, if an incomplete L1_XFEC_FRAME exists in a preamble, a receiver can use at least two L1_Headers to find a start location of L1_Header for merging L1_XFEC_FRAME. First, a receiver can find L1_Header from a preamble OFDM symbol (5w-b-1). Then using a length of an L1_XFEC_FRAME within the found L1_Header, the receiver can check if every L1_XFEC_FRAME within a current OFDM symbol is a complete block (5w-b-2). If it s not, the receiver can find another L1_Header from current preamble symbol (5w-b-3). From a calculated distance between a newly found L1_Header and a previous L1_Header, whether a certain L1_XFEC_FRAME is a complete block can be determined (5w-b-4). Then, an L1_Header of a complete L1_XFEC_FRAME can be used as a stating point for merging. Using the stating point, L1_XFEC_FRAME can be merged (5w-b-5). Using these processes, case 2 or correct merging shown in FIG. 86 can be expected at a receiver. These processes can be performed at FEC Header Decoder r712-L1 on L1 signal path of FIG. 81.

Figure 88:
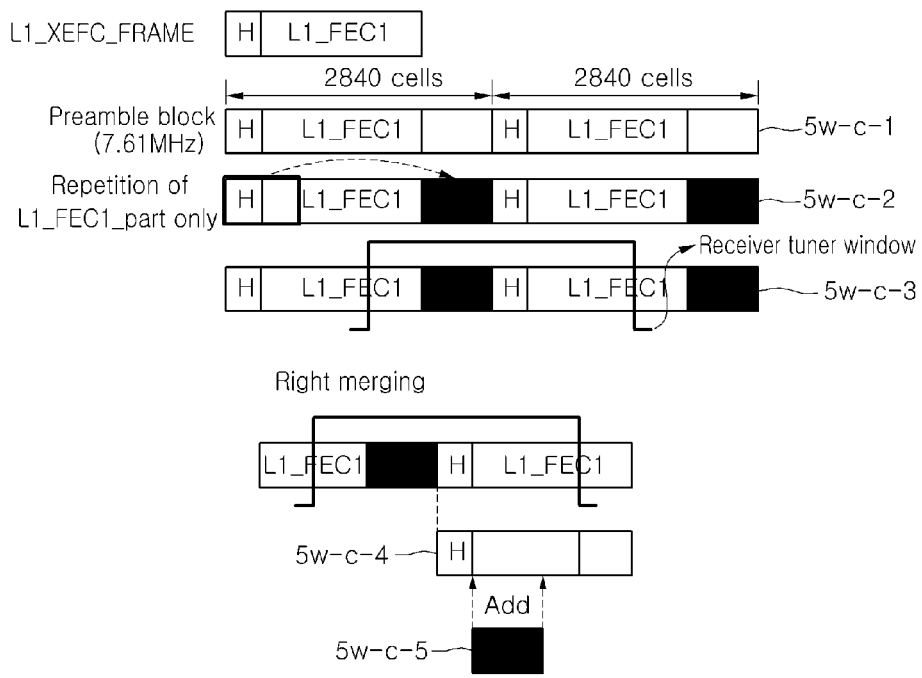
FIG. 88 is an example of a preamble structure at a transmitter and an example of a process at a receiver.

FIG. 88 is an example of a preamble structure that can eliminate the aforementioned additional operations at a receiver. As opposed to the previous preamble structure, when a remaining part of an OFDM symbol is filled, only L1_FEC1 of an L1_XFEC_FRAME, excluding L1_Header (H) can be repeatedly filled (5w-c-2). In this way, when a receiver finds a start position of a L1_Header (H) to merge L1_XFEC_FRAME, L1_Header of only complete L1_XFEC_FRAME can be found (5w-c-4), thus, without additional operations, L1_XFEC_FRAME can be merged using the found L1_Header. Therefore, processes such as (5w-b-2), (5w-b-3), and (5w-b-4) shown in FIG. 87 can be eliminated at a receiver. These processes and counterpart processes of the processes can be performed at FEC Header Decoder 712-L1 on L1 signal path of a receiver of FIG. 81 and at FEC Header 705-L1 on L1 signal path of a transmitter of FIG. 80.

Figure 90:
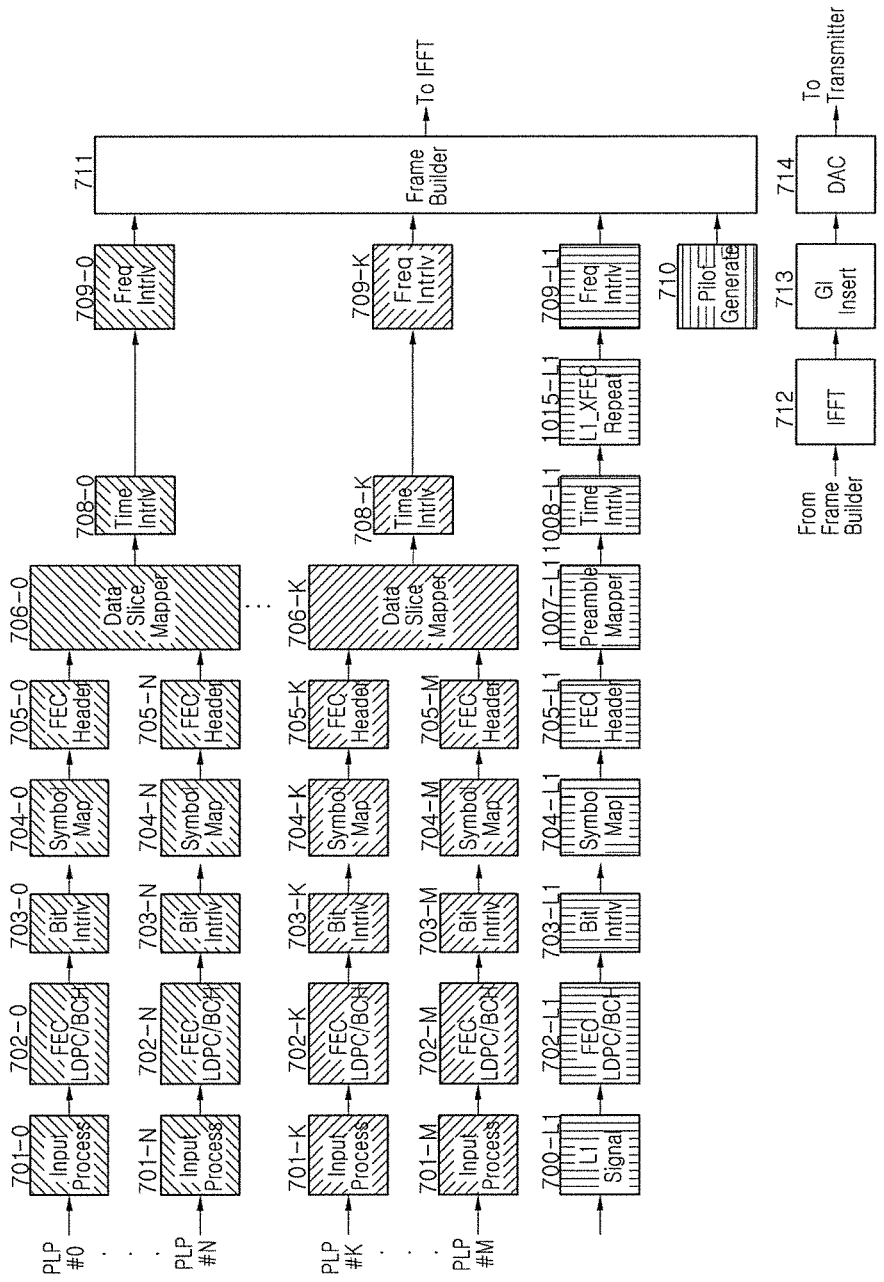
FIG. 90 is an example of an OFDM transmitter using data slices.

Time deinterleaver r712-L1 on L1 path of a receiver of FIG. 81 can de-interleave L1 block cells or cells with patterns, excluding other cells such as preamble header and pilot cells. L1 block cells are represented by cells with patterns as shown in FIG. 83. FIG. 90 shows another example of an OFDM transmitter that uses data slices. This transmitter can have identical structure and can perform identical function with the transmitter of FIG. 80, except the added and modified blocks. The preamble mapper 1007-L1 can map L1 blocks and L1 block headers which are outputs from FEC header 705-L1 into preamble symbols used in a transmission frame. Specifically, L1 block header can be repeated for each preamble and the L1 block can be divided as many as a number of used preambles. Time interleaver 1008-L1 can interleave L1 blocks that are divided into preambles. At this point, L1 block header can be either included in interleaving or not included in interleaving. Whether the L1 block header is included or not may not change a signal structure of an L1 block header but it can change an order of interleaving and transmitting L1 blocks. L1 XFEC repeater 1015-L1 can repeat the time interleaved L1_XFEC blocks within a preamble bandwidth. At this point, the L1 block header can be either repeated within a preamble or not repeated within a preamble.

Figure 91:
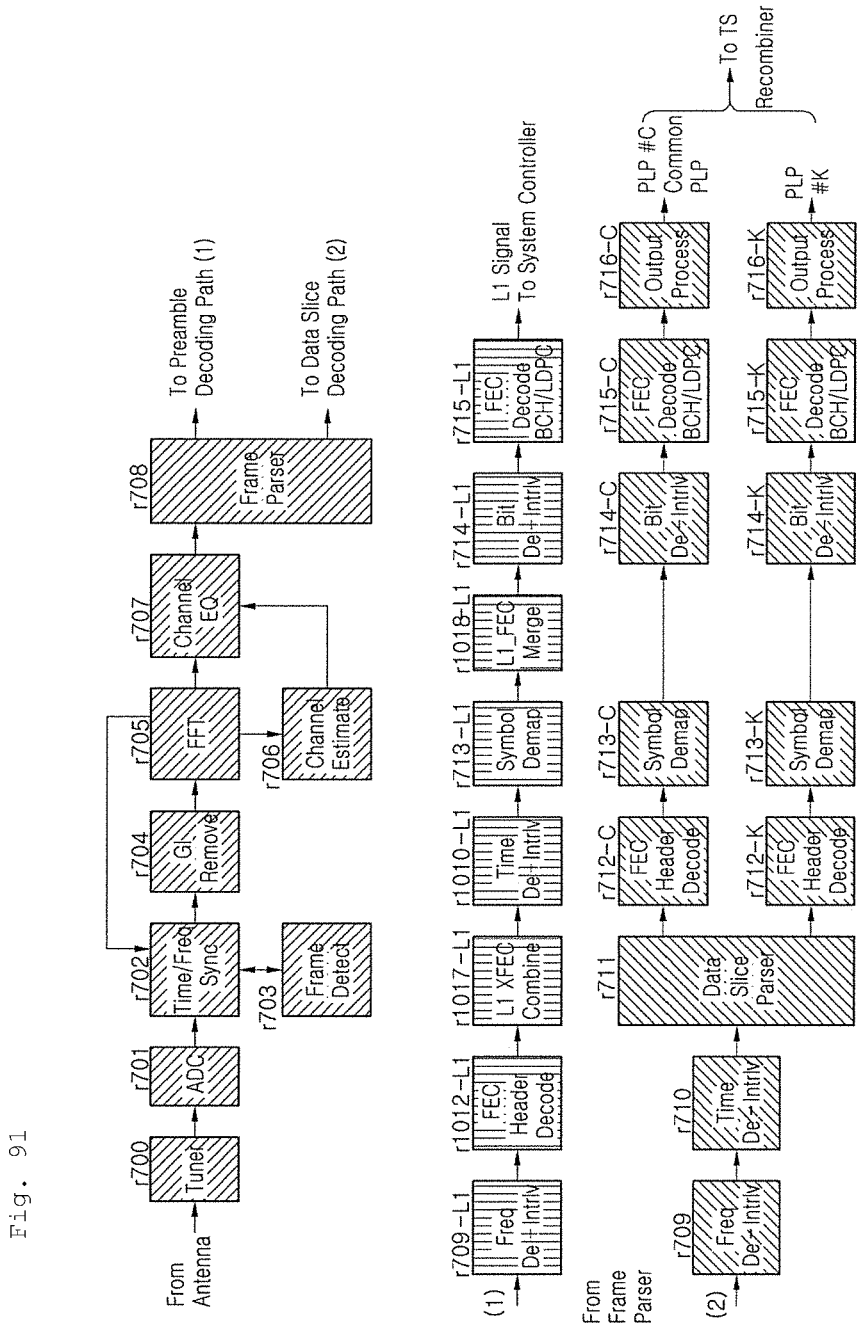
FIG. 91 is an example of an OFDM receiver using data slices.

FIG. 91 shows another example of an OFDM receiver using data slices. This receiver has identical structure and can perform identical function with the receiver of FIG. 81, except the added and modified blocks. FEC header decoding module r1012-L1 can synchronize L1 headers within a preamble. If L1 headers are repeated, L1 headers can be combined to obtain an SNR gain. Then, FEC header decoding module r712-L1 of FIG. 81 can perform an FEC decoding.

The synchronization process can give a location of a header by correlating sync word of a header and preambles. For frequency offsets of multiple of an integer, a correlation range can be determined from circular addressing.

L1_XFEC combining module r1017-L1 can combine L1_XFEC blocks to obtain an SRN gain, when divided L1 blocks are received within a preamble. Time deinterleaver r1010-L1 can time de-interleave L1 blocks within a preamble. Depending on whether L1 block headers are time interleaved at a transmitter or not, L1 block headers can be de-interleaved at a receiver accordingly. A deinterleaving order of L1 blocks can be changed depending on whether L1 block headers are time interleaved at a transmitter or not. For example, when time interleaving is ON as in FIG. 83, a location of the number 33 cell which is a first L1 block cell within a first preamble, can change. In other words, when L1 block headers are not included in an interleaving, interleaved signal having the locations of cells as shown in FIG. 83 will be received. If L1 block headers are included in an interleaving, a location of the number 33 cell needs to be changed to de-interleave cells that are interleaved diagonally, using a first cell of a first L1 block header within a first preamble as a reference. L1_FEC merger r1018-L1 can merge L1 blocks that are divided into many preambles into a single L1 block for FEC decoding.

With an additional 1 bit, PLP_type field of L1 signaling fields that are transmitted in a preamble can have following values.

PLP_type = 00 (common PLP)
PLP_type = 01 (normal data PLP)
PLP_type = 10 (de-multiplexed data PLP)
PLP_type = 11 (reserved)

A normal data PLP represents a data PLP when a single service is transmitted in a single data slice. A de-multiplexed data PLP represents a data PLP when a single service is de-multiplexed into multiple data slices. When a user changes service, if L1 signaling and L2 signaling are stored at a receiver, waiting for an L1 signaling information within a next frame can be eliminated. Therefore, a receiver can change services efficiently and a user can have benefit of less delay during a service change. FIG. 95 shows signal structures of L1 block that is transmitted in a preamble, for time interleaving flow and time de-interleaving flow. As seen in FIG. 95, interleaving and deinterleaving can be performed not on a whole preamble bandwidth, but on a divided L1 block.

FIG. 96 is an example of an L1 time interleaving field of signaling fields of L1, processed by FEC header 705-L1 on L1 path shown in FIG. 90. As shown in FIG. 96, one bit or two bits can be used for time interleaving parameter. If one bit is used, interleaving is not performed when bit value is 0 and interleaving having depth of OFDM symbols used in preamble symbols can be performed when bit value is 1. If two bits are used, interleaving with interleaving depth of 0 or no interleaving is performed when bit value is 00 and interleaving having depth of OFDM symbols used in preamble symbols can be performed when bit value is 01. Interleaving having depth of four OFDM symbols can be performed when bit value is 10. Interleaving having depth of eight OFDM symbols can be performed when bit value is 11.

A receiver, specifically, FEC header decoder r1012-L1 on L1 path shown in FIG. 91 can extract Time Interleaving (TI) parameters shown in FIG. 96. Using the parameters, Time de-interleaver r1010-L1 can perform de-interleaving according to interleaving depth. Parameters that are transmitted in L1 header are L1 information size (15 bits), time interleaving parameter (maximum 2 bits), and CRC (max 2 bits). If Reed-Muller code RM (16, 32) is used for encoding L1 header signaling field, because bits that can be transmitted are 16 bits, not enough number of bits exist. FIG. 97 shows an example of L1 signaling field that can be used for such a case.

FIG. 97 shows a processing performed at FEC header 705-L1 on L1 path of FIG. 90. In FIG. 97a, L1( ) in the signaling fields column represents L1 size and TI( ) represents size for time interleaving parameters. For the first case or when L1 size (15 bits) and TI (1 bit) are transmitted, additional padding may not be necessary and substantial decoding performance of L1 header can be obtained, however, because information whether to perform a time interleaving or not is transmitted, for a short L1 block, interleaving effect cannot be obtained.

For the second case or when L1 size is reduced to ⅛ of original size, transmitting information with numbers of bits such as L1(12 bits), TI (2 bits), and CRC (2 bits) becomes possible. Thus, for the second case, best L1 decoding performance and time interleaving effect can be expected. However, the second case requires additional padding process to make L1 size a multiple of eight if L1 size is not a multiple of eight. FIG. 97b represents padding method that can be performed at L1 signal 700-L1 of FIG. 90. It shows that padding is located after L1 block and covered with CRC encoding. Consequently, at a receiver, FEC decode BCH/LDPC r715-L1 on L1 path of FIG. 91 can perform FEC decoding, then if there is no error when CRC field is checked, bit parsing according to L1 signaling field can be performed, then a process defining rest of bits as padding or CRC32 and excluding the rest of bits from parameters is required.

For the third case or when L1 size is expressed as a number of QAM mapped cells, not a number of bits, number of bits can be reduced. For the fourth case, L1 size is expressed not as a size of a whole L1 block, but as an L1 size per each OFDM symbol. Thus, for a receiver to obtain a size of a whole L1 block, multiplying size of L1 block in a single OFDM symbol by a number of OFDM symbols used in preamble needs to be performed. In this case, actual L1 size needs to exclude padding.

For the fifth case, by expressing L1 block not as a number of bits but as a number of QAM mapped cells, more reduction in bits is possible. For the third through fifth cases, TI, CRC parameters, and a number of necessary padding bits are shown. For a case where L1 block size is expressed as a number of cells, for a receiver to obtain L1 size in bits, the receiver needs to multiply a number of bits where only cells are transmitted by a received L1 size. In addition, a number of padding bits needs to be excluded.

The last case shows an increased total number of bits to 32 bits by using two RM code blocks in header. A total CRC fields become four bits because each RM code block needs two bits of CRC field. A receiver or FEC header decoder r1012-L1 on L1 path of FIG. 91, needs to obtain necessary parameters by performing FEC decoding on a total of two FEC blocks. Using the obtained parameters, a receiver, specifically time deinterleaver r1010-L1 on L1 path of FIG. 91, can determine whether to perform deinterleaving or not and can obtain a de-interleaving depth, if de-interleaving is determined to be performed. In addition, FEC decode BCH/LDPC r715-L1 can obtain LDPC block length required to perform FEC decoding and shortening/puncturing parameters. Unnecessary padding fields required to send L1 signal to a system controller can be removed.

Figure 92:
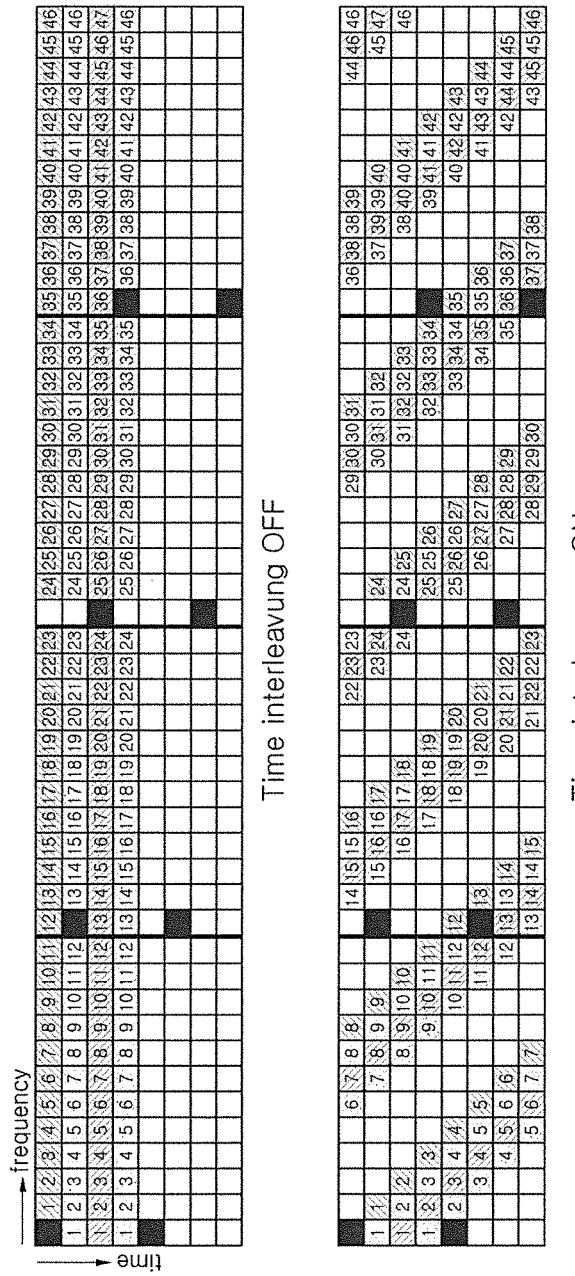
FIG. 92 is an example of a Time Interleaver (TI).

FIG. 92 shows an example of a data slice Time Interleaving (TI). The TI process assumes all pilot positions are known. The TI can output only data cells, excluding pilots. Knowing pilot positions enables correct number of output cells for each OFDM symbol. Also, TI can be implemented by a single buffer at a receiver.

Figure 93:
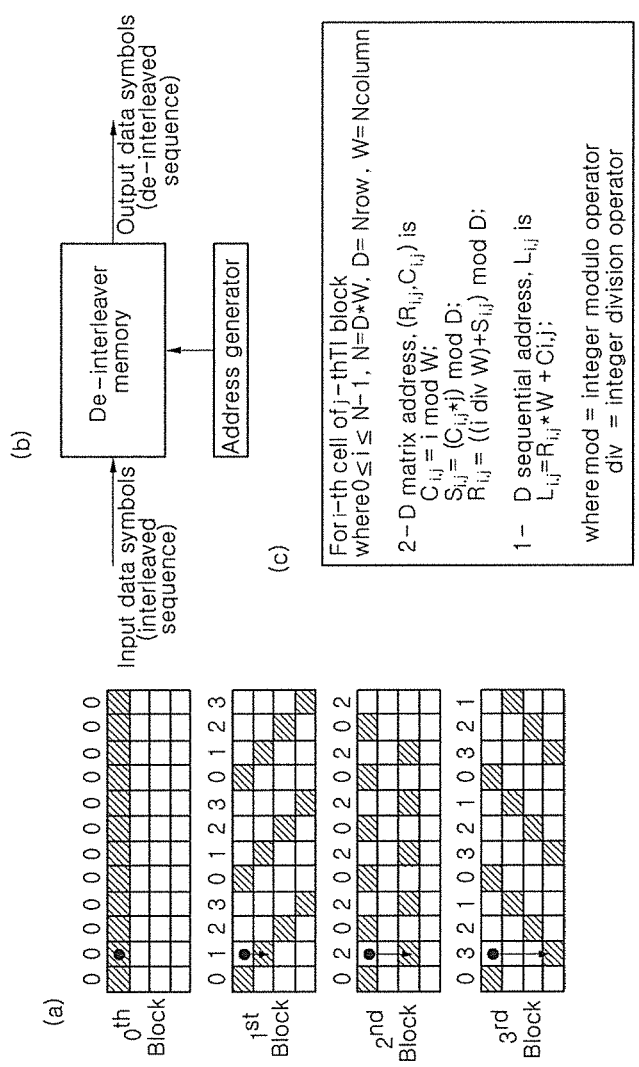
FIG. 93 is an example of a Time De-Interleaver (TDI).

FIG. 93 shows an example of an efficient implementation of Time De-interleaver at a receiver. FIG. 93a shows four different de-interleaving schemes according to an embodiment of the present invention. FIG. 93b shows a single buffer which performs the de-interleaving. FIG. 93c shows an exemplary scheme to address L1 blocks in a 2D matrix or a 1D sequence.

As shown in FIG. 93a-c, using a single buffer algorithm can be more efficient implementation of time de-interleaver. The algorithm can be characterized by reading output cells from memory first, then writing input cells where output cells are read. Diagonal addressing can be regarded as a circular addressing in each column.

More specifically, referring to FIG. 93a, these four writing and reading method sequentially apply to the C2 frames which are received at a receiver. The first received frame at a receiver is written into the de-interleaver memory in FIG. 93b in the way for the $0^{th}$ block in FIG. 93a and read out in the way for the $1^{st}$ block. The second received frame is written into the deinterleaver memory in FIG. 93b in the way for the $1^{st}$ block and read out for the $2^{nd}$ block. The third received frame is written into the deinterleaver memory in FIG. 93b in the way for the $2^{nd}$ block and read out in the way for the $3^{rd}$ block. The fourth received frame is written into the de-interleaver memory in FIG. 93b in the way for the $3^{rd}$ block and read out in the way for the $0^{th}$ block, and so on. That is, write and read out methods in FIG. 93a can be sequentially and cyclically applied to the C2 frames which are received sequentially.

Figure 94:
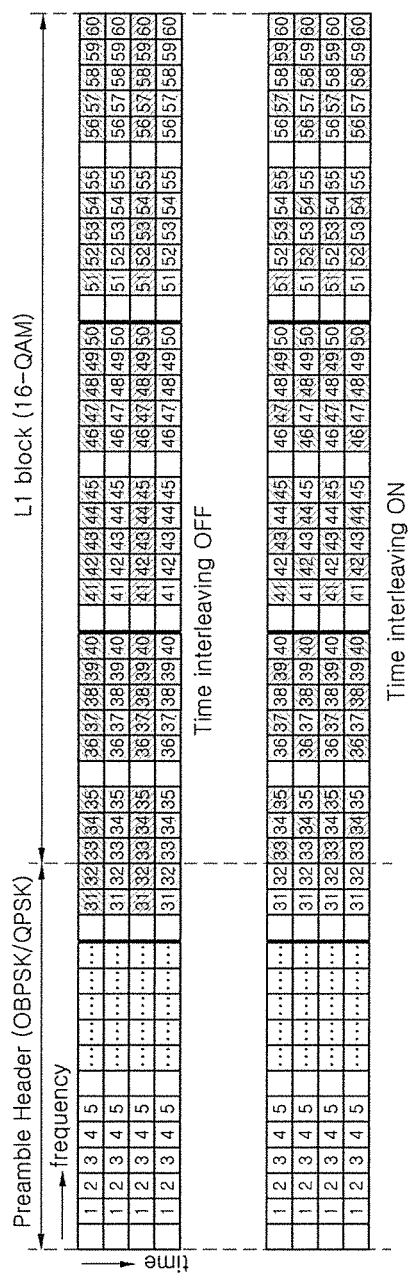
FIG. 94 is an example of a Time Interleaver (TI).

Time interleaving (TI) process can be performed on preambles as shown in FIG. 94. Pilot positions are periodical and easily removed and no interleaving is necessary for L1 block header. It is because preamble header carries TI parameters and both interleaving and non-interleaving have same results due to repetition. Thus, only L1 signaling cells are interleaved. Single buffer used in data slice TI can be applied.

FIG. 95 shows preamble Time Interleaving/Deinterleaving Flow. Interleaving can be performed within one L1 block, instead of whole preamble. At a transmitter, as shown in FIG. 128a, L1 block can be encoded ①then an interleaving can be performed within the L1 block ②, and the interleaved L1 block can be repeated within a preamble. At a receiver, as shown in FIG. 128b, from a received preamble ①, L1 block can be combined or synchronized and a single period of L1 block can be obtained ②, and the combined L1 block can be de-interleaved ③.

FIG. 96 shows a Time interleaving depth parameters in L1 header signaling. For L1 header structure, RM (16, 32) has 16 bits capacity. A maximum of 2 bits of CRC may improve RM BER performance. Required signaling fields of L1 header are L1_info_size (15 bits) which can require maximum of 5 OFDM symbols and TI_depth (2 bits or 1 bit). However, a total of 18 or 19 bits exceed the capacity of L1 header.

FIG. 97 shows an example of L1 header signaling and a structure and a padding method.

FIG. 98 shows an example of an L1 signaling transmitted in a frame header. L1 signaling information can be used as decoding parameters at a receiver. Especially, modules on L1 signal path of FIG. 91 can perform L1 signaling decoding and modules on PLP path of FIG. 91 can use parameters, thus, services can be decoded. A receiver can obtain parameters of L1 signaling from signals of L1 path which are decoded according to an order of each field and field length. The followings explain meaning of each field and its use. A name of each field, a number of bits for each field, or an example of each field can be modified.

Num_chbon: This field indicates a number of channels used in a channel bonding. Using this field, a receiver can obtain a total bandwidth of used channels. Channel can have 6 MHz, 7 MHz, 8 MHz, or other values of bandwidth.

Num_dslice: This field indicates a number of data slices existing in a bonded channel. After L1 signaling decoding, a receiver accesses a loop where information of data slices is contained, to obtain data slice information. Using this field, a receiver can obtain a size of the loop for decoding.

Num_notch: This field indicates a number of notch bands existing in a bonded channel. After L1 signaling decoding, a receiver accesses a loop where information of notch band is contained, to obtain notch band information. Using this field, a receiver can obtain a size of the loop for decoding.

For each data slice, dslice_id, dslice_start, dslice_width, dslice_ti_depth, dslice_type, dslice_pwr_allocation, and PLP information can be transmitted in a preamble of a frame header. Data slice can be considered as a specific bandwidth which contains one or more PLPs. Services can be transmitted in the PLPs. A receiver needs to access data slice which contains a specific PLP, to decode a service.

Dslice_id: This field can be used for data slice identification. Each data slice in a bonded channel can have a unique value. When a receiver accesses one of PLPs to decode services, this field can be used for the receiver to differentiate a data slice where the PLP is located, from other data slices.

Dslice_start: This field indicates a start location of a data slice within a bonded channel. Using this field, a receiver can obtain a frequency where the data slice starts. In addition, tuning to access a data slice can be performed using this field.

Dslice_width: This field indicates a bandwidth of a data slice. Using this field, a receiver can obtain a size of a data slice. Especially, this field can be used in time-de-interleaving to enable decoding. Along with dslice_start field, a receiver can determine which frequency to decode from received RF signals. This process can be performed at Tuner r700 of FIG. 91. Information such as dslice_start and dslice_width can be used as Tuner (r700) control signal.

Dslice_ti_depth: This field indicates time-interlayer depth used on time interleaving data slices. Along with dslice_width, a receiver can obtain a width and a depth of a time-deinterleaver and can perform time de-interleaving. FIG. 99 shows an example of a dslice_ti_depth. In the example, 1, 4, 8, or 16 of OFDM symbols are used in time-interleaving. This is performed at time de-interleaver r710 of FIG. 91. Dslice_width and dslice_ti_depth can be used as control signal.

Dslice_type: This field indicates a type of a data slice. Type1 data slice has a single PLP within it and the PLP is a CCM (constant coding and modulation) applied. Type2 data slice represents all other kinds of data slices. Using this field, a receiver can perform decoding according to PLP. PLP of type1 does not have FECFRAME header, thus a receiver does not look for FECFRAME header. For type2, a receiver looks for FECFRAME header of PLP to obtain MODCOD information. FIG. 100 shows an example of dslice_type. Using this field, data slice parser r711 of FIG. 91 can control FEC header decoder r712-c, k.

Dslice_pwr_allocation: This field indicates a power of a data slice. Each data slice can have a different power from other data slices. It s for link adaption on cable system. A receiver can use this field to control power of received data slice. Tuner r700 of FIG. 91 can adjust signal gain using this field.

Num_plp: This field indicates a number of PLPs in a data slice. After L1 signaling decoding, a receiver accesses a loop which includes PLP information. Using this field a receiver can obtain a size of the loop and decode PLPs.

For each PLP, plp_id, plp_type, PSI/SI reprocessing, plp_payload_type, plp_modcod, and plp_start_addr can be transmitted in a frame header (preamble). Each PLP can transmit one or more streams or packets such as TS and GSE. A receiver can obtain services by decoding PLPs where services are transmitted.

Plp_id: This field is a PLP identifier and has a unique value for each PLP in a bonded channel. Using this field, a receiver can access PLP where a service to decode exists. This field can serve an identical purpose with plp_id transmitted in a FECFRAME header. FEC Header decoder r712-c, k of FIG. 91 can access necessary PLP using this field.

Plp_type: This field indicates whether a PLP type is a common PLP or a data PLP. Using this field, a receiver can find common PLP and can obtain information required for decoding a TS packet from the common PLP. Further, the receiver can decode a TS packet within a data PLP. FIG. 101 shows an example of plp_type.

PSI/SI reprocessing: This field indicates whether a PSI/SI of a received signal is reprocessed or not. Using this field, a receiver can determine whether to refer PSI/SI of a specific service from a transmitted service. If a receiver cannot refer PSI/SI of a specific service from a transmitted service, PSI/SI that can be referred by a specific service can be transmitted through common PLP, for example. Using this information, a receiver can decode services.

Plp_payload_type: This field indicates type of payload data that PLP transmits. A receiver can use this field before decoding data within PLPs. If a receiver cannot decode specific type of data, decoding a PLP that contains that specific type of data can be prevented. FIG. 102 shows an example of plp_payload_type. If a data slice has a single PLP and a CCM is applied to the data slice i.e., type1 data slice, fields such as plp_modcod and plp_start_addr can be transmitted additionally.

Plp_modcod: This field indicates modulation type and FEC code rate used on PLP. Using this field, a receiver can perform QAM demodulation and FEC decoding. FIG. 103 shows an example of plp_modcod. Those values shown in the figure can be used in modcod that is transmitted in a header of a FECFRAME. Symbol Demapper r713-c, k and FEC Decode BCH/LDPC r715-c, k of FIG. 91 can use this field for decoding.

Plp_start_addr: This field indicates where a first FECFRAME of a PLP appears in a transmission frame. Using this field, a receiver can obtain a start location of FECFRAME and perform FEC decoding. Using this field, Data slice Parser r711 of FIG. 91 can synchronize FECFRAMEs for type1 PLPs. For each notch band, information such as notch_start and notch_width can be transmitted in a frame header (preamble).

Notch_start: This field indicates a start location of a notch band. Notch_width: This field indicates a width of a notch band. Using notch_start and notch_width, a receiver can obtain a location and a size of a notch band within a bonded channel. In addition, a tuning location for a correct service decoding can be obtained and an existence of a service within a certain bandwidth can be checked. Tuner r700 of FIG. 91 can perform tuning using this information.

GI: This field indicates guard interval information used in a system. A receiver can obtain guard interval information using this field. Time/Freq Synchronizer r702 and GI remover r704 of FIG. 91 can use this field. FIG. 104 shows an example.

Num_data_symbols: This field indicates a number of data OFDM symbols, except preamble, used in a frame. A transmission frame length can be defined by this field. Using this field, a receiver can predict a location of a following preamble, thus, this field can be used for decoding L1 signaling. Frame Parser r708 of FIG. 91 can use this field and predict OFDM symbols that are preamble and send signal to preamble decoding path.

Num_c2_frames: This field indicates a number of frames existing in a super frame. Using this field, a receiver can obtain a boundary of a super frame and can predict information repeated by each super frame.

Frame_idx: This field is a frame index and is reset for each super frame. Using this field, a receiver can obtain a current frame number and find a location of the current frame within a super frame. Using this field, Frame parser r708 of FIG. 91 can find out how many frames are ahead of a current frame in a super frame. Along with num_c2_frames, change occurring in a L1 signaling can be predicted and L1 decoding can be controlled.

PAPR: This field indicates whether a tone reservation to reduce a PAPR is used or not. Using this field, a receiver can process accordingly. FIG. 105 shows an example. For example, if a tone reservation is used, a receiver can exclude carriers used in a tone reservation, from decoding. Specifically, Data slice parser r711 of FIG. 91 can use this field to exclude carriers from decoding.

Reserved: This field is additional bits reserved for future use.

FIG. 106 shows another example of L1 signaling transmitted in a frame header. In FIG. 106, additionally added information to FIG. 98 can make service decoding by a receiver more efficient. The following fields explain only the additional information. The other fields are same as the FIG. 98.

Network_id: This field indicates a network where transmitted signal belongs to. Using this field, a receiver can find out a current network. When a receiver tune to another network to find a service in the network, the receiver can process faster because using only L1 decoding is enough to make decision whether the tuned network is a desired network or not.

C2_system_id: This field identifies a system where a transmitted signal belongs to. Using this field, a receiver can find out current system. When a receiver tune to another system to find a service in the system, the receiver can process faster because using only L1 decoding is enough to make decision whether the tuned system is a desired system or not.

C2_signal start_frequency: This field indicates a starting frequency of bonded channels. C2_signal_stop_frequency: This field indicates an end frequency of bonded channels. Using c2_signal_start_frequency and c2_signal_stop_ frequency, RF bandwidths of all data slices can be found by decoding L1 of certain bandwidth within bonded channels. In addition, this field can be used to obtain a frequency shift amount required in synchronization of L1_XFEC_FRAMEs. L1 XFEC Combiner r1017-L1 of FIG. 91 can use this field. In addition, when a receiver receives data slices located at both ends of a bonded channel, this field can be used to tune to an appropriate frequency. Tuner r700 of FIG. 91 can use this information.

Plp_type: This field indicates whether a PLP is a common PLP, a normal data PLP, or a grouped data PLP. Using this field, a receiver can identify common PLP and can obtain information required for decoding TS packet from the common PLP, then can decode TS packet within a grouped data PLP. Here, the common PLP can be a PLP which contains data shared by multiple PLPs. FIG. 107 shows an example of this field. Normal data PLP is a data PLP that does not have common PLP. In this case, a receiver does not need to find a common PLP. Common PLP or grouped PLP can transmit information such as plp_group_id. For the other types of PLP, more efficient transmission is possible because no additional information needs to be transmitted.

Plp_group_id: This field indicates a group where a current PLP belongs to. Grouped data PLP can transmit common TS parameters using common PLP. Using this field, if a currently decoded PLP is a grouped PLP, a receiver can find a necessary common PLP, obtain parameters required for TS packet of grouped PLP, and form a complete TS packet.

Reserved_1/reserved_2/reserved_3: These fields are additional bits reserved for future use for a data slice loop, a PLP loop, and a transmission frame, respectively.

FIG. 108 shows another example of L1 signaling transmitted in a frame header. Compared to FIG. 106, more optimized information can be transmitted, thus, less signaling overhead can occur. Accordingly, a receiver can decode services efficiently. Especially, modules on L1 signal path of FIG. 91 can perform L1 signaling decoding and modules on PLP path of FIG. 91 can use parameters, thus, services can be decoded. A receiver can obtain parameters of L1 signaling from signals of L1 path which are decoded according to an order of each field and field length. A name of each field, a number of bits for each field, or an example of each field can be modified. Descriptions of fields except dslice_width are identical to aforementioned descriptions of fields. A function of dslice_width according to an example is as follows.

Dslice_width: This field indicates a bandwidth of a data slice. Using this field, a receiver can obtain a size of a data slice. Especially, this field can be used in time-de-interleaving to enable decoding. Along with dslice_start field, a receiver can determine which frequency to decode from received RF signals. This process can be performed at Tuner r700 of FIG. 91. Information such as dslice_start and dslice_width can be used as Tuner r700 control signal. At this point, width of a data slice can be extended up to 64 MHz by using 12 bits for this dslice_width field. Using this field, a receiver can determine if a currently available tuner can decode current data slice. If a width of a data slice is bigger than a bandwidth of a legacy tuner of a receiver, to decode such a data slice, a receiver can use either at least two legacy tuners or a tuner with a large enough bandwidth. In the example, a granularity of values used in dslice_start, dslice_width, notch_start, and notch_width can be 12 OFDM carriers (cells). In other words, a receiver can find a location of an actual OFDM cell by multiplying transmitted values by 12. In the example, for a granularity of Plp_start_addr, one OFDM carrier (cell) can be used. In other words, a receiver can find out how many OFDM symbols and OFDM cells are ahead of a start location of a PLP within an OFDM symbol. Dslice_start and dslice_width can be used for this purpose. Data slice Parser r711 of FIG. 91 can perform such a process.

FIG. 109 shows an example of processing at FEC header 705-L1 on L1 path of FIG. 90. A total of 16 bits can be transmitted in FEC header of a L1 path. Fourteen bits can be allocated for L1_info_size. If L1_info_size has a value that is a half of actually transmitted L1 block length, a receiver can multiply received L1_info_size by two and obtain actual length of L1 block and start decoding L1. This obtained length of L1 block is a length that includes padding.

For L1 block that is determined to have no error though CRC check, a receiver can regard rest of bits after the L1 decoding as padding. The last two bits, similar as in previous methods, can be used for indicating time interleaving depth of preambles. Preamble mapper 1007-L1 of FIG. 90 can determine required OFDM symbols to transmit L1 blocks. Afterwards, time interleaver 1008-L1 of FIG. 90 can perform time interleaving. Using the time interleaving depth information and L1 info_size, a receiver can find out what size of L1 block is transmitted in how many OFDM symbols. Combining, merging, and time-de-interleaving L1 blocks can be performed at L1 XFEC combiner 12417-L1, L1_FEC Merger 12418-L1, and Time de-interleaver 12410-L1 of FIG. 91, respectively.

At a receiver in FIG. 91, a length of an L1 XFEC block within an OFDM symbol can be obtained by dividing a total L1 block length by a number of OFDM symbols used in a preamble. The number of OFDM symbols can be obtained from a valued defined in ti_depth. L1 XFEC combiner 12417-L1 of a receiver can obtain L1 XFEC block. Then, Time de-interleaving 12410-L1 can be performed using ti_depth. Finally, L1 XFEC blocks can be merged to obtain an L1_FEC block. After L1_FEC Merger 12418-L1, bit De-interleaving r714-L1, and LDPC/BCH decoding r715-L1, L1 block can be obtained. L1 info_size can be multiplied by two, L1 block can be CRC checked, and L1 can be decoded. Unnecessary padding can be disregarded.

FIG. 110 shows another example of L1 signaling transmitted in a frame header. Compared to FIG. 108, numbers of bits for some fields are modified and some fields are added to improve an efficiency of service decoding by a receiver. Especially, modules on L1 signal path of FIG. 91 can perform L1 signaling decoding and modules on PLP path of FIG. 91 can use parameters, thus, services can be decoded. A receiver can obtain parameters of L1 signaling from signals of L1 path which are decoded according to an order of each field and field length. A name of each field, a number of bits for each field, or an example of each field can be modified. Except modified fields from previous figure, descriptions of fields are identical to aforementioned descriptions of fields. RESERVED_1, RESERVED_2, RESERVED_3, and RESERVED_4 are fields reserved for future use. In the example, PLP_START can indicate identical information with aforementioned plp_start_addr.

L1_PART2_CHANGE_COUNTER indicates a number of frames from first frame to a frame that has a change in any of the L1 signaling information, excluding change in PLP_START, from previous frames. That is, this field indicates the number of frames ahead where the configuration will change. Using this field, a receiver can skip decoding L1 for each frame to get L1 information. In other words, by using the value of L1_PART2_CHANGE_COUNTER, a receiver can determine which frame has a change in L1 information from previous frames, thus, no L1 decoding is performed for frames before a frame with change in L1 occurs, then L1 decoding can be performed for the frame that has change in L1. Thus, unnecessary operations can be skipped. Using this field, a receiver can avoid the redundant L1 decoding operation. This value can be also calculated by a receiver with already decoded L1 information.

If L1_PART2_CHANGE_COUNTER is 0, it means there has not been a change in L1 for at least 256 ($2^8$, 8 is a number of bits used for L1_PART2_CHANGE_COUNTER) frames. In this one of best cases, a receiver needs to decode L1 only every 51 seconds. This process can be performed at Frame Parser r708 of FIG. 91. Frame Parser can determine if current preamble has a change in L1 and can control subsequent processes on L1 signal path. A receiver can calculate PLP_START for specific frame from already obtained PLP_START and PLP_MODCOD, without performing L1 decoding to obtain PLP_START.

FIG. 111 shows examples of fields shown in FIG. 110. Blocks of a receiver can perform processes according to the values indicated by the fields in the examples.

FIG. 112 shows another example of L1 signaling transmitted in a frame header. Compared to FIG. 110, some fields are modified and some fields are added to improve an efficiency of service decoding by a receiver. Especially, modules on L1 signal path of FIG. 91 can perform L1 signaling decoding and modules on PLP path of FIG. 91 can use parameters, thus, services can be decoded. A receiver can obtain parameters of L1 signaling from signals of L1 path which are decoded according to an order of each field and field length. A name of each field, a number of bits for each field, or an example of each field can be modified. Except modified fields from previous figure, descriptions of fields are identical to aforementioned descriptions of fields.

Descriptions of DSLICE_START, DSLICE_WIDTH, NOTCH_START, and NOTCH_WIDTH are identical with previous descriptions. However, signaling overhead can be minimized by signaling the fields with a minimum number of bits according to GI mode. Accordingly, it can be said that signaling of DSLICE_START, DSLICE_WIDTH, NOTCH_START, and NOTCH_WIDTH is based upon GI mode. L1 information can be obtained from L1 signal path of a receiver of FIG. 91. A system controller can determine a number of bits used for each field according to obtained GI value and can read the fields accordingly. GI value needs to be transmitted before other values.

Instead of DSLIC_START and DSLICE_WIDTH, 12 bits of tuning position which indicates an optimized location to obtain data slice and 11 bits of offset value from a tuning position to indicate a width of a data slice can be transmitted. Especially, by using 11 bits of offset value, data slices that occupy a maximum of 8 bonded channels can be signaled and a receiver that can receive such data slices can operate appropriately. A tuner r700 of a receiver of FIG. 91 can determine RF bandwidth using a tuning position and can obtain a width of a data slice using offset value, to serve a same purpose as the aforementioned DSLICE_WIDTH.

DSLICE_CONST_FLAG is a field for indicating whether a configuration of a specific data slice is maintained as a constant. Using this field obtained from an L1 from a certain bandwidth, a receiver can determine if a specific data slice has a constant configuration, then the receiver can receive PLPs of the specific data slice without additional L1 decoding. This kind of process can be useful for receiving data slice that is located in a bandwidth where L1 decoding is not available.

DSLICE_NOTCH_FLAG is a field or a flag for indicating notch bands at both edges of a specific data slice. Most Significant Bit (MSB) can be used as an indicator for notch band neighboring at a low bandwidth and Least Significant Bit (LSB) can be used as an indicator for notch band neighboring at a high bandwidth. Using the field, when a receiver decodes a specific data slice, the receiver can take into account of a notch band by finding out changes in active carriers caused by continual pilots neighboring at both ends of a notch band. This information can also be obtained from notch information transmitted in NOTCH_START and NOTCH_WIDTH. Time Deinterleaver r710 of a receiver of FIG. 91 can use the information to find location of active carriers and send data only corresponding to the active carriers, to a data slice parser.

For PLP_TYPE, one additional bit is added to FIG. 110. FIG. 113 shows an example of PLP_TYPE of FIG. 112. A value indicating bundled data PLP can be transmitted. A large TS stream having a high data rate can be multiplexed into multiple PLPs. Bundled data PLP can be used for indicating PLPs where multiplexed streams are transmitted. For a legacy receiver which is unable to decode a specific PLP, this field can prevent the receiver from accessing the PLP, thus, a possible malfunction can be prevented.

Yet as an alternative method, if the aforementioned dslice_width is used along with dslice_start field and notch information, a receiver can determine which frequency to decode from received RF signals. This process can be performed at Tuner (r700) of FIG. 91. Information such as dslice_start, dslice_width, notch_start, and notch_width can be used as Tuner r700 control signal. Thus, obtaining a data slice and simultaneously tuning to an RF band where no L1 decoding problems exist can become possible, by avoiding notch.

Figure 114:
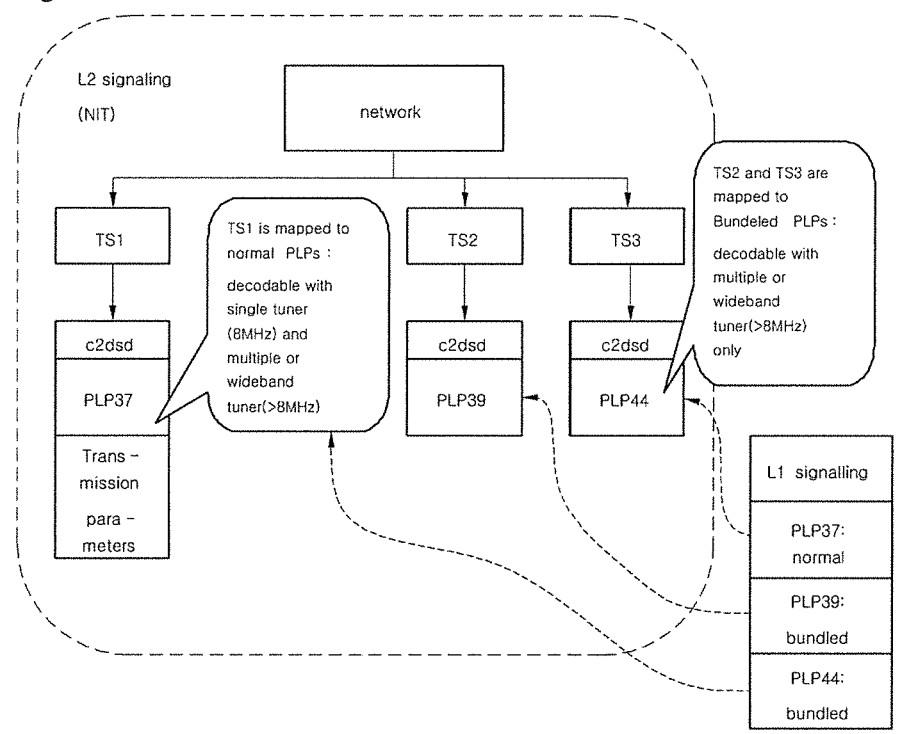
FIG. 114 is an example of L1 signaling and L2 signaling for normal and bundled PLP types.

Regarding L1 signaling of FIG. 112, FIG. 114 shows a relationship between L1 signaling and L2 signaling when a PLP is bundled type. In addition, FIG. 114 also shows an action that can be taken by a receiver for such a case. TS1 can be mapped into PLP37 through c2dsd of L2. This TS1 corresponds to a normal PLP of L1, thus, the PLP can be decoded by a normal receiver (single 8 MHz tuner) and a premium receiver (multiple tuner or wideband (>8 MHz) tuner). TS2 and TS3 are mapped into PLP39 and PLP44 respectively, through c2dsd. These correspond to bundled PLP of L1, thus, these PLPs can be decoded by a premium receiver (multiple tuner or wideband (>8 MHz) tuner) but not by a normal receiver (single 8 MHz tuner). Consequently, according to L1 information, a receiver can check if corresponding TS is received or not.

Figure 115:
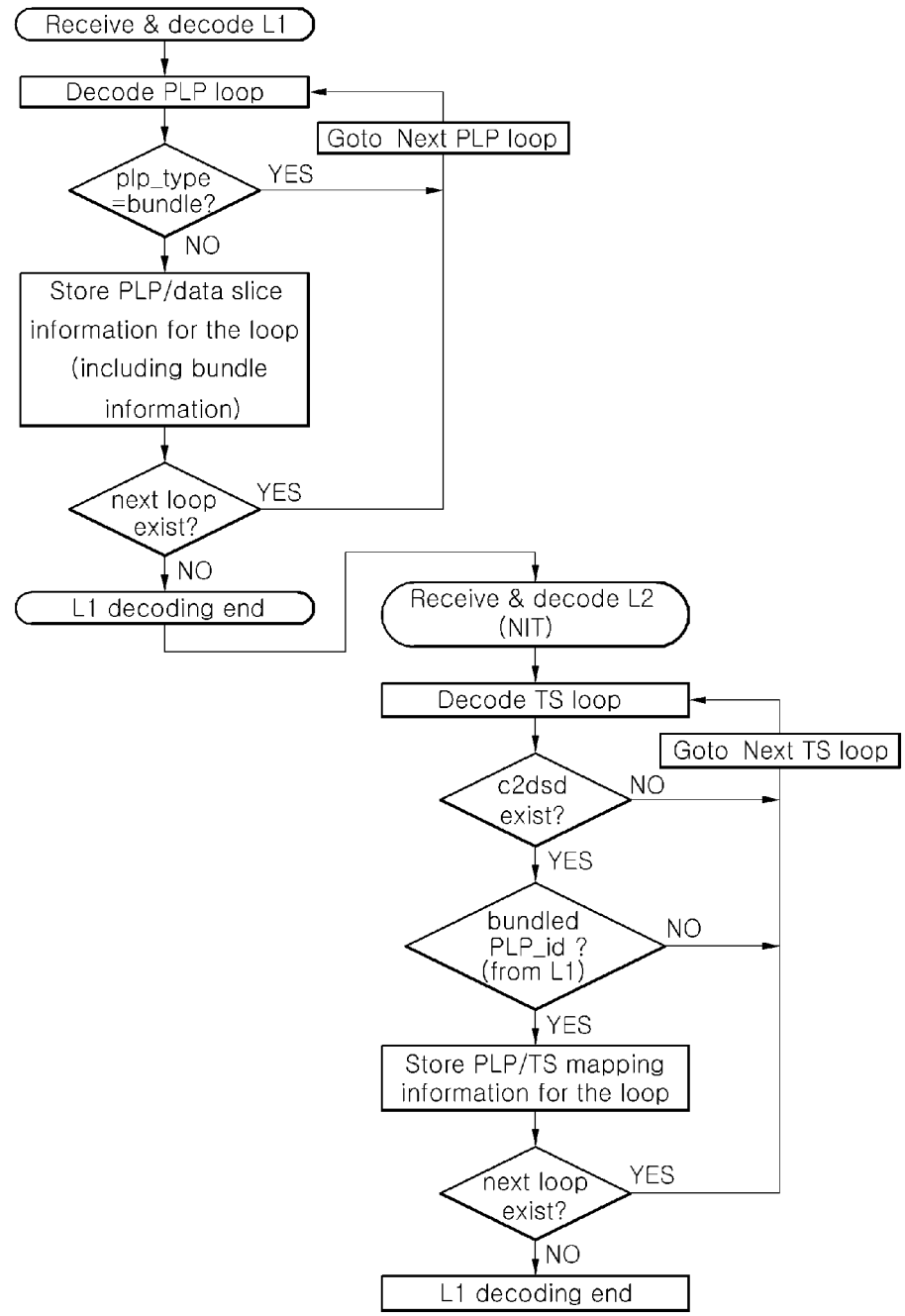
FIG. 115 is an example of L1 and L2 decoding action flow of a conventional DVB-C2 receiver with 8 MHz single tuner.

FIG. 115 and FIG. 116 are flowcharts describing L1 decoding and L2 decoding actions for bundle PLP type and normal PLP type in a normal receiver and a premium receiver, respectively. FIG. 117 shows an example of c2_delivery_system_descriptor structure and syntax for L2 signaling while taking into account of FIG. 112. This descriptor can map TS_id into plp_id as shown in FIG. 114. Bundle information can be processed in L1, thus, it needs not be signaled in L2. The variables shown in FIG. 117 are described as follows.

Plp_id: This 8-bit field uniquely identifies a data PLP within a C2 System.

C2_system_id: This 16-bit field uniquely identifies a C2 system. The remaining part of this descriptor, immediately following the C2_system_id field is only present once per C2 system, because the parameters are uniquely applicable to all data slices carried over a particular C2 System. A presence or absence of that part can be derived from the descriptor length field. In the absence of the remaining part, this length equals 0x07, otherwise a larger value is assigned.

C2_System_tuning_frequency: This 32-bit field indicates a frequency value. The coding range can be from minimum 1 Hz (0x00000001) up to a maximum of 4,294,967,295 Hz (0xFFFFFFFF). This data field can give a tuning frequency, where a complete Preamble is transmitted within the tuning window. Generally the C2_System_tuning_frequency is the center frequency of a C2_System, but it may deviate from the center frequency in case notches exist in this area.

Active_OFDM_symbol_duration: This 3-bit field indicates a duration of the active OFDM symbol. An example is shown in FIG. 118.

Guard_interval: This 3-bit field indicates a guard interval. An example is shown in FIG. 119.

In the previous examples of L1 time interleaving/deinterleaving, for cases when TI_DEPTH is "10" or "11" Preamble mapper 1007-L1 of FIG. 90 can evenly divide original L1 block into four or eight sub-blocks. However, if a size of the sub-block is smaller than a minimum size required to perform an FEC encoding, the FEC encoding may not be performed appropriately. A possible solution can be setting a threshold. If a size of an L1 block is smaller than a set threshold, L1 block can be repeated for four or eight times for cases when TI_DEPTH is "10 or "11" If a size of an L1 block is bigger than a set threshold, L1 block can be evenly divided into four or eight sub-blocks. The threshold can be set as four or eight times of a minimum size required to perform an FEC encoding.

In addition, setting TI_DEPTH as "10" or "11" is for cases when time interleaving effect is not obtained because of a small L1 block size. Thus, the threshold can be defined as a size of information bits that can be transmitted by a single preamble symbol. For example, if an identical L1 FEC encoding with DVB-T2 is assumed, a threshold will be 4,772 bits.

For cases when TI_DEPTH is "10" or "11" using L1 size information, TI depth, and a threshold value shared between a transmitter and a receiver, modules of a receiver, from FEC header decoder r1012-L1 to L1 FEC Merger r1018-L1 of FIG. 91 can determine a size of L1 sub-block, combining, and merging the L1 sub-blocks that are transmitted in an OFDM symbol of a preamble.

If an L1 size is smaller than a threshold value, L1 FEC Merger r1018-L1 of FIG. 91 does not need to merge divided sub-blocks because the original L1 block is repeatedly transmitted according to a TI_DEPTH in four or eight OFDM symbols. However, if an L1 size is bigger than a threshold value, because a number of symbols that is more than a number of OFDM symbols required to transmit L1 block is used, FEC header decoder r1012-L1 of FIG. 91 can obtain a size of a sub-block using TI_DEPTH. Then, L1 FEC combiner r1017-L1 can combine L1 FEC blocks and time deinterleaver r1010-L1 can perform de-interleaving. Finally, L1 FEC merger r1018-L1 can merge L1 FEC blocks to restore original L1 block.

FIG. 120 shows another example of L1 signaling that is transmitted in a frame header. Compared to FIG. 112, some fields are modified and some fields are added to improve an efficiency of service decoding by a receiver. Especially, modules on L1 signal path of FIG. 91 can perform L1 signaling decoding and modules on PLP path of FIG. 91 can use parameters, thus, services can be decoded. A receiver can obtain parameters of L1 signaling from signals of L1 path which are decoded according to an order of each field and field length. A name of each field, a number of bits for each field, or an example of each field can be modified. Except modified fields from previous figure, descriptions of fields are identical to aforementioned descriptions of fields.

DSLICE_TUNE_POS indicates a tuning position for a receiver to obtain a data slice. Depending on a GI mode, this value can be expressed in 12 or 11 bits. DSLICE_OFFSET_RIGHT and DSLICE_OFFSET_LEFT which indicate offset value from a tuning position or a width of a data slice, can be expressed in 9 or 8 bits, depending on a GI mode. If the offset can have a signed value, i.e., a positive or a negative value, a position and a width of a data slice having a narrow band can also be expressed. Tuner r700 of a receiver in FIG. 91 can determine an RF band using a tuning position, then using this signed offset value, data slice width can be obtained. Thus, this field can serve a same purpose as aforementioned DSLICE_WIDTH. A receiver can obtain Bit-width using a GI value.

DSLICE_NOTCH_FLAG is a flag indicating that a certain data slice is adjacent to a notch band. It can serve a same purpose as aforementioned examples but here, only 1 bit is used for this field per each data slice. Using this 1 bit information, a receiver can perform same function as aforementioned examples.

PLP_BUNDLED_FLAG indicates that a PLP is a bundled data PLP. That is, PLP_BUNDLED_FLAG indicates whether or not a PLP is a bundled with other PLP within a broadcasting system. This field can serve a same purpose as aforementioned bundled data PLP of PLP_TYPE of FIG. 112. PLP_TYPE is shown in FIG. 110.

FIG. 121 is showing another two examples of time interleaving that can be used on L1 path of FIG. 90. As seen in the Time interleaving ON (1), interleaving can be only block interleaving. Compared to the method shown in FIG. 83, data frequency interleaving performance may not be as good as the method shown in FIG. 83. However, for cases when TI_DEPTH is "10" or "11" without repeating or dividing L1 blocks according to a threshold, L1 blocks can be spread in a time direction regardless of L1 block size then can be repeated in a preamble if there is a room in the preamble, thus, this method can be advantageous in that a control can be simplified. The interleaving can be performed by writing input symbol streams in a time direction and reading the written symbol streams in a frequency direction. Time deinterleaver r1010-L1 on L1 path of a receiver of FIG. 91 can perform de-interleaving by writing input symbol streams in a frequency direction and reading the written symbol streams in a time direction.

A second example or the Time interleaving ON (2) of FIG. 121 includes additional process to the Time interleaving ON (1), which is a circular-shifting in a row direction. By this process, in addition to advantages from the Time interleaving ON (1), an effect of spreading in a frequency domain can be obtained. Time deinterleaver r1010-L1 on L1 path of a receiver of FIG. 91 needs to perform circularly re-shifting in a row direction before performing the process of the Time interleaving ON (1).

Using the suggested methods and devices, among others advantages it is possible to implement an efficient digital transmitter, receiver and structure of physical layer signaling.

By transmitting ModCod information in each BB frame header that is necessary for ACM/VCM and transmitting the rest of the physical layer signaling in a frame header, signaling overhead can be minimized.

Modified QAM for a more energy efficient transmission or a more noise-robust digital broadcasting system can be implemented. The system can include transmitter and receiver for each example disclosed and the combinations thereof.

An Improved Non-uniform QAM for a more energy efficient transmission or a more noise-robust digital broadcasting system can be implemented. A method of using code rate of error correction code of NU-MQAM and MQAM is also described. The system can include transmitter and receiver for each example disclosed and the combinations thereof.

The suggested L1 signaling method can reduce overhead by 3~4% by minimizing signaling overhead during channel bonding.

It will be apparent to those skilled in the art that various modifications and variations can be made in the present invention without departing from the invention.

The invention claimed is:

1. A transmitter for processing a broadcasting signal, the transmitter comprising: a first encoder configured to Bose Chaudhri Hocquenghem (BCH) encode broadcasting data that is carried by a physical path and to Low Density Parity Check (LDPC) encode the BCH encoded broadcasting data; a second encoder configured to BCH encode signaling data and to LDPC encode the BCH encoded signaling data, wherein the LDPC encoded signaling data includes a group identifier field for identifying a group to which a current physical path belongs; a time interleaver configured to time interleave the LDPC encoded broadcasting data; a frame builder configured to assemble the time interleaved broadcasting data and the LDPC encoded signaling data to build a signal frame that includes at least one data slice that includes the time interleaved broadcasting data; and a modulator configured to transmit the broadcasting signal including the signal frame, wherein the signaling data includes bundled information indicating whether the physical path is bundled with another physical path within a broadcasting system; and data of the bundled physical path are de-multiplexed into multiple data slices.

2. The transmitter of claim 1, wherein:
the signal frame further includes at least one preamble symbol; and
a signaling block including the LDPC encoded signaling data is repeated in the at least one preamble symbol in a frequency domain at a specific bandwidth.

3. The transmitter of claim 1, wherein the second encoder comprises:
a bit interleaver configured to bit interleave the LDPC encoded signaling data.

4. The transmitter of claim 1, wherein the modulator is further configured to Orthogonal Frequency Division Multiplex (OFDM) modulate the signal frame.

5. A receiver for processing a broadcasting signal, the receiver comprising: a tuner configured to receive the broadcasting signal; a frame parser configured to parse a signal frame from the received broadcasting signal, wherein the signal frame includes at least one data slice and signaling data; a time deinterleaver configured to time deinterleave data in the at least one data slice, wherein the data is carried by at least one physical path; a first decoder configured to Low Density Parity Check (LDPC) decode the signaling data and to Bose Chaudhri Hocquenghem (BCH) decode the LDPC decoded signaling data, wherein the signaling) data includes a group identifier field for identifying a group to which a current physical path belongs; and a second decoder configured to LDPC decode the time deinterleaved data and to BCH decode the LDPC decoded time deinterleaved data wherein the signaling data includes bundled information indicating whether the physical path is bundled with another physical path within a broadcasting system; and data of the bundled physical path are de-multiplexed into multiple data slices.

6. The receiver of claim 5, wherein:
the signal frame further includes at least one preamble symbol; and
a signaling block including the signaling data is repeated in the at least one preamble symbol in a frequency domain at a specific bandwidth.

7. The receiver of claim 5, wherein the first decoder comprises:
a bit deinterleaver configured to bit deinterleave the signaling data.

8. The receiver of claim 5, further comprising:
a demodulator configured to Orthogonal Frequency Division Multiplex (OFDM) demodulate the received broadcasting signal.

9. A method for processing a broadcasting signal, the method comprising: Bose Chaudhri Hocquenghem (BCH) encoding broadcasting data that is carried by a physical path; Low Density Parity Check (LDPC) encoding the BCH encoded broadcasting data; BCH encoding signaling data; LDPC encoding the BCH encoded signaling data, wherein the LDPC encode signaling data includes a group identifier field for identifying a group to which a current physical path belongs; time interleaving the LDPC encoded broadcasting data; assembling the time interleaved broadcasting data and the LDPC encoded signaling data to build a signal frame that includes at least one data slice that includes the time interleaved broadcasting data; and transmitting the broadcasting signal including the signal frame, wherein the signaling data includes bundled information indicating whether the physical path is bundled with another physical path within a broadcasting system; and data of the bundled physical path are de-multiplexed into multiple data slices.

10. The method of claim 9, wherein:
the signal frame further includes at least one preamble symbol; and
a signaling block including the LDPC encoded signaling data is repeated in the at least one preamble symbol in a frequency domain at a specific bandwidth.

11. The method of claim 9, further comprising bit interleaving the LDPC encoded signaling data.

12. The method of claim 9, wherein transmitting the broadcasting signal comprises Orthogonal Frequency Division Multiplex (OFDM) modulating the signal frame.

13. A method for processing a broadcasting signal, the method comprising: receiving the broadcasting signal; parsing a signal frame from the received broadcasting signal, wherein the signal frame includes at least one data slice and signaling data; time deinterleaving data in the data slice, wherein the data in the data slice is carried by at least one physical path; Low Density Parity Check (LDPC) decoding the signaling data; and Bose Chaudhri Hocquenghem (BCH) decoding the LDPC decoded signaling data, wherein the signaling data includes a group identifier field for identifying a group to which a current physical path belongs; and LDPC decoding the time deinterleaved data; and BCH decoding the LDPC decoded data, wherein the signaling data includes bundled information indicating whether the physical path is bundled with another physical path within a broadcasting system; and data of the bundled physical path are de-multiplexed into multiple data slices.

14. The method of claim 13, wherein:
the signal frame further includes at least one preamble symbol; and
a signaling block including the signaling data is repeated in the preamble symbol in a frequency domain at a specific bandwidth.

15. The method of claim 13, further comprising bit deinterleaving the signaling data.

16. The method of claim 13, further comprising Orthogonal Frequency Division Multiplex (OFDM) demodulating the received broadcasting signal.

* * * * *